(12) United States Patent
Kim et al.

(10) Patent No.: US 9,209,241 B2
(45) Date of Patent: Dec. 8, 2015

(54) SEMICONDUCTOR DEVICES INCLUDING A RECESSED ACTIVE REGION, AND METHODS OF FORMING SEMICONDUCTOR DEVICES INCLUDING A RECESSED ACTIVE REGION

(71) Applicants: Bongsoo Kim, Yongin-si (KR);
Junghwan Park, Seoul (KR);
Sungkwan Choi, Hwaseong-si (KR);
Kyuhyun Lee, Hwaseong-Si (KR);
HyeongSun Hong, Seongnam-si (KR);
Yoosang Hwang, Suwon-si (KR)

(72) Inventors: Bongsoo Kim, Yongin-si (KR);
Junghwan Park, Seoul (KR);
Sungkwan Choi, Hwaseong-si (KR);
Kyuhyun Lee, Hwaseong-Si (KR);
HyeongSun Hong, Seongnam-si (KR);
Yoosang Hwang, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/059,588

(22) Filed: Oct. 22, 2013

(65) Prior Publication Data
US 2014/0117492 A1    May 1, 2014

(30) Foreign Application Priority Data
Oct. 25, 2012    (KR) .......................... 10-2012-0119206

(51) Int. Cl.
*H01L 27/108*    (2006.01)
*H01L 29/06*    (2006.01)
*H01L 29/423*    (2006.01)
*H01L 21/768*    (2006.01)

(52) U.S. Cl.
CPC ...... *H01L 29/0649* (2013.01); *H01L 21/76831* (2013.01); *H01L 21/76897* (2013.01); *H01L 27/10855* (2013.01); *H01L 27/10888* (2013.01); *H01L 29/4236* (2013.01); *H01L 27/10876* (2013.01)

(58) Field of Classification Search
CPC ..................... H01L 29/4236; H01L 27/10855; H01L 27/108; H01L 27/10814; H01L 27/10876; H01L 21/76897; H01L 21/76831; H01L 27/10888
USPC .................................. 257/296, 508, E27.084
See application file for complete search history.

(56) References Cited

U.S. PATENT DOCUMENTS

| 2008/0284029 A1* | 11/2008 | Kim et al. ..................... 257/758 |
| 2008/0296677 A1 | 12/2008 | Takaishi |
| 2010/0295121 A1 | 11/2010 | Ikebuchi |
| 2010/0327346 A1 | 12/2010 | Jeong et al. |
| 2011/0169174 A1* | 7/2011 | Kim .............................. 257/784 |
| 2011/0260238 A1* | 10/2011 | Kim .............................. 257/330 |
| 2012/0139028 A1* | 6/2012 | Park et al. ..................... 257/324 |

FOREIGN PATENT DOCUMENTS

| KR | 10-2009-0074528 A | 7/2009 |
| KR | 10-2010-0029666 A | 3/2010 |
| KR | 10-2010-0132196 A | 12/2010 |
| KR | 10-2011-0016214 A | 2/2011 |
| KR | 10-2011-0047882 A | 5/2011 |
| KR | 10-2011-0101678 A | 9/2011 |

* cited by examiner

*Primary Examiner* — David Vu
(74) *Attorney, Agent, or Firm* — Myers Bigel Sibley & Sajovec, PA

(57) ABSTRACT

Semiconductor devices are provided. Each of the semiconductor devices may include a substrate including an active region that includes first and second regions. Each of the semiconductor devices may include a device isolation layer between the first and second regions of the active region. Each of the semiconductor devices may include a contact hole defined by recessed portions of the device isolation layer and the first region of the active region, respectively. Moreover, a topmost surface of the first region of the active region may define a bottommost portion of the contact hole. Related methods of forming semiconductor devices are also provided.

20 Claims, 72 Drawing Sheets

SEMICONDUCTOR DEVICES INCLUDING A RECESSED ACTIVE REGION, AND METHODS OF FORMING SEMICONDUCTOR DEVICES INCLUDING A RECESSED ACTIVE REGION

CROSS-REFERENCE TO RELATED APPLICATION

This U.S. non-provisional patent application claims priority under 35 U.S.C. §119 to Korean Patent Application No. 10-2012-0119206, filed on Oct. 25, 2012, in the Korean Intellectual Property Office, the disclosure of which is hereby incorporated herein by reference in its entirety.

BACKGROUND

The present disclosure relates to semiconductor devices and methods of forming semiconductor devices. Due to their small-size characteristics, multifunctional characteristics, and/or low-cost characteristics, semiconductor devices may be considered important elements in the electronics industry. As the electronics industry develops, there may be an increasing demand for highly-integrated semiconductor devices. However, to realize the highly-integrated semiconductor devices, patterns of the semiconductor device may be formed to have a decreased line width, and this may lead to an increased risk of electrical short between conductive patterns.

SUMMARY

Various embodiments of the present inventive concepts provide a semiconductor device. The semiconductor device may include a substrate including first and second regions of an active region. The semiconductor device may include a device isolation layer between the first and second regions of the active region, as well as a word line in the substrate and a bit line over the word line. The semiconductor device may include a first electrical contact between the substrate and the bit line, where the first electrical contact may be configured to be electrically connected to the first region of the active region. Moreover, the semiconductor device may include a second electrical contact adjacent a side surface of the bit line, where the second electrical contact may be configured to be electrically connected to the second region of the active region. The device isolation layer and the first region of the active region may include respective recessed portions defining a contact hole that includes the first electrical contact therein. The first region of the active region may include a topmost surface that is lower than a bottommost recessed portion of the device isolation layer defining the contact hole. In some embodiments, a bottommost surface of the first electrical contact may extend lower than a bottommost surface of the second electrical contact.

In various embodiments, the second region of the active region may include a topmost surface that is higher than the bottommost recessed portion of the device isolation layer defining the contact hole. Additionally or alternatively, the semiconductor device may include an insulating spacer on an inner side surface of the contact hole. The semiconductor device may include a capacitor configured to be electrically connected to the second region of the active region by the second electrical contact.

According to various embodiments, the first electrical contact may be a bit line contact that contacts the bit line and the first region of the active region, and the second electrical contact may be a storage node contact that contacts the capacitor and the second region of the active region. The insulating spacer may separate the bit line contact from the storage node contact such that the bit line contact is electrically isolated from the storage node contact.

In various embodiments, the semiconductor device may include a contact pad between the second electrical contact and the second region of the active region. The first electrical contact may be a bit line contact that contacts the bit line and the first region of the active region. The second electrical contact may be a storage node contact that contacts the capacitor and the contact pad. The contact pad may contact the second region of the active region. Moreover, the insulating spacer may separates the bit line contact from the contact pad such that the bit line contact is electrically isolated from the contact pad.

A method of forming a semiconductor device, according to various embodiments, may include forming an active region on a substrate, where the active region may include first and second regions spaced apart by a device isolation layer. The method may include forming an insulating layer on the substrate, and patterning the insulating layer to form a contact hole exposing a portion of the first region of the active region. The method may include recessing the portion of the first region of the active region exposed by the contact hole. The method may include forming a first electrical contact in the contact hole, where the first electrical contact may be configured to be electrically connected to the first region of the active region. Moreover, the method may include forming a second electrical contact through the insulating layer, where the second electrical contact may be configured to be electrically connected to the second region of the active region.

In various embodiments, recessing the portion of the first region of the active region may include isotropically etching the device isolation layer and the first region of the active region such that the first region of the active region includes a topmost surface that is lower than adjacent bottommost etched portions of the device isolation layer. In some embodiments, the method may include forming an insulating spacer on an inner sidewall of the contact hole, where the insulating spacer may separate the first electrical contact from the second electrical contact.

According to various embodiments, the method may include forming a contact pad between the second electrical contact and the second region of the active region, where the contact pad may include a first contact area with the second region of the active region that is larger than a second contact area between the contact pad and the second electrical contact. In some embodiments, the method may include forming an insulating spacer on an inner sidewall of the contact hole before forming the first electrical contact in the contact hole, where the insulating spacer may include a first spacer on the inner sidewall of the contact hole and a second spacer on the first spacer. In some embodiments, forming the contact pad may include forming the contact pad before forming the insulating layer and before patterning the insulating layer to form the contact hole. Moreover, forming the insulating spacer may include forming the first spacer on a sidewall of the contact pad after forming the contact hole and before recessing the portion of the first region of the active region, and forming the second spacer after recessing the portion of the first region of the active region.

A semiconductor device, according to various embodiments, may include a substrate including an active region that includes first and second regions. The semiconductor device may include a device isolation layer between the first and second regions of the active region. The semiconductor device may include a contact hole defined by recessed portions of the device isolation layer and the first region of the active region, respectively, where a topmost surface of the first region of the active region may define a bottommost portion of the contact hole. Moreover, the semiconductor device may include a bit line contact in the contact hole, and a bit line on the bit line contact.

In various embodiments, the topmost surface of the first region of the active region may be lower than a topmost surface of the second region of the active region, and may be lower than a bottommost surface of the recessed portion of the device isolation layer defining the contact hole. In some embodiments, the semiconductor device may include an insulating spacer on the recessed portions of the device isolation layer and the first region of the active region. In some embodiments, the bit line contact may be a first electrical contact, and the semiconductor device may include a second electrical contact on the second region of the active region. The insulating spacer may be between the second electrical contact and the first electrical contact. Moreover, the semiconductor device may include a contact pad between the second electrical contact and the second region of the active region, where the insulating spacer may be between the contact pad and the first electrical contact.

BRIEF DESCRIPTION OF THE DRAWINGS

The above and other features and advantages of the disclosure will become more apparent in view of the attached drawings and accompanying detailed description.

DETAILED DESCRIPTION

Figure 1A:
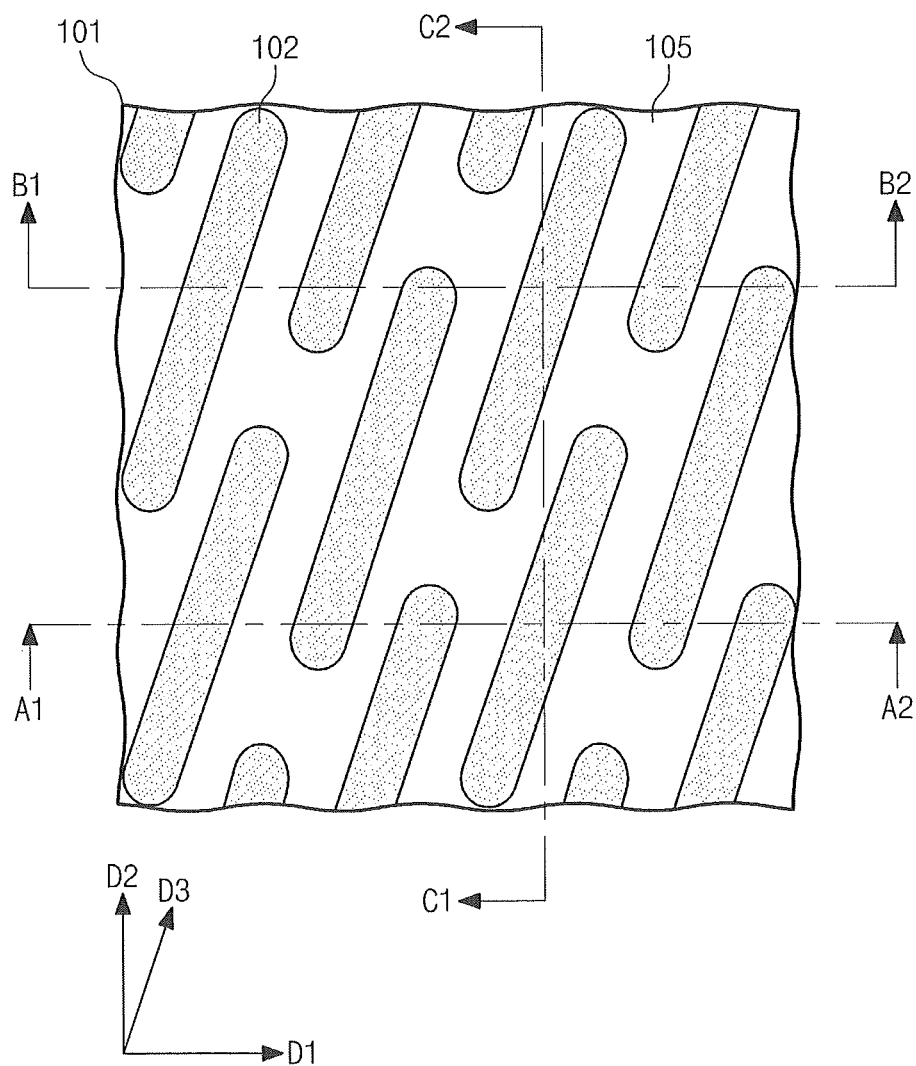
FIGS. 1A, 2A, 3A, 4A, 5A, 6A, 7A, 8A, 9A, 10A, and 11A are plan views illustrating methods of fabricating a semiconductor device according to various embodiments of the present inventive concepts.
Figure 1B:
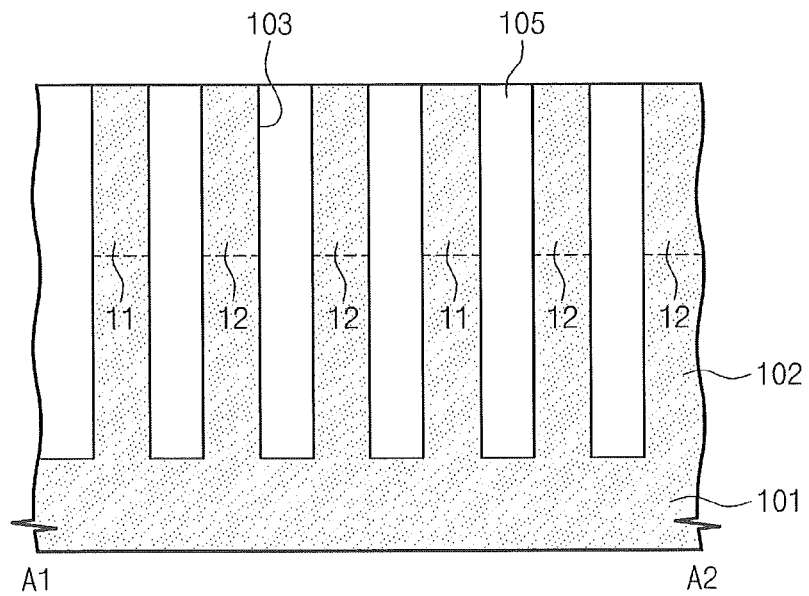
FIGS. 1B, 2B, 3B, 4B, 5B, 6B, 7B, 8B, 9B, 10B, and 11B are sectional views taken along line A1-A2 of FIGS. 1A, 2A, 3A, 4A, 5A, 6A, 7A, 8A, 9A, 10A, and 11A, respectively.
Figure 1C:
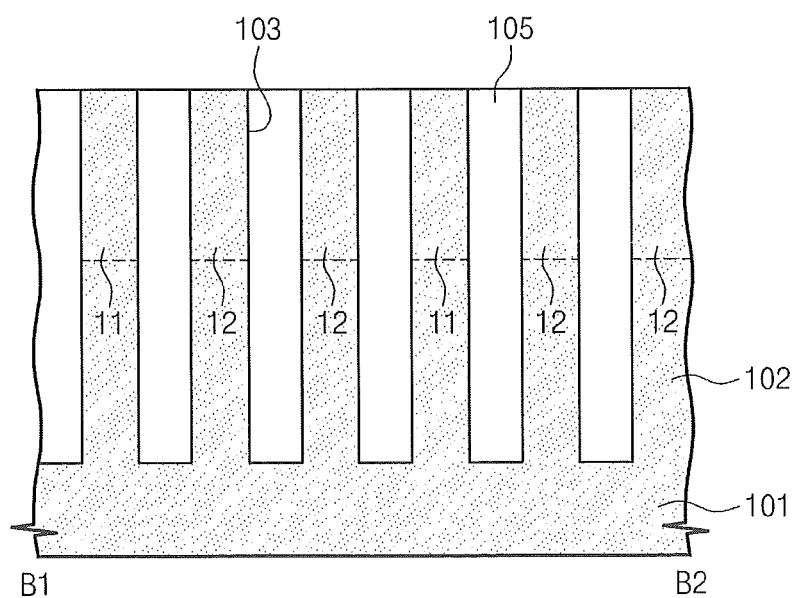
FIGS. 1C, 2C, 3C, 4C, 5C, 6C, 7C, 8C, 9C, 10C, and 11C are sectional views taken along line B1-B2 of FIGS. 1A, 2A, 3A, 4A, 5A, 6A, 7A, 8A, 9A, 10A, and 11A, respectively.
Figure 1D:
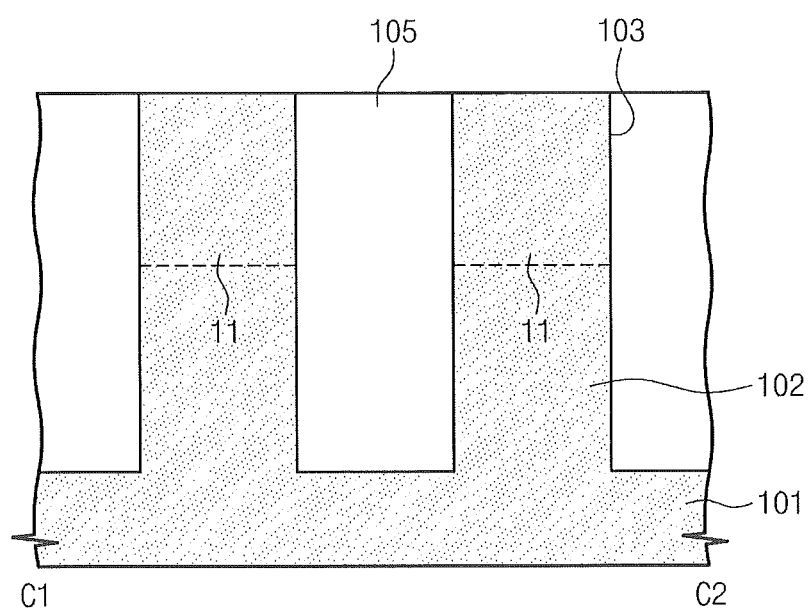
FIGS. 1D, 2D, 3D, 4D, 5D, 6D, 7D, 8D, 9D, 10D, and 11D are sectional views taken along line C1-C2 of FIGS. 1A, 2A, 3A, 4A, 5A, 6A, 7A, 8A, 9A, 10A, and 11A, respectively.
Figure 2A:
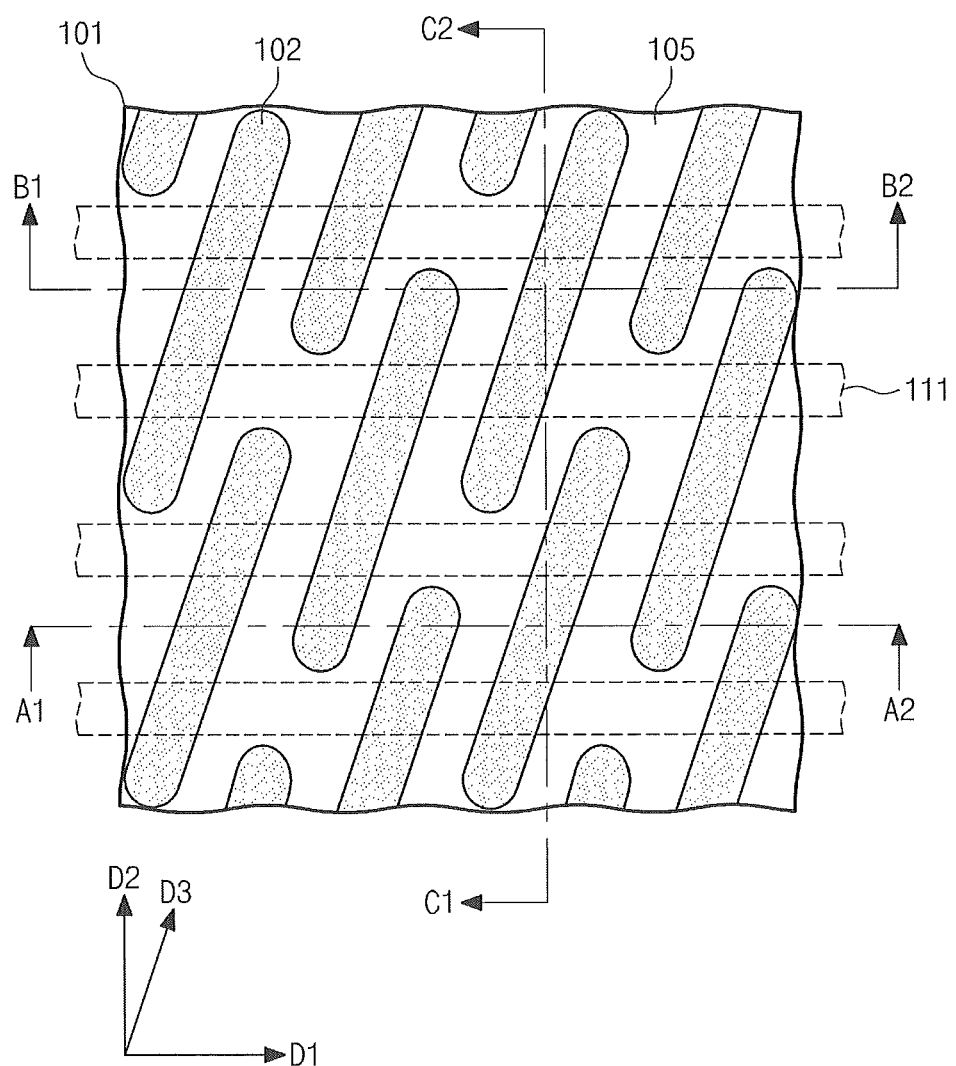
Figure 2B:
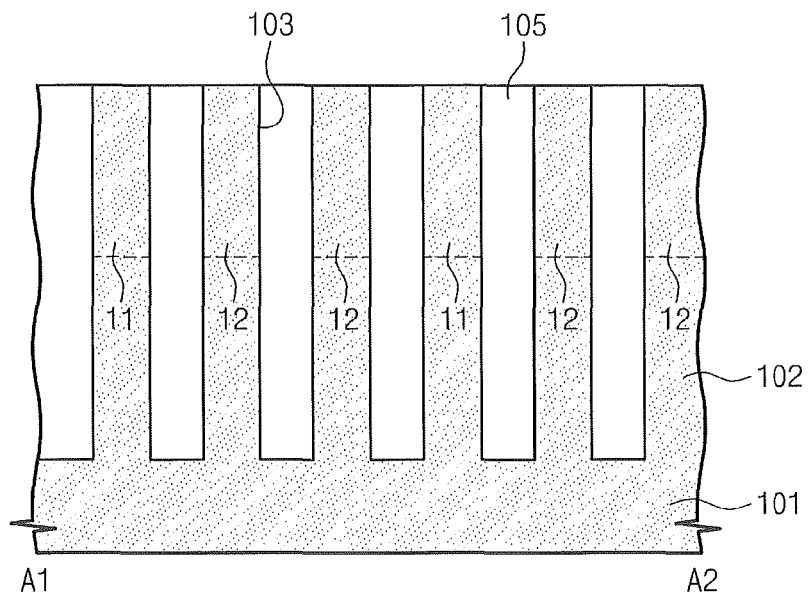
Figure 2C:
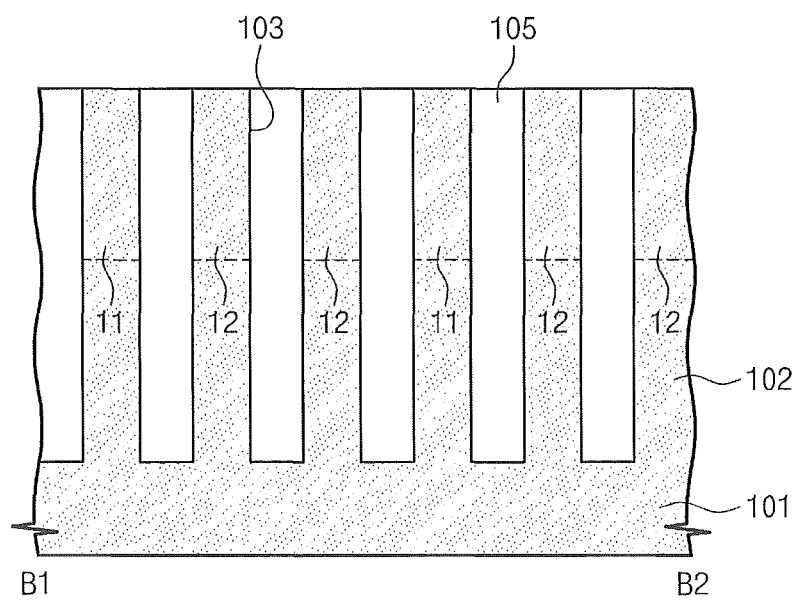
Figure 2D:
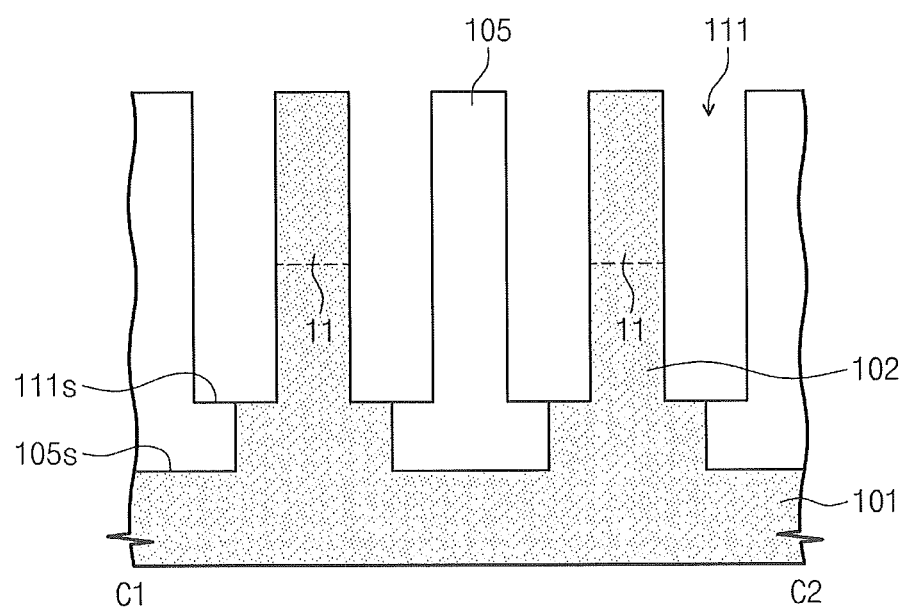
Figure 3A:
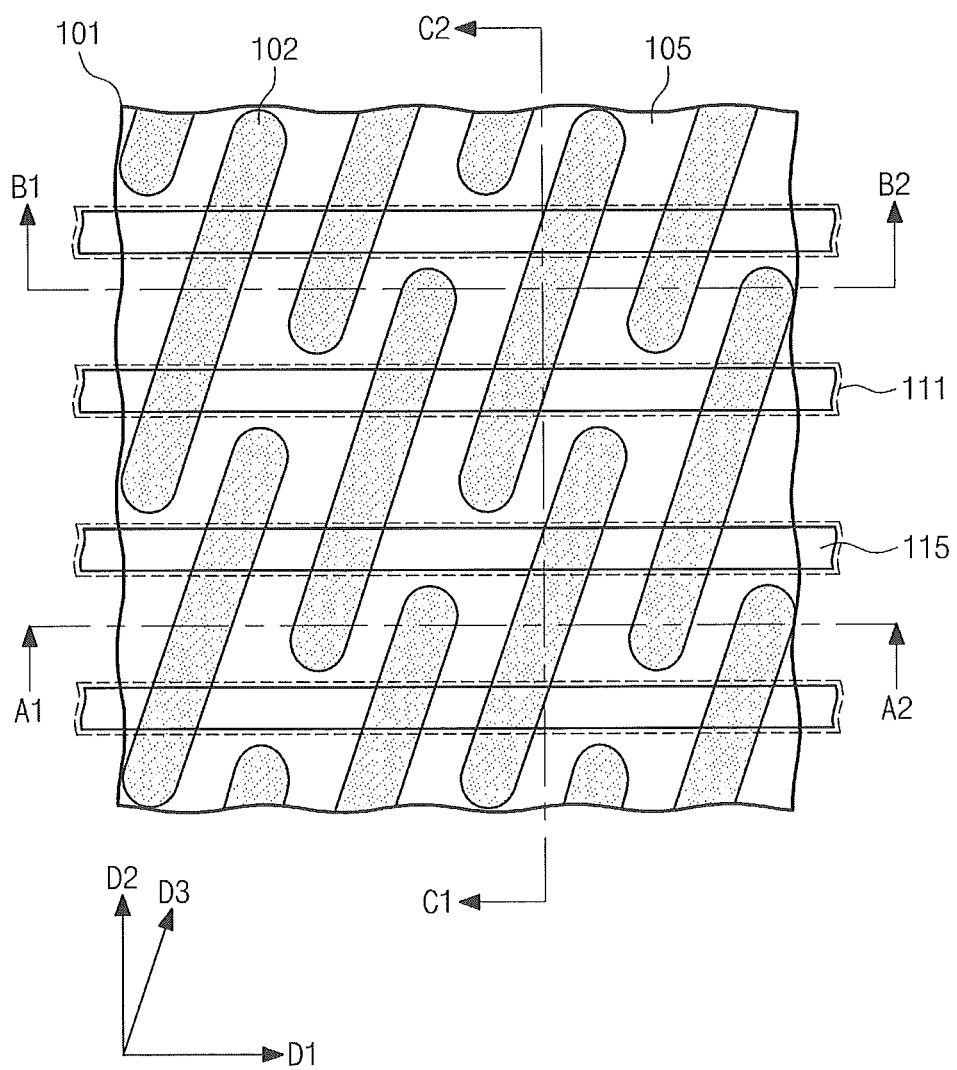
Figure 3B:
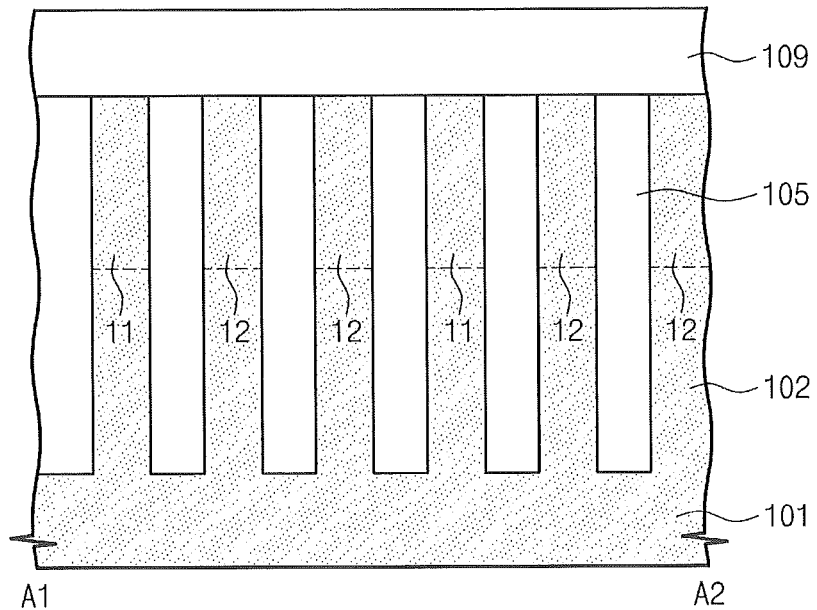
Figure 3C:
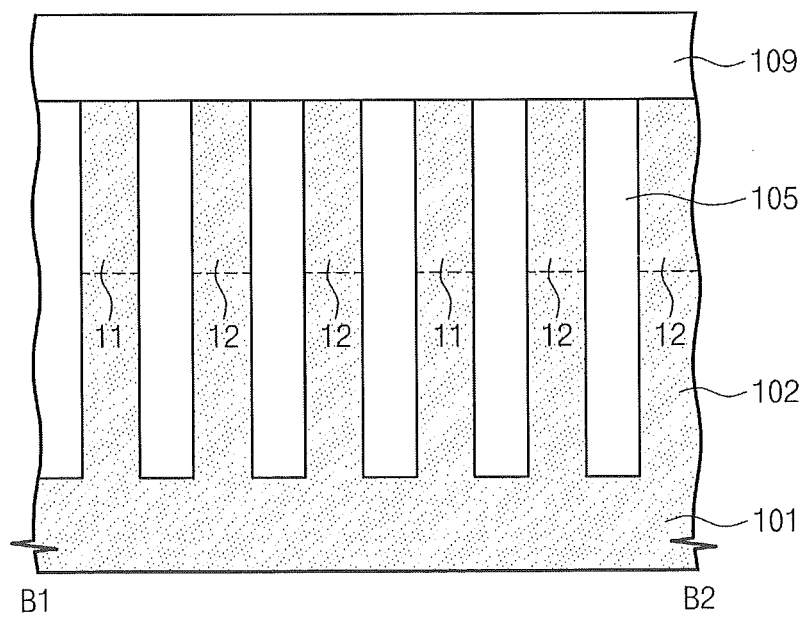
Figure 3D:
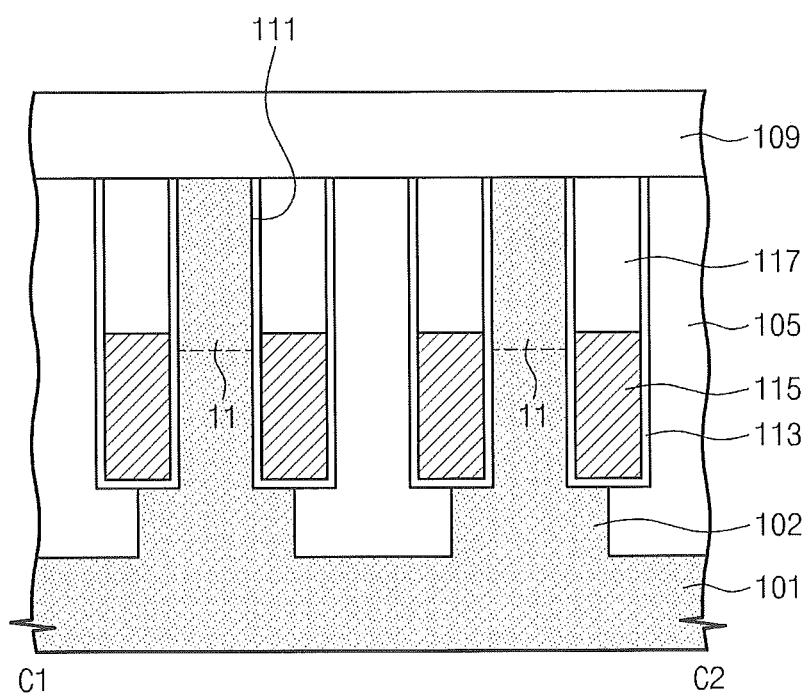

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout the description.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may be interpreted accordingly.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIGS. 1A, 2A, 3A, 4A, 5A, 6A, 7A, 8A, 9A, 10A, and 11A are plan views illustrating methods of fabricating a semiconductor device according to various embodiments of the present inventive concepts. FIGS. 1B, 2B, 3B, 4B, 5B, 6B, 7B, 8B, 9B, 10B, and 11B are sectional views taken along line A1-A2 of FIGS. 1A, 2A, 3A, 4A, 5A, 6A, 7A, 8A, 9A, 10A, and 11A, respectively. FIGS. 1C, 2C, 3C, 4C, 5C, 6C, 7C, 8C, 9C, 10C, and 11C are sectional views taken along line B1-B2 of FIGS. 1A, 2A, 3A, 4A, 5A, 6A, 7A, 8A, 9A, 10A, and 11A, respectively. FIGS. 1D, 2D, 3D, 4D, 5D, 6D, 7D, 8D, 9D, 10D, and 11D are sectional views taken along line C1-C2 of FIGS. 1A, 2A, 3A, 4A, 5A, 6A, 7A, 8A, 9A, 10A, and 11A, respectively.

Referring to FIGS. 1A, 1B, 1C, and 1D, a substrate 101 may be formed to have active regions 102. For example, the substrate 101 (e.g., a silicon wafer) may be etched to form a trench 103. The trench 103 may be filled with an insulating material such as an oxide layer (e.g., a silicon oxide (SiOx) layer) or a nitride layer (e.g., a silicon nitride (SiNx) layer or a silicon oxynitride (SiON) layer) to form a device isolation layer 105. The device isolation layer 105 may define the island-shaped active regions 102 elongated along, for example, a third direction D3. The active regions 102 may have a substantially vertical pillar structure. Junction regions 11 and 12 may be formed in upper portions of the active region 102. Impurities may be injected into the substrate 101 such that the junction regions 11 and 12 may be formed in a self-aligned manner. The junction regions 11 and 12 may include a first junction region 11 at a center of the active region 102 and second junction regions 12 at both lateral sides of the active region 102 in a plan view. In some example embodiments, the substrate 101 may be doped with p-type impurities and the junction regions 11 and 12 may be doped to with n-type impurities, or vice versa.

Referring to FIGS. 2A, 2B, 2C, and 2D, a plurality of grooves 111 may be formed in the substrate 101. For example, the active region 102 and the device isolation layer 105 may be patterned to form the groove 111 extending in a first direction D1. Adjacent ones of the grooves 111 may be separated from each other in a second direction D2. The groove 111 may have a bottom surface 111s that is higher than a bottom surface 105s of the device isolation layer 105. The first direction D1 may be substantially orthogonal to the second direction D2, and the third direction D3 may be a direction crossing the first and second directions D1 and D2 at an angle of 90 degree or less.

Referring to FIGS. 3A, 3B, 3C, and 3D, word lines 115 may be formed in the grooves 111, respectively, to extend along the first direction D1, and then, a first interlayer insulating layer 109 may be formed on the substrate 101. In some example embodiments, the formation of the word lines 115 may include thermally oxidizing the active regions 102 exposed by the grooves 111 or depositing a silicon oxide layer on the active regions 102 to form a gate insulating layer 113, forming a conductive layer to fill the grooves 111 provided with the gate insulating layer 113, and then recessing the conductive layer to form gate electrodes (i.e., the word lines 115). Adjacent ones of the word lines 115 may be spaced apart from each other in the second direction D2. The gate insulating layer 113 may be formed to cover bottom and side surfaces of the word lines 115. The word lines 115 may be formed by depositing at least one of a polysilicon layer, a metal layer, or a metal silicide layer. A word line capping layer 117 may be formed to fill unoccupied regions of the grooves 111 that are not filled with the word lines 115. The word line capping layer 117 may be formed, in a self-align manner, by depositing and planarizing an insulating material (e.g., a silicon oxide layer). Because the word lines 115 are formed in the grooves 111, it may be possible to form a channel region that is buried in the active region 102 to have a bent structure. Accordingly, compared with a linear channel region, the bent channel region can have a relatively increased length and thus, it may be possible to improve a short channel effect of a transistor. The first interlayer insulating layer 109 may be formed by depositing a silicon oxide layer or a silicon nitride layer.

Figure 4A:
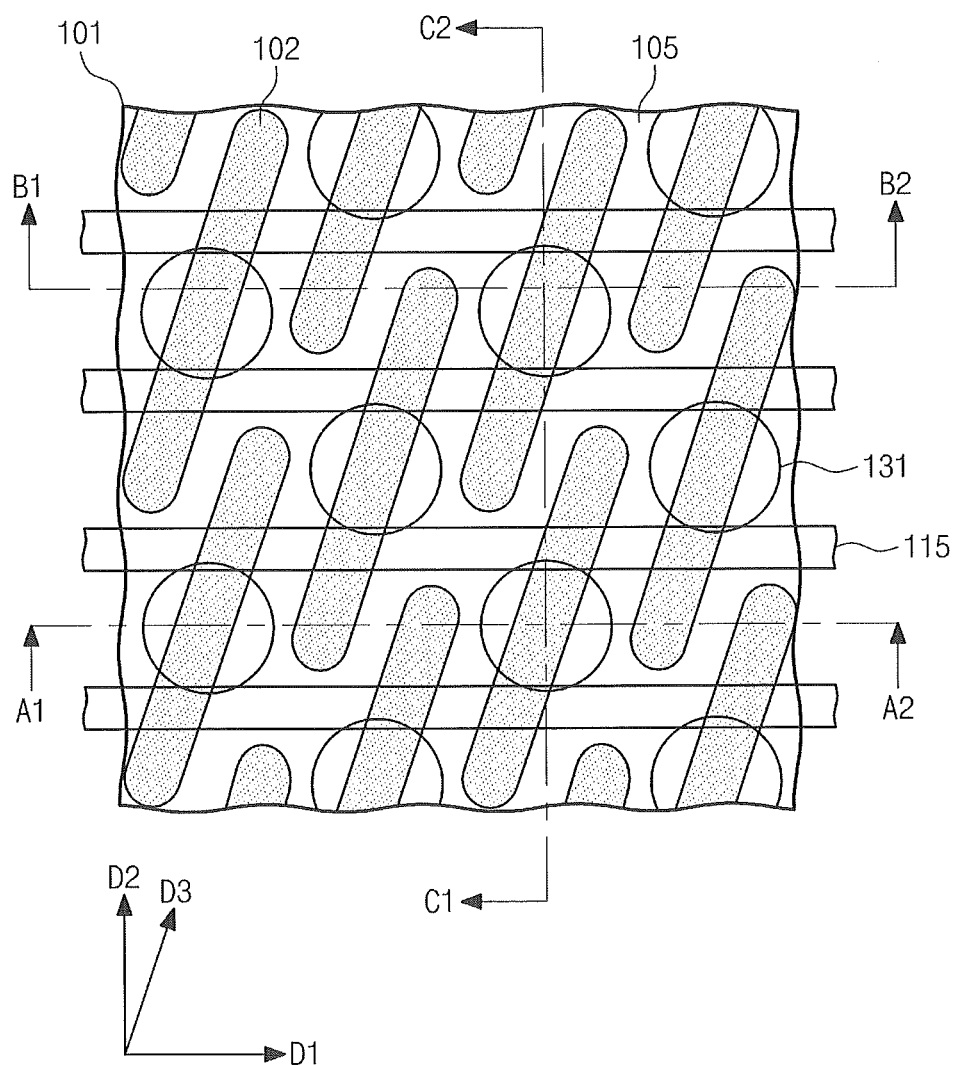
Figure 4B:
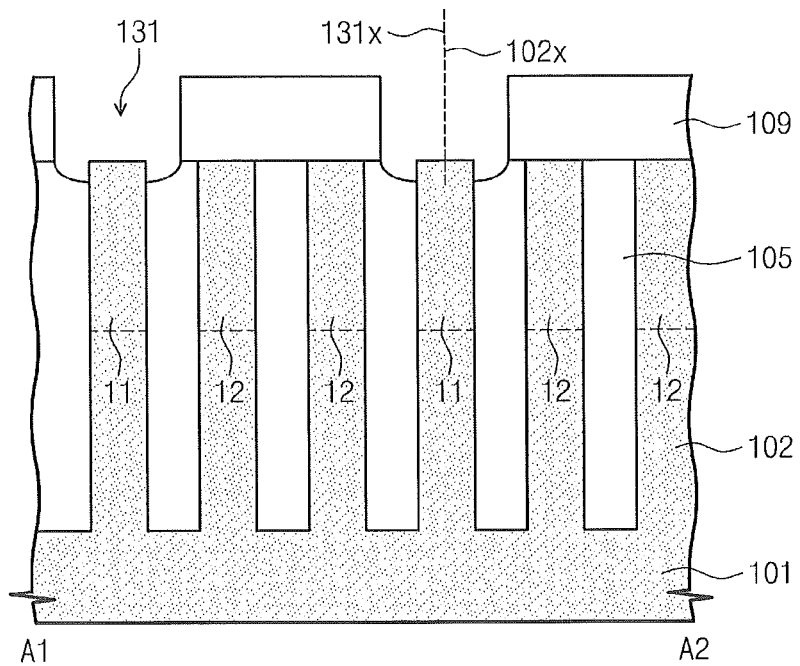
Figure 4C:
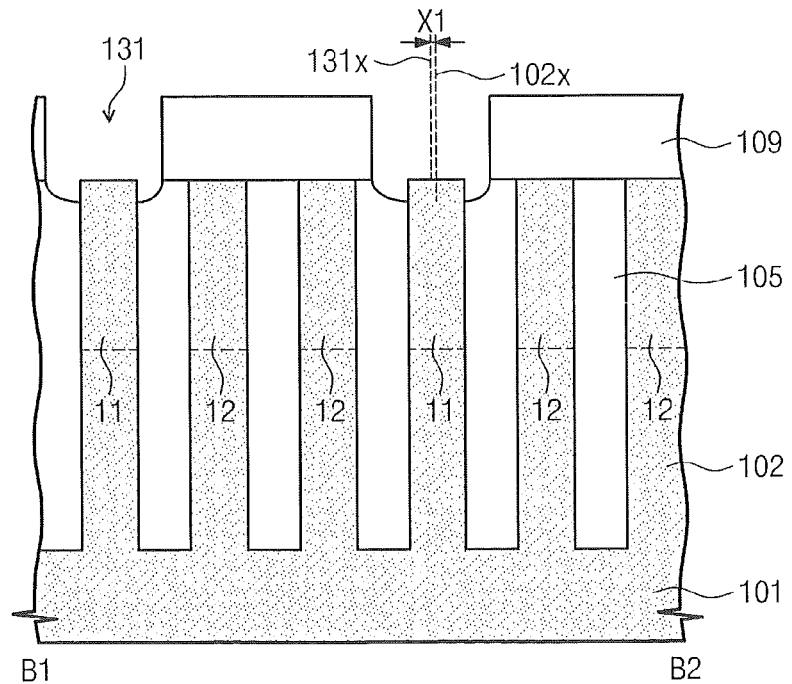
Figure 4D:
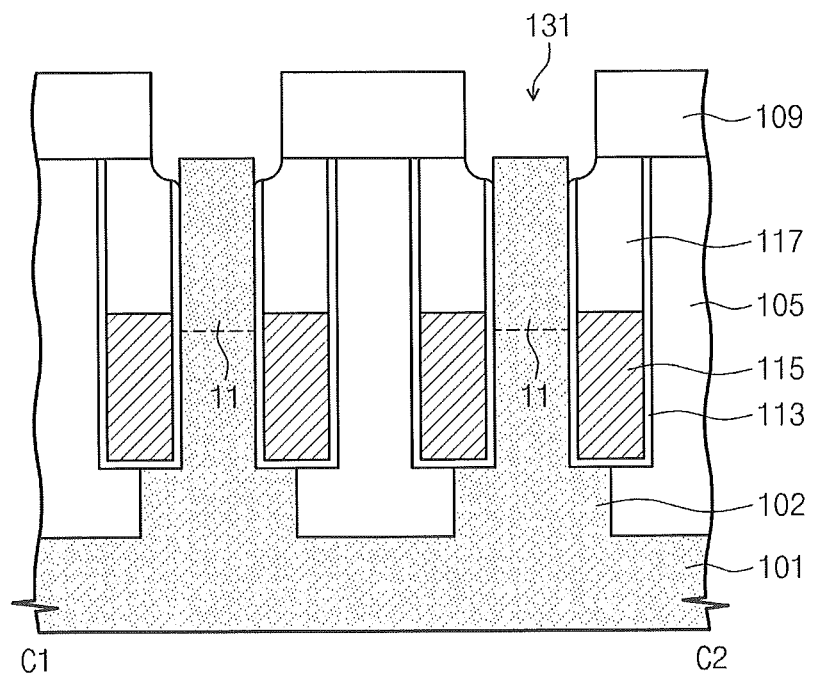

Referring to FIGS. 4A, 4B, 4C, and 4D, bit line contact holes 131 may be formed. For example, the formation of the bit line contact holes 131 may include patterning the first interlayer insulating layer 109 to expose the first junction regions 11 of the active regions 102. The device isolation layer 105 and/or the word line capping layer 117 may be etched during the formation of the bit line contact holes 131 to have top surfaces lower than those of the active regions 102. Alternatively, the active region 102 may be etched and recessed during the formation of the bit line contact holes 131. In some example embodiments, as shown in FIG. 4B, when viewed along a line A1-A2 passing through a center of the bit line contact hole 131, a central axis 131x of the bit line contact hole 131 may be coincident with a central axis 102x of the active region 102. Alternatively, as shown in FIG. 4C, when viewed along a line B1-B2 deviated from the center of the bit line contact hole 131, the central axis 131x of the bit line contact hole 131 may be deviated from the central axis 102x of the active region 102 by a first distance X1. In some example embodiments, this misalignment may result from the disposition of the active region 102 extending in a diagonal direction (i.e., the third direction D3).

Referring to FIGS. 5A, 5B, 5C, and 5D, the bit line contact holes 131 may be expanded. In some example embodiments, the active regions 102 exposed by the bit line contact holes 131 may be etched to increase volumes of the bit line contact holes 131. The etching process may be performed in a dry or wet manner. For example, an isotropic plasma etching (IPE) technique may be used to selectively recess the active region 102. Moreover, during the etching of the active region 102, the device isolation layer 105, the gate insulating layer 113, and/or the word line capping layer 117 may be etched to further increase the volumes of the bit line contact holes 131. In some example embodiments, the first junction regions 11 of the active regions 102 exposed by the bit line contact holes 131 may be recessed below the second junction regions 12 of the active regions 102 covered with the first interlayer insulating layer 109 and/or below bottom surfaces 131s of the bit line contact holes 131. In other words, a top surface 11s of the first junction region 11 may be lower than the bottom surface 131s of the bit line contact hole 131.

Referring to FIGS. 6A, 6B, 6C, and 6D, insulating spacers 133 may be formed in the bit line contact holes 131, respectively. The formation of the insulating spacers 133 may include depositing an insulating material (e.g., a silicon oxide layer or a silicon nitride layer) and performing a spacer-forming process including an anisotropic etching step. Each of the insulating spacers 133 may cover an inner sidewall of the bit line contact hole 131 and expose the active region 102 (e.g., the top surface 11s of the first junction region 11). In some embodiments, however, the formation of the insulating spacers 133 may be omitted.

Referring to FIGS. 7A, 7B, 7C, and 7D, a conductive material may be deposited on the substrate 101 and be planarized to form a first conductive layer 134 filling the bit line contact hole 131. Thereafter, a second conductive layer 144 and a second interlayer insulating layer 151 may be sequentially formed on the substrate 101. The first conductive layer 134 may be formed by depositing a layer of polysilicon, metal, or metal silicide and performing an etch-back or chemical-mechanical polishing process. The second conductive layer 144 may be formed by depositing a layer of polysilicon, metal, or metal silicide. The second interlayer insulating layer 151 may be formed by depositing a silicon oxide layer or a silicon nitride layer. The second conductive layer 144 may further include a barrier layer 143. The barrier layer 143 may be formed to be in contact with the first conductive layer 134.

Referring to FIGS. 8A, 8B, 8C, and 8D, the second interlayer insulating layer 151, the second conductive layer 144, and the first conductive layer 134 may be patterned. Accordingly, bit line contacts 135 may be formed in the bit line contact holes 131, respectively, to be electrically connected to the corresponding one of the first junction regions 11 of the active regions 102. In addition, bit lines 145 may be electrically connected to the bit line contacts 135. Each of the bit lines 145 may be patterned to have a line shape extending along the second direction D2. Adjacent ones of the bit lines 145 may be spaced apart from each other in the first direction D1. The bit line contacts 135 may be in contact with the first junction regions 11 and may have a structure with a constant or increasing sectional area in a downward direction. In some embodiments, each of the bit line contacts 135 may include a pillar-shaped portion having a constant or increasing sectional area in a downward direction and a wedge-shaped portion extending downward from the pillar-shaped portion and having a decreasing sectional area in the downward direction. The second interlayer insulating layer 151 may be patterned to cover top surfaces of the bit lines 145.

Referring to FIGS. 9A, 9B, 9C, and 9D, an insulating material (e.g., a silicon oxide layer or a silicon nitride layer) may be deposited on the substrate 101 and patterned to form bit line spacers 155 covering side surfaces of the bit lines 145. During the formation of the bit line spacers 155, gap-filling spacers 153 may be formed in the bit line contact holes 131, respectively. For example, the bit line spacers 155 and the gap-filling spacers 153 may be formed by the same process, rather than by individual processes. Accordingly, two portions of the same insulating material, which cover the side surface of the bit line 145 and the inner sidewall of the bit line contact hole 131, may be referred to as the bit line spacer 155 and the gap-filling spacer 153, respectively, for the sake of convenience. Next, a silicon oxide layer or a silicon nitride layer may be deposited on the substrate 101 to form a third interlayer insulating layer 157 that electrically isolates the bit lines 145 from each other.

Referring to FIGS. 10A, 10B, 10C, and 10D, storage node contacts 165 may be formed to be electrically connected to the second junction regions 12, respectively. For example, the formation of the storage node contacts 165 may include forming contact holes to expose the second junction regions 12 through the third and first interlayer insulating layers 157 and 109, and filling the contact holes with a conductive material. The storage node contacts 165 may be formed by depositing a layer of polysilicon, metal, metal silicide, or metal nitride. Alternatively, the storage node contacts 165 may be formed by forming an epitaxial silicon layer. Differently, the storage node contacts 165 may be formed by forming an epitaxial silicon layer and depositing a metal layer. The insulating spacers 133 may separate the bit line contact 135 electrically and spatially from the storage node contact 165 in a horizontal direction. In addition, the insulating spacers 133 may separate the first junction regions 11 of the active regions 102 electrically and spatially from the storage node contacts 165 in a vertical direction.

Figure 10A:
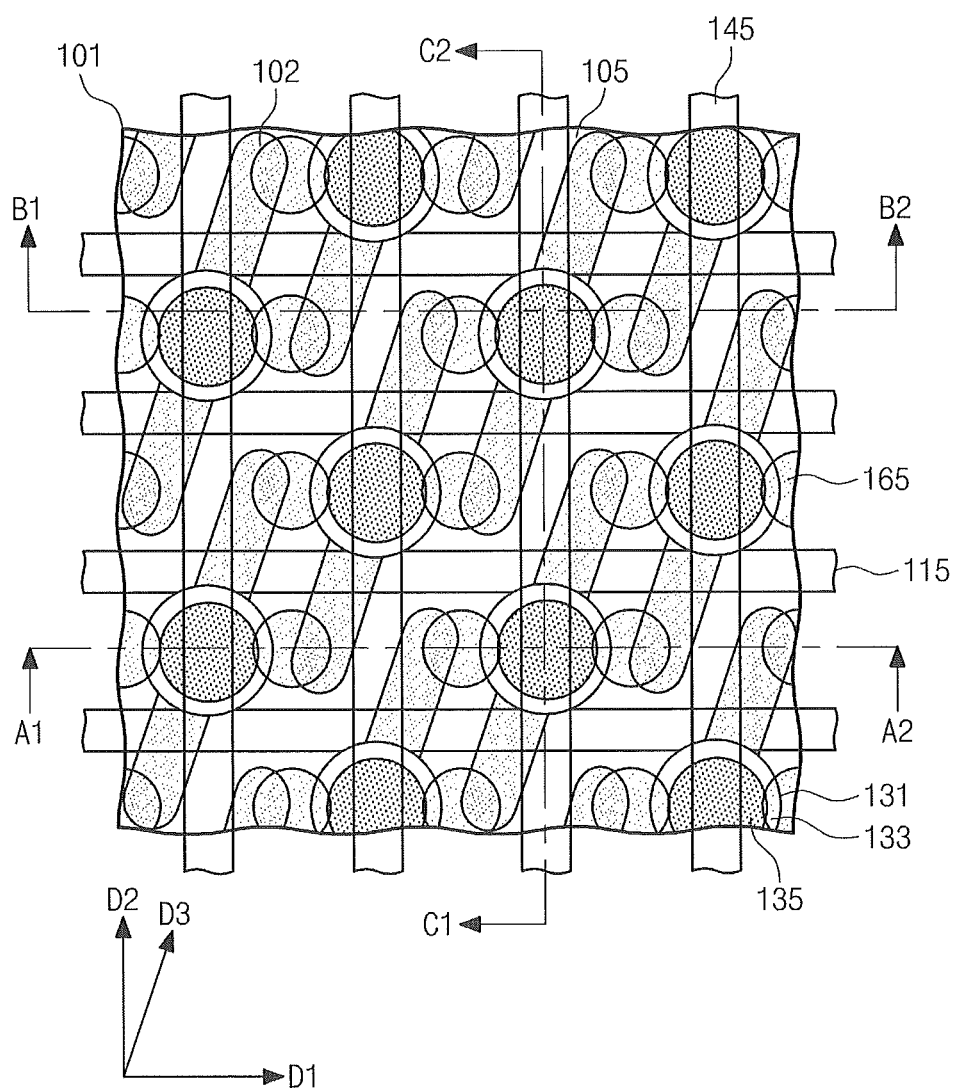
Figure 10B:
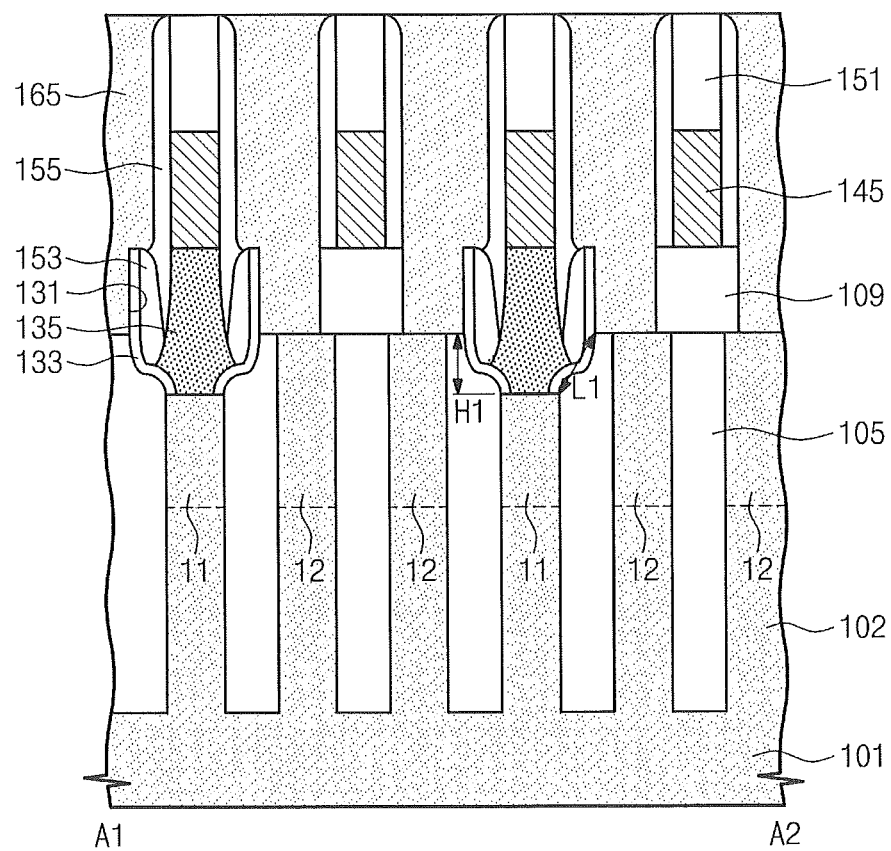

In some example embodiments, the first junction regions 11 may be recessed to be lower than the bottom surfaces 131s of the bit line contact holes 131. Accordingly, when viewed in a vertical section passing through the line A1-A2, a vertical distance H1 between the first junction region 11 of the active region 102 and the storage node contact 165 may be increased as shown in FIG. 10B, compared with the case that the first junction region 11 is not recessed. This may mean that a geodesic (e.g., shortest) distance L1 between the first junction region 11 of the active region 102 and the storage node contact 165 can be increased. Due to the increase in the vertical distance H1 and the geodesic distance L1, it may be possible to prevent or reduce electrical short circuits between the first junction region 11 of the active region 102 and the storage node contact 165.

Figure 5A:
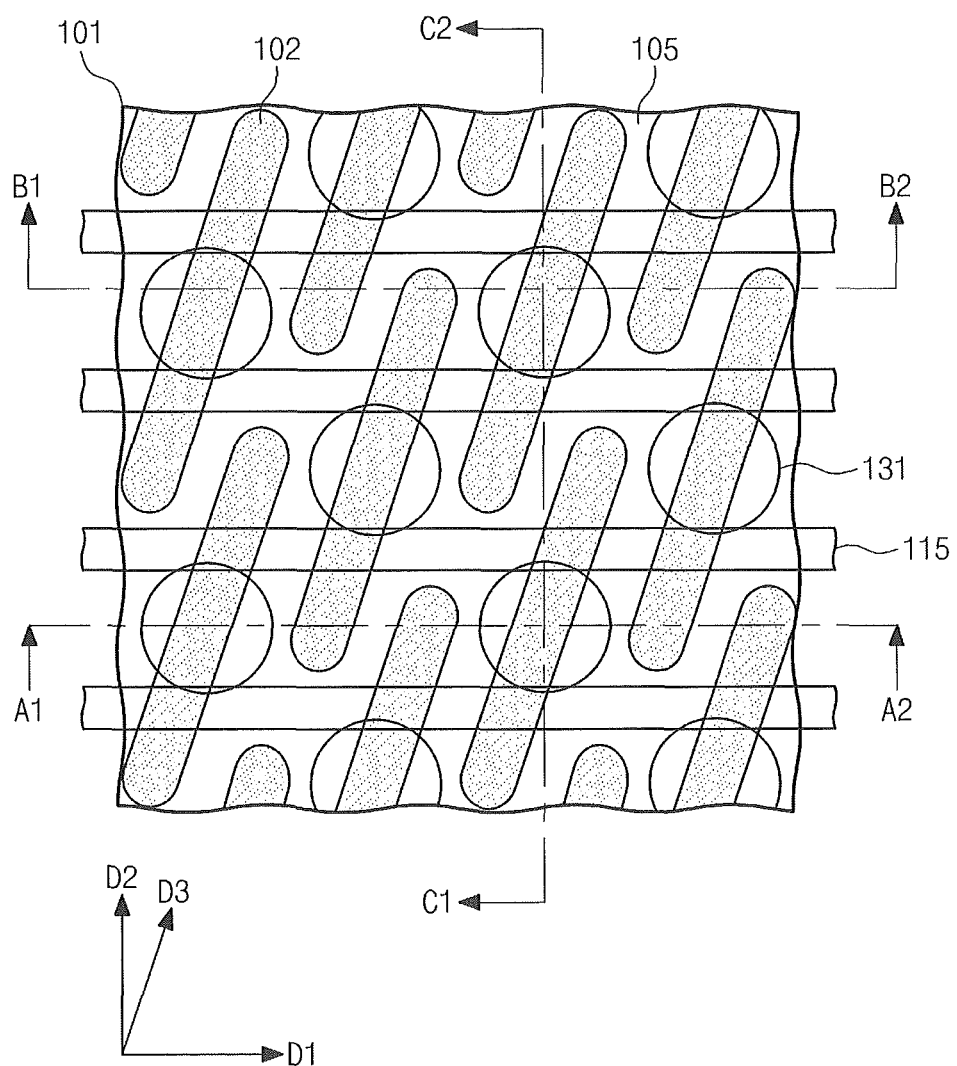
Figure 5B:
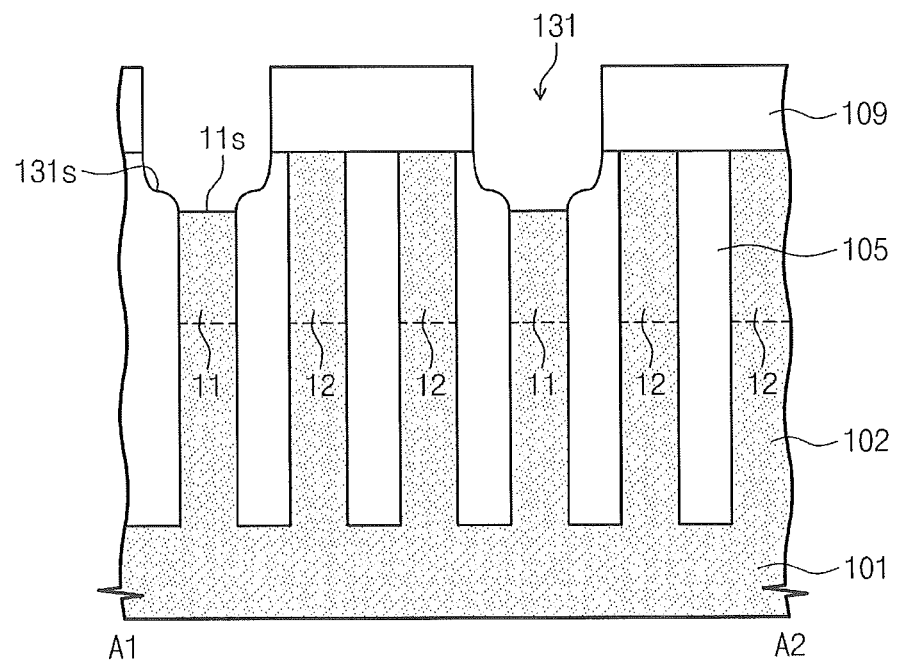
Figure 5C:
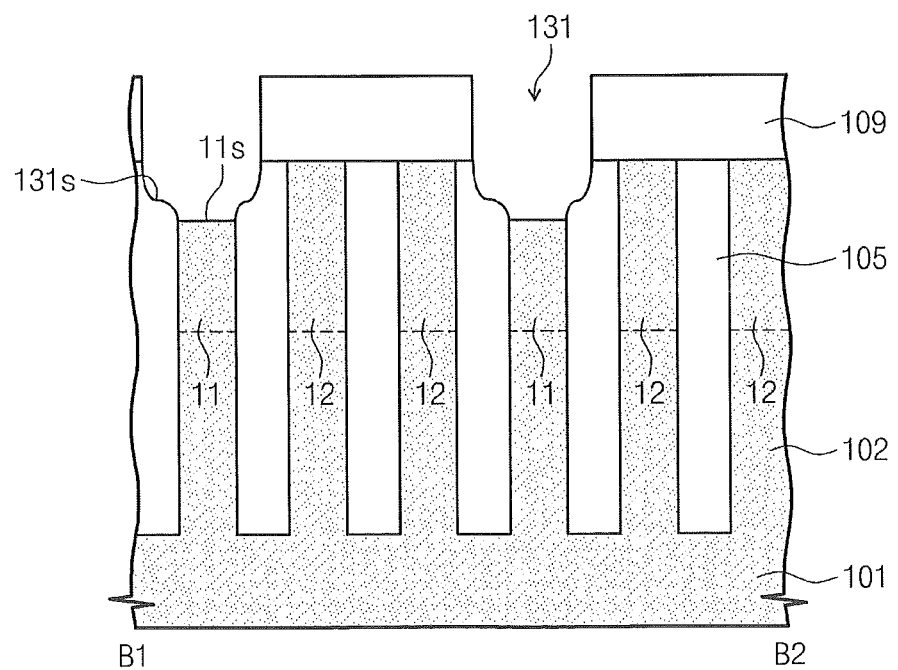
Figure 5D:
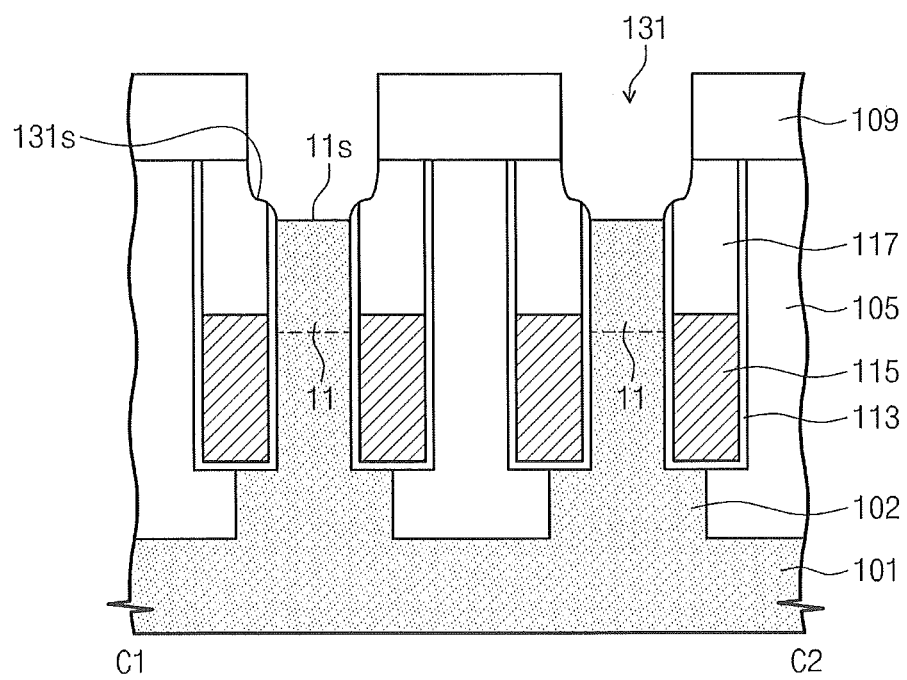
Figure 6A:
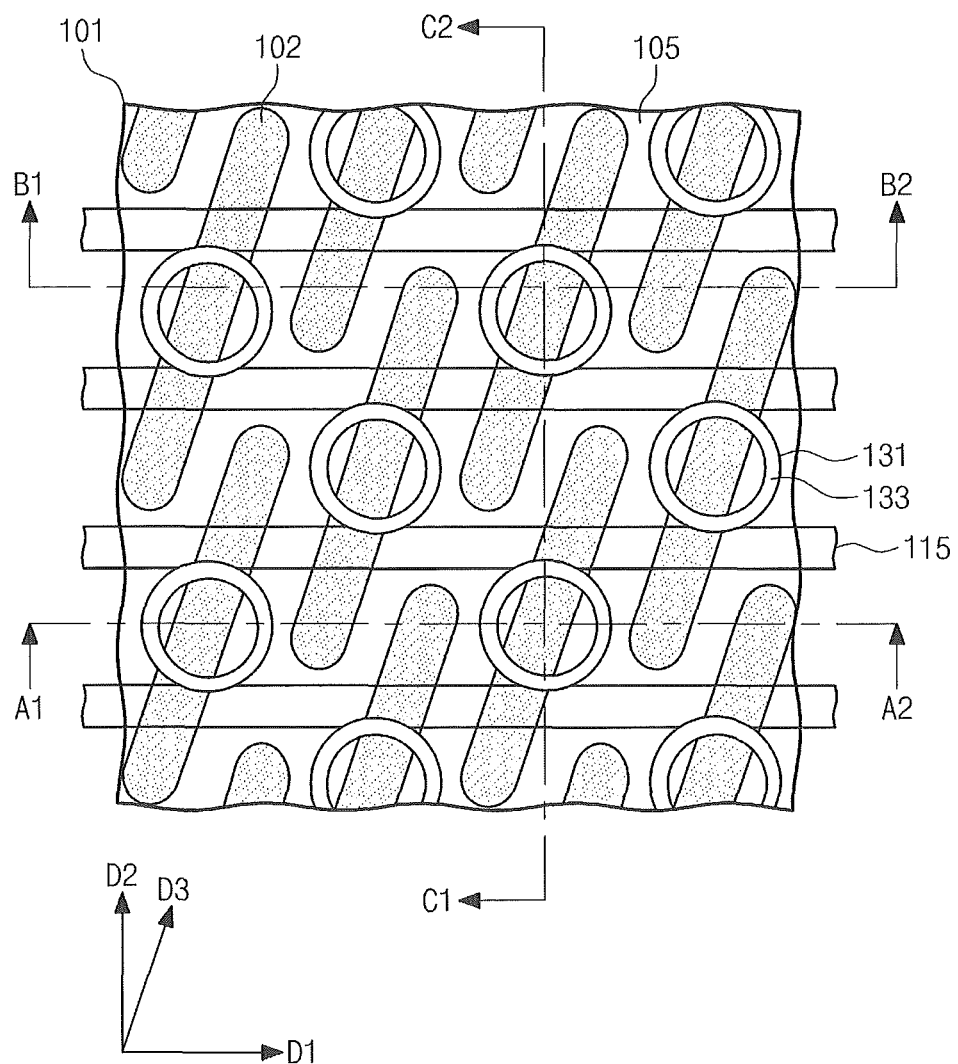
Figure 6B:
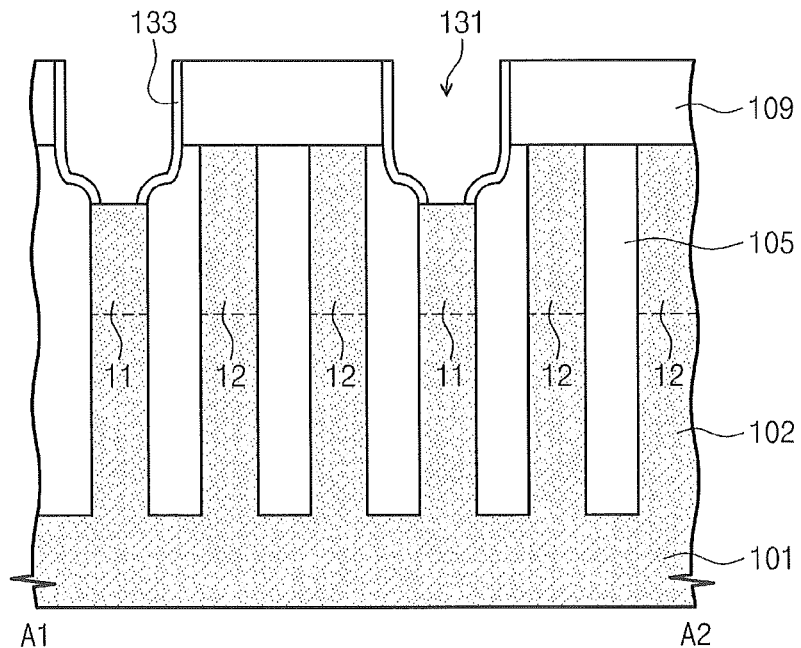
Figure 6C:
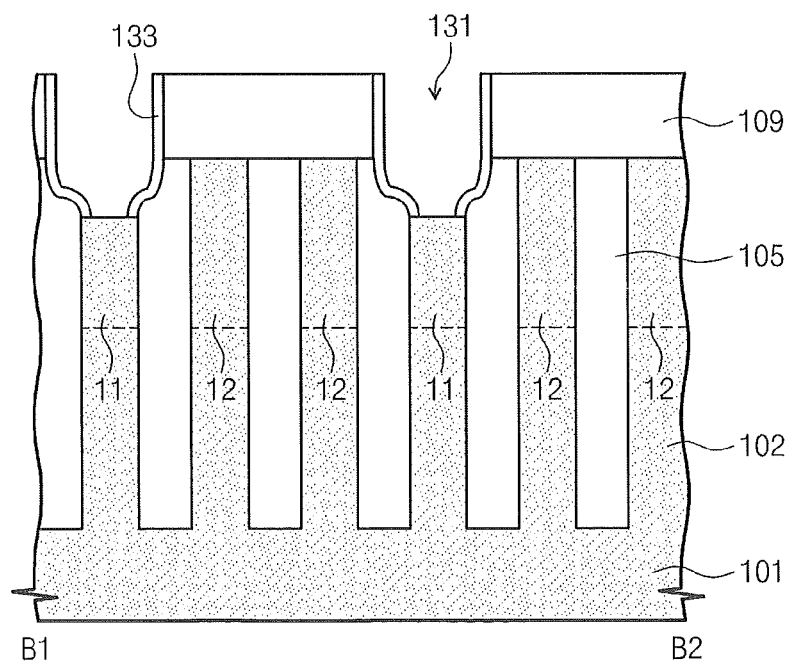
Figure 6D:
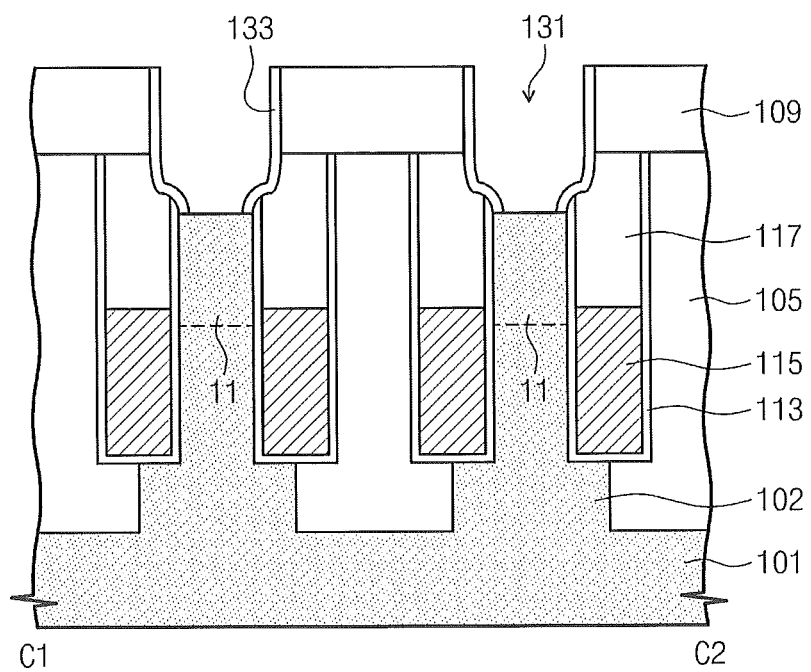
Figure 7A:
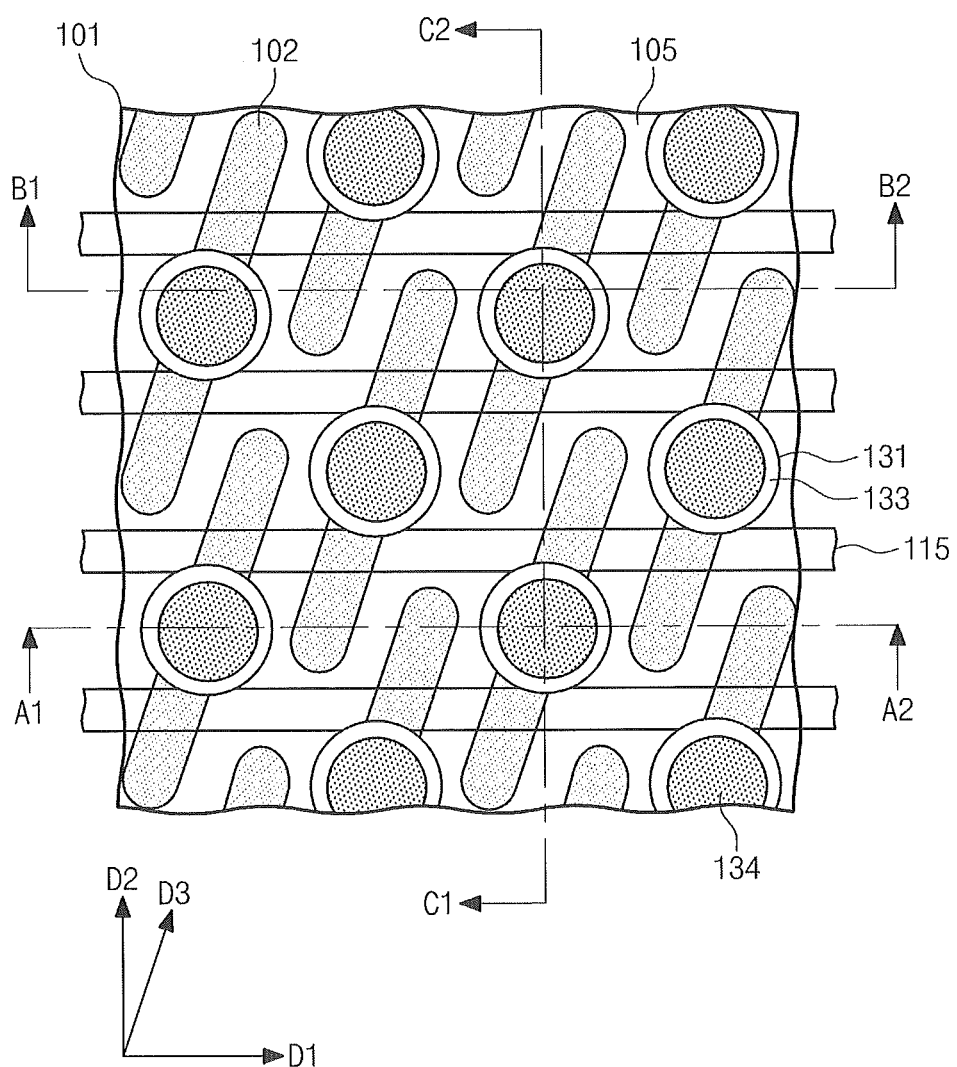
Figure 7B:
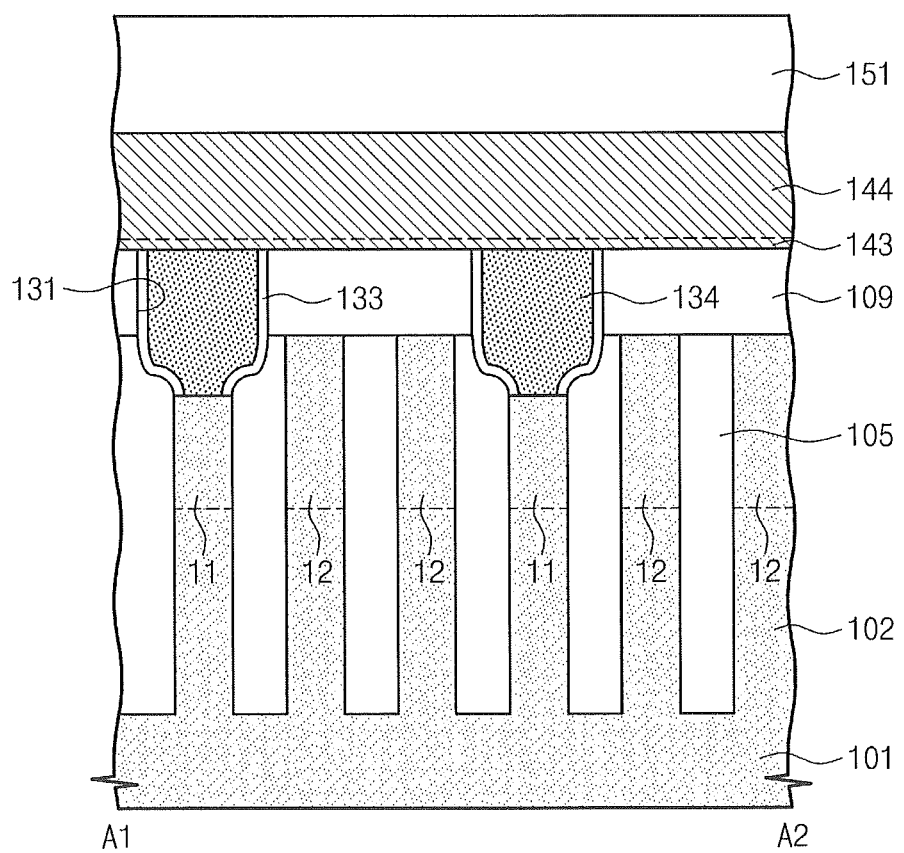
Figure 7C:
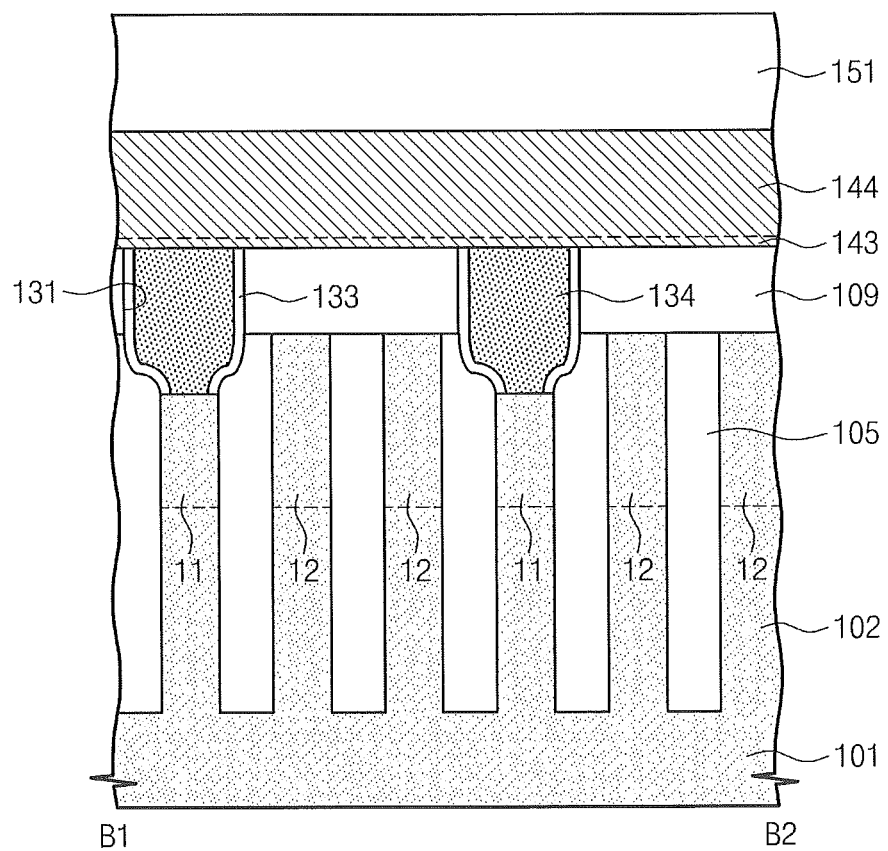
Figure 7D:
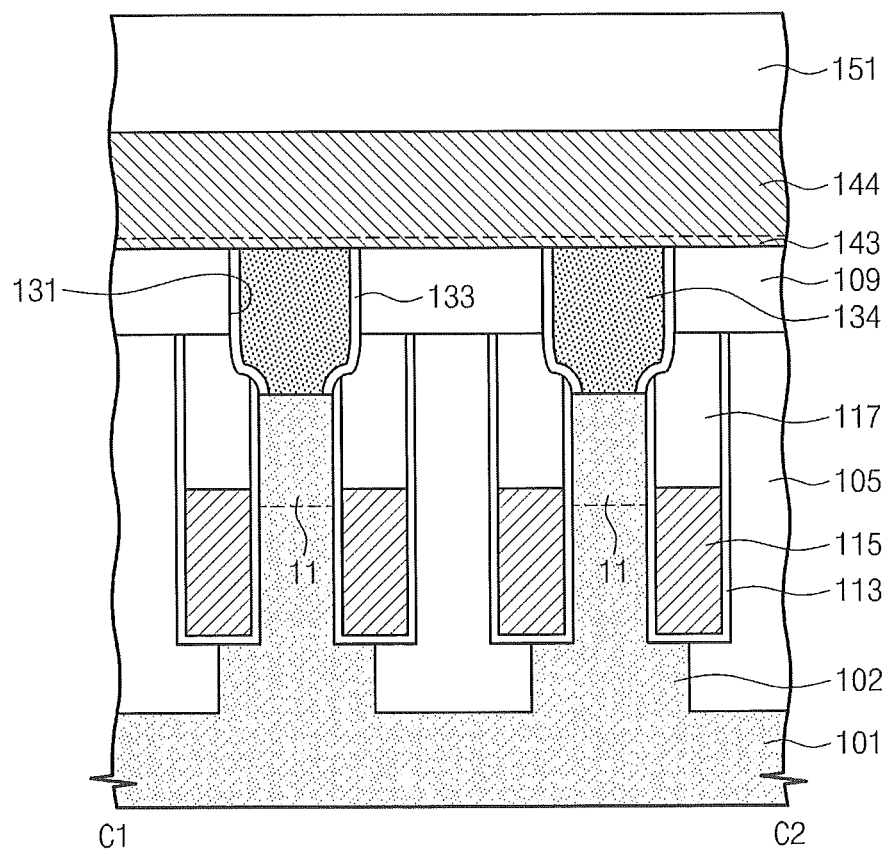
Figure 8A:
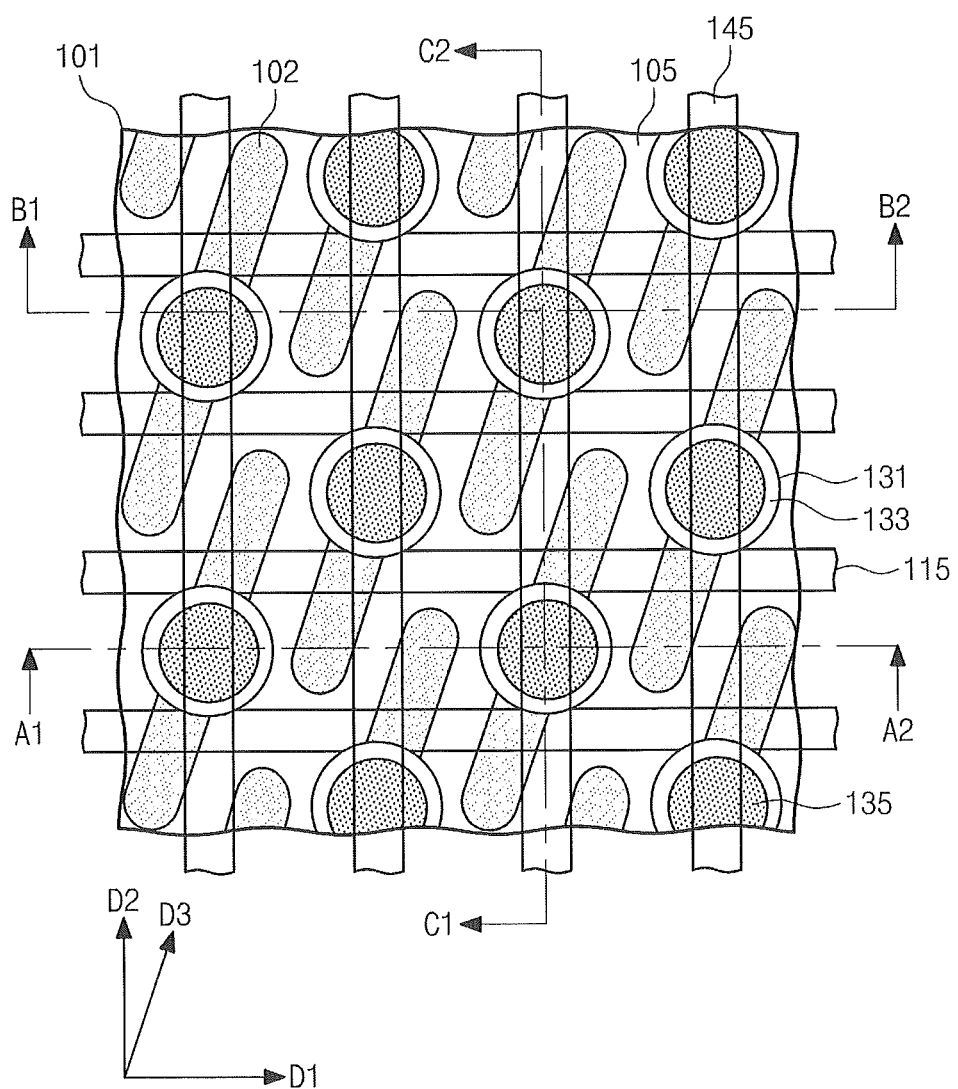
Figure 8B:
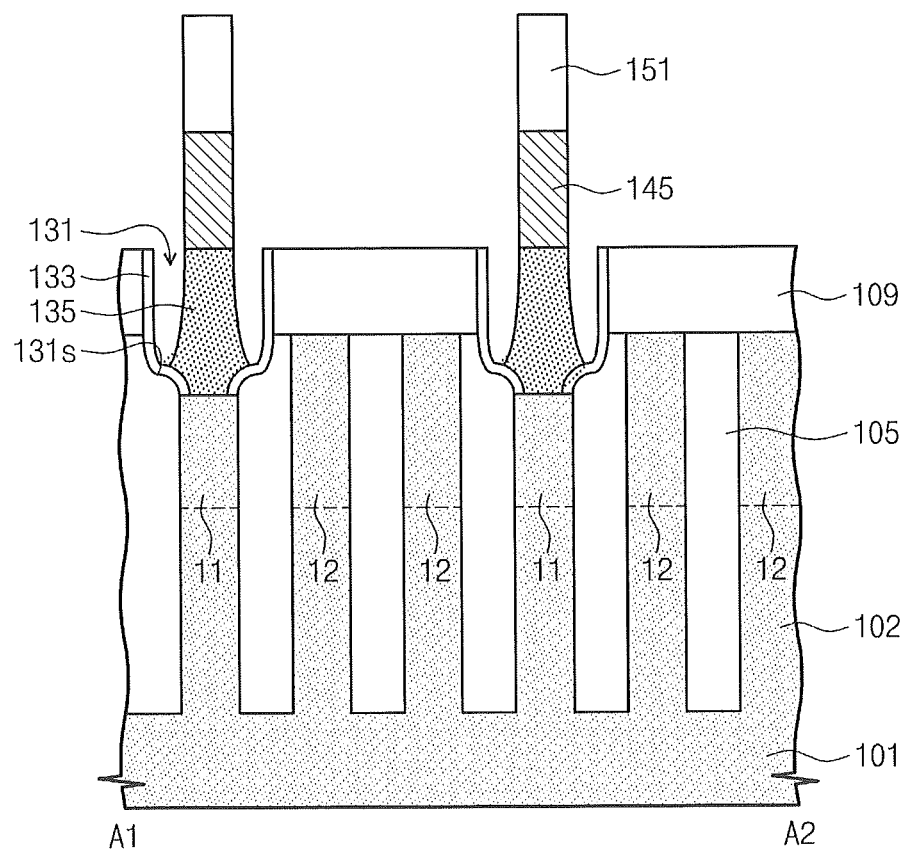
Figure 8C:
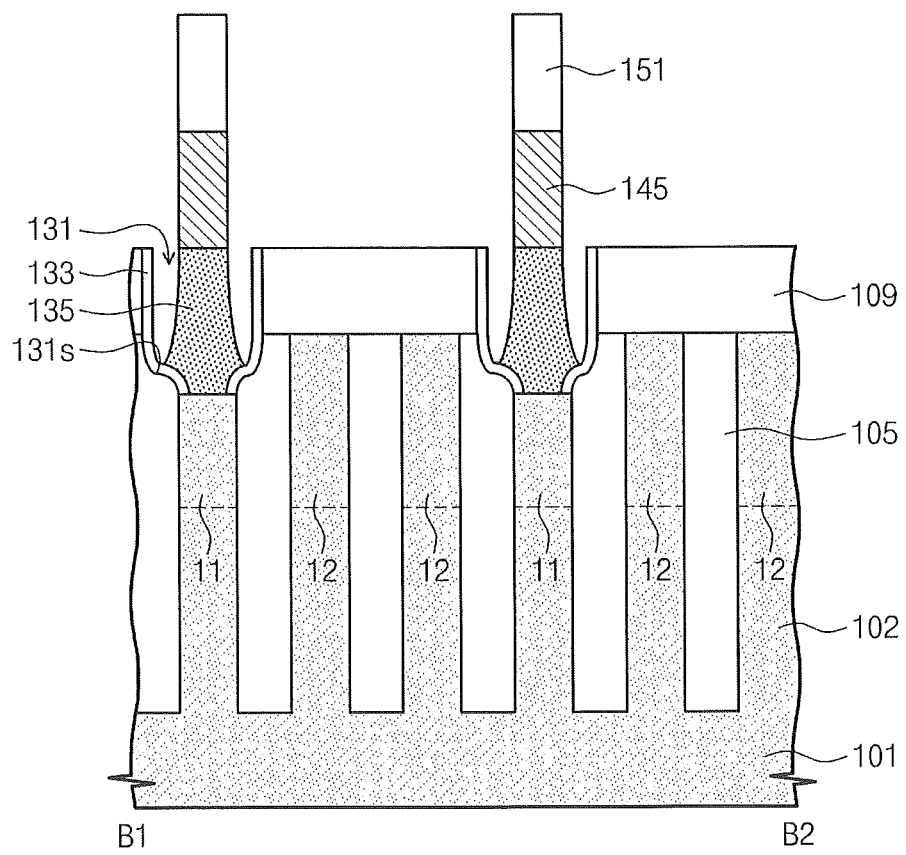
Figure 8D:
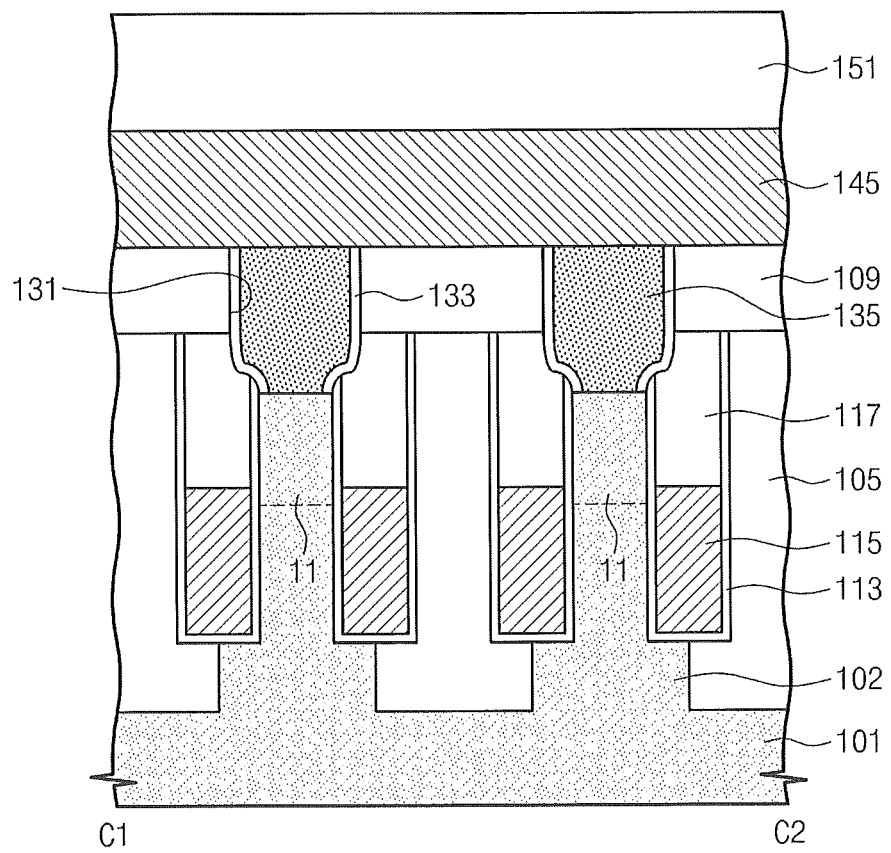
Figure 9A:
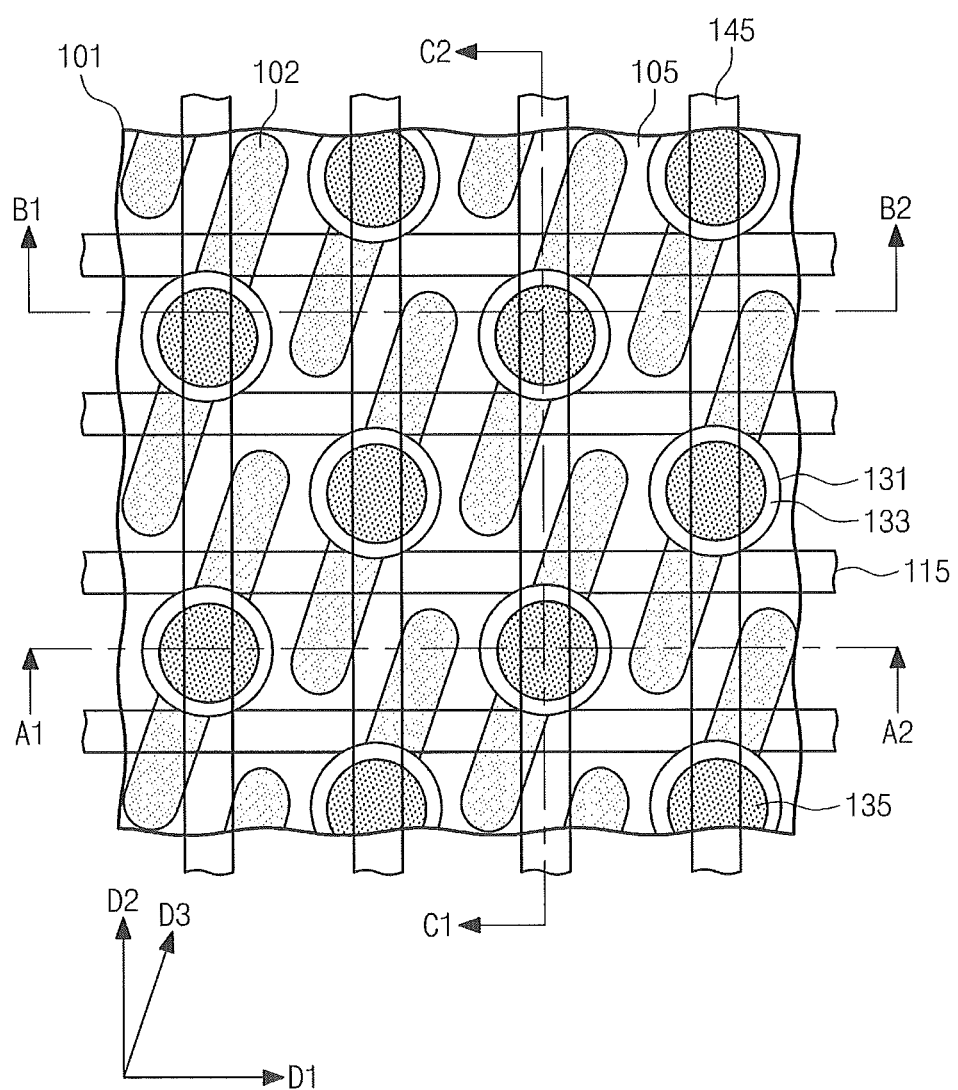
Figure 9B:
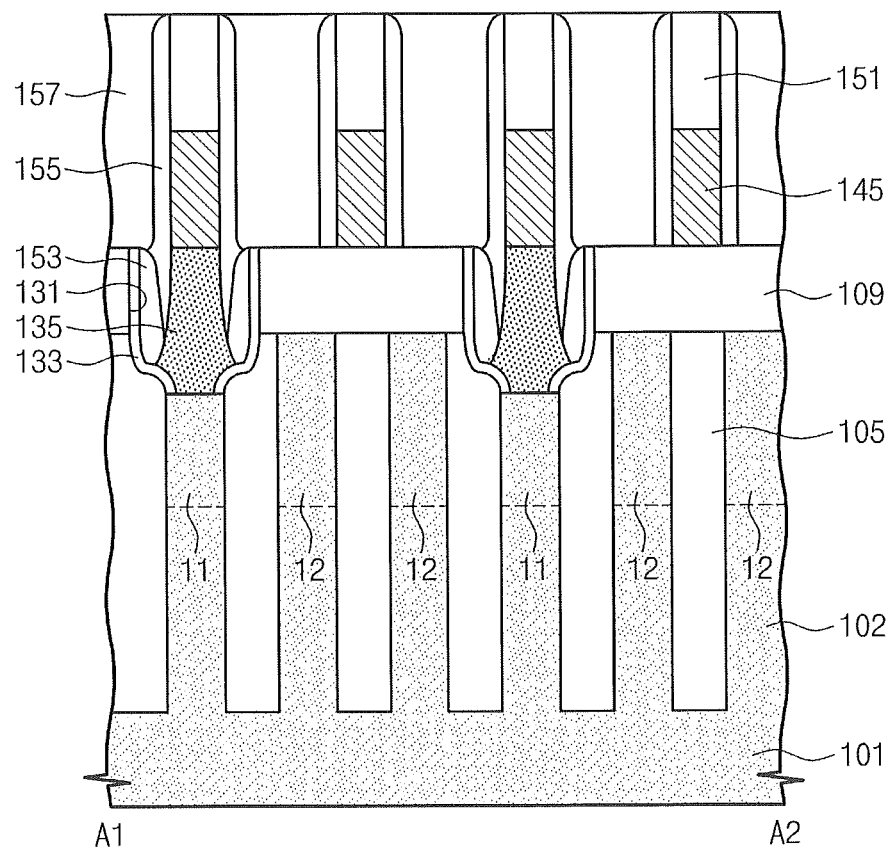
Figure 9C:
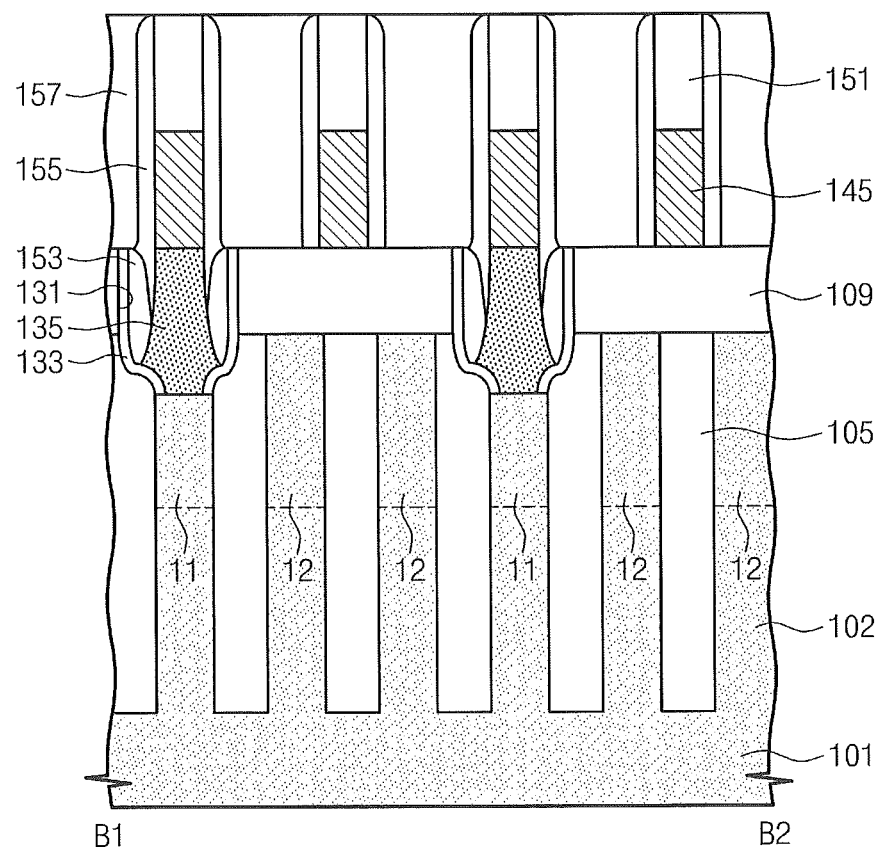
Figure 9D:
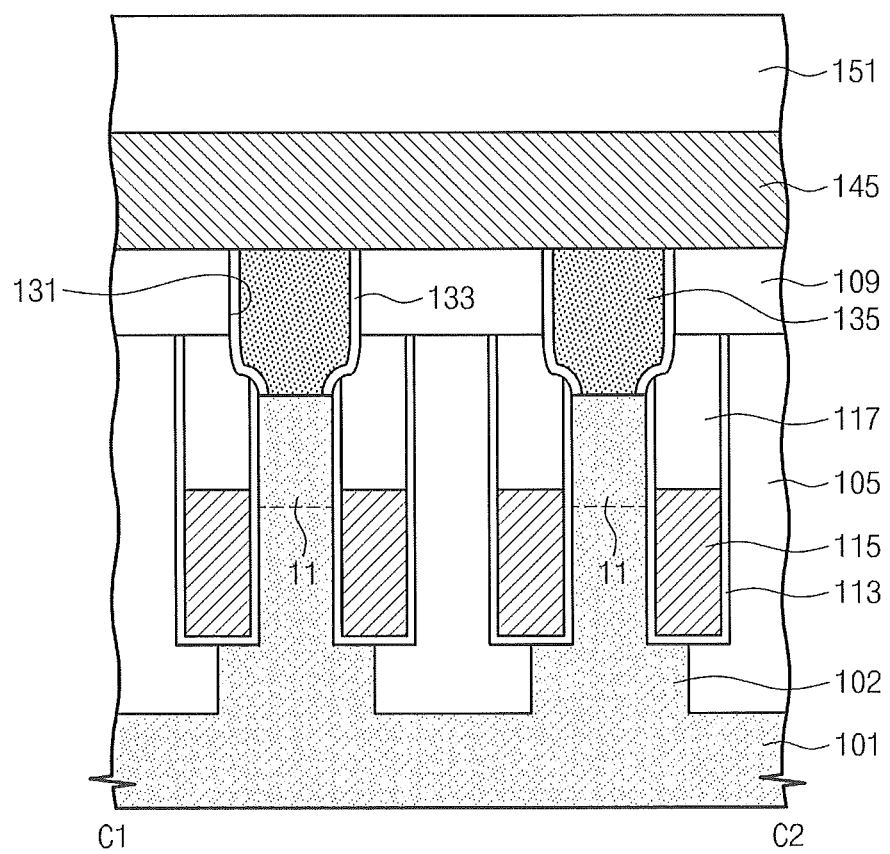
Figure 10C:
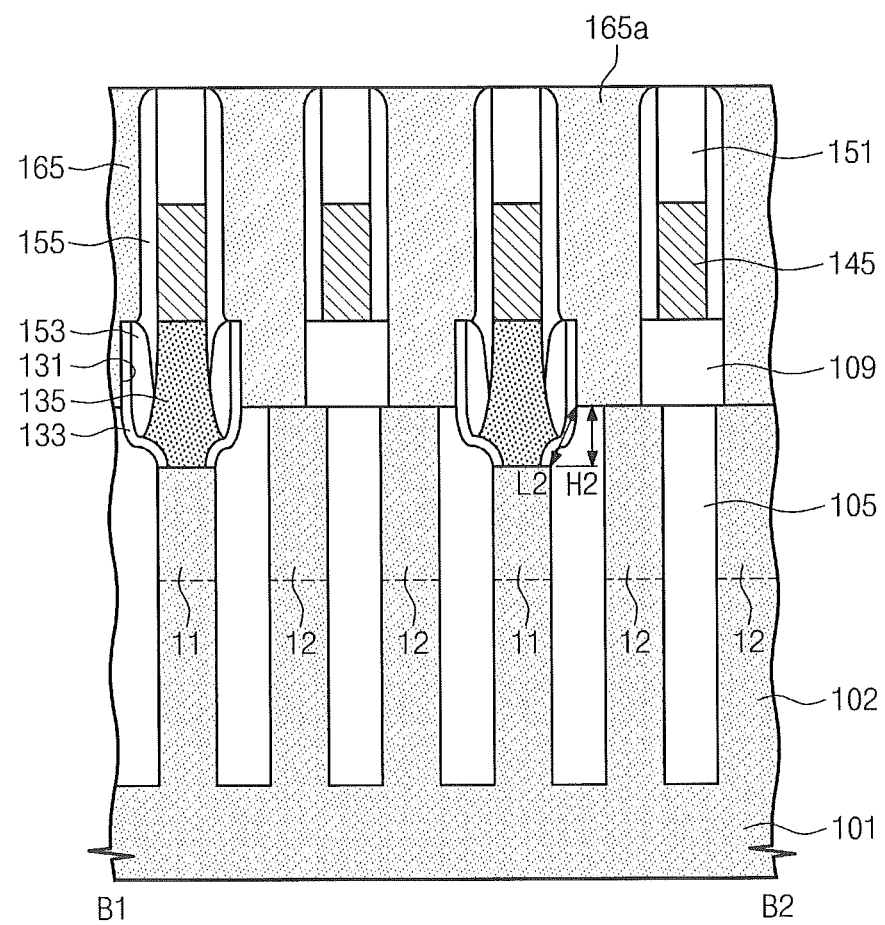
Figure 10D:
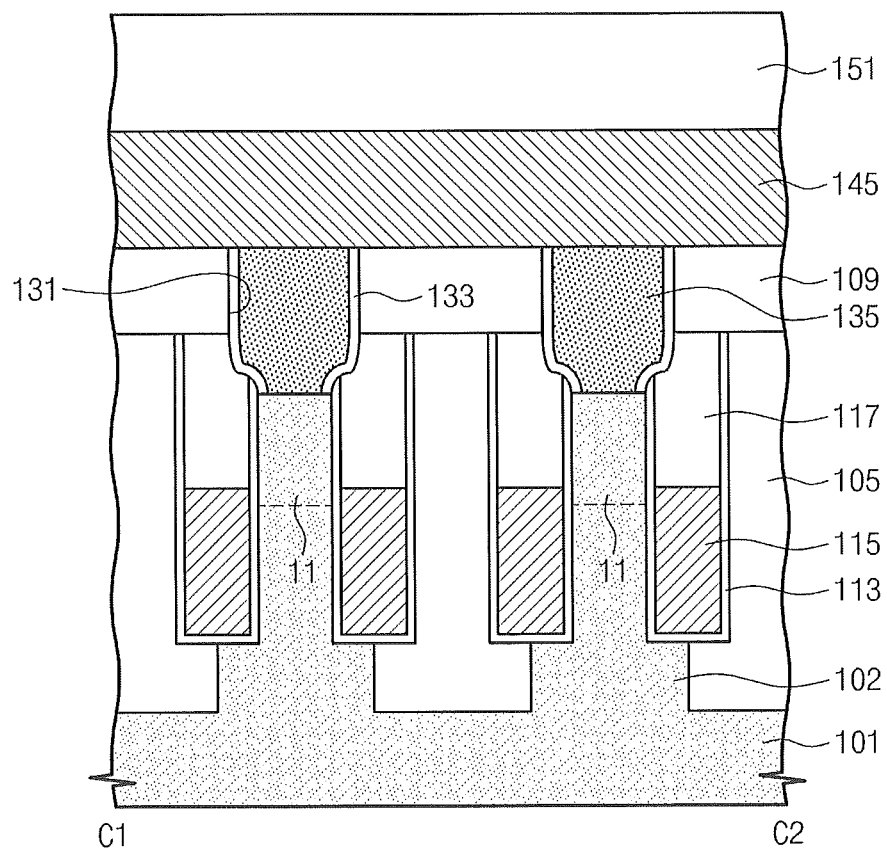

As previously described with reference to FIG. 4C, when viewed in a vertical section passing through the line B1-B2, the central axis 131x of the bit line contact hole 131 may not be coincident with the central axis 102x of the active region 102. Thus, when viewed in the vertical section passing through the line B1-B2 of FIG. 10C, the first junction region 11 may be formed relatively close to one (e.g., a right-hand storage node contact 165a) of the storage node contacts 165 adjacent thereto. In contrast, if the first junction region 11 is not recessed, then a vertical distance H2 between the first junction region 11 and the storage node contact 165 may be reduced. This means that there may be an increased risk of electrical short circuits between the first junction region 11 and the storage node contact 165 (e.g., the right-hand storage node contact 165a). If the device is scaled down, then the distance between the storage node contact 165 and the first junction region 11 is decreased and thus the risk of electrical short circuits between the first junction region 11 and the storage node contact 165 may be further increased. By contrast, according to some example embodiments, as shown in FIG. 5C, top surface 11s of the first junction region 11 may be recessed below the bottom surface 131s of the bit line contact hole 131, thereby increasing the geodesic distance L2 and the vertical distance H2. Accordingly, as shown in FIG. 10C, even when the central axis 131x of the bit line contact hole 131 is not coincident with the central axis 102x of the active region 102 and consequently the first junction region 11 is formed closer to the storage node contact 165, it may be possible to prevent or reduce a risk of electrical short circuits between the first junction region 11 and the storage node contact 165 because the distance therebetween can be increased by the recess of the first junction region 11.

Referring to FIGS. 11A, 11B, 11C, and 11D, capacitors 180 may be formed to be electrically connected to the storage node contacts 165, respectively. In some example embodiments, capacitor lower electrodes 181 may be formed on the substrate 101 to be electrically connected to the storage node contacts 165, respectively. Each of the capacitor lower electrodes 181 may be formed to have, for example, a cylinder shape or a pillar shape. A capacitor dielectric 183 and a capacitor upper electrode 185 may be formed to cover the resulting structure provided with the capacitor lower electrodes 181. In some example embodiments, the capacitor upper electrode 185 may be formed to have a bottom surface facing the capacitor lower electrodes 181 and a substantially flat top surface. After the formation of the capacitor 180, a fourth interlayer insulating layer 191 may be formed to cover the capacitors 180. The capacitor lower electrodes 181 may be in direct contact with the storage node contacts 165, respectively. In some embodiments, the capacitor lower electrodes 181 may not be in direct contact with the storage node contacts 165. For example, if the capacitors 180 are not aligned with the storage node contacts 165 in plan view, then a landing pad 175 may be additionally formed to connect the capacitor lower electrode 181 electrically to the storage node contact 165. In addition, a landing pad insulating layer 171 may be further formed to separate the landing pads 175 electrically from each other. As the result of the afore-described processes, a semiconductor device 1 (e.g., a Dynamic Random Access Memory (DRAM) device) can be fabricated to have improved electrical isolation characteristics between the first junction region 11 and the storage node contact 165.

Figure 12A:
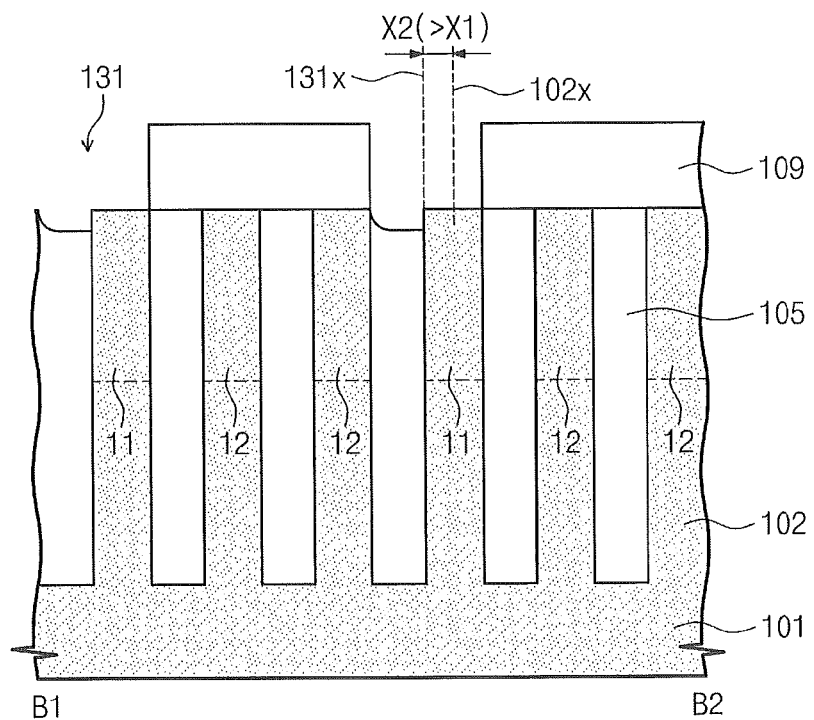
FIGS. 12A, 12B, and 12C are sectional views illustrating a method of fabricating a semiconductor device according to some embodiments.
Figure 12B:
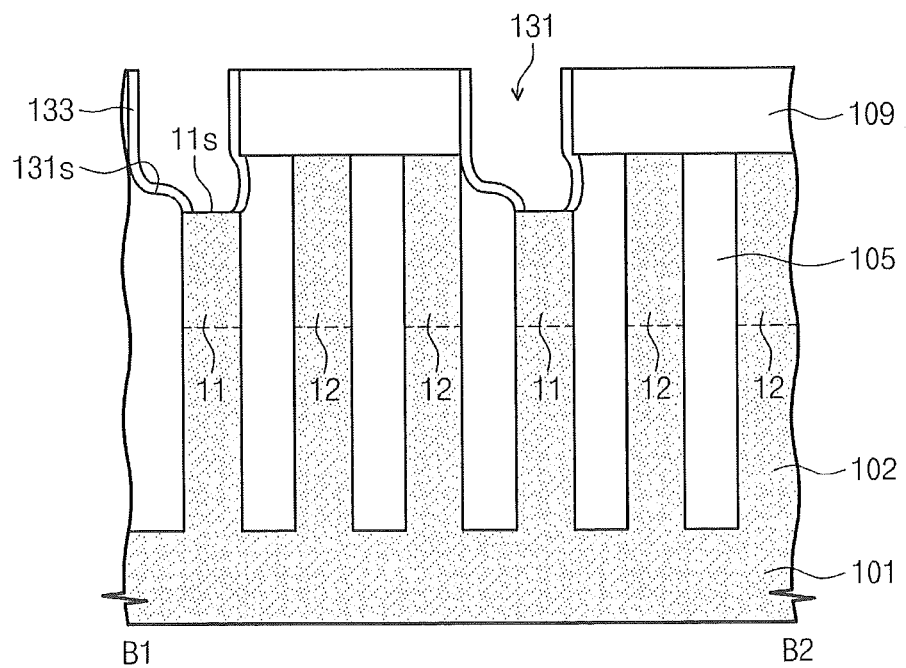
Figure 12C:
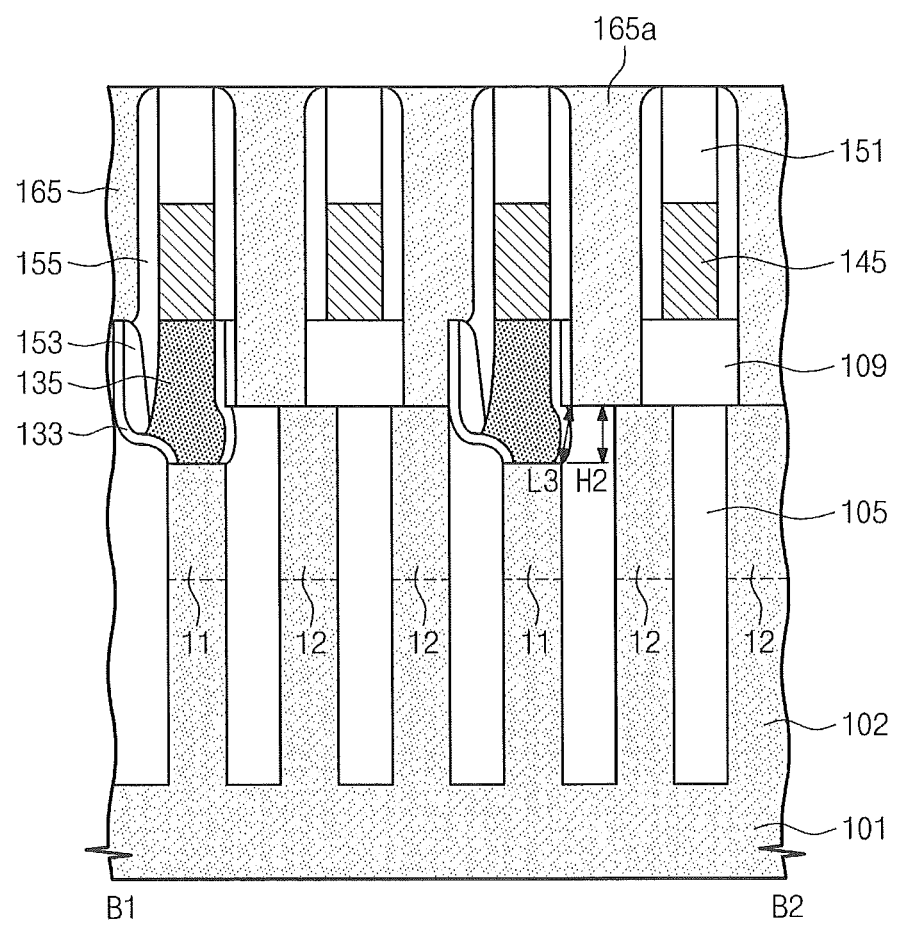

FIGS. 12A, 12B, and 12C are sectional views illustrating a method of fabricating a semiconductor device according to some embodiments. For concise description, previously described elements may be identified by similar or identical reference numbers without repeating overlapping descriptions thereof.

Referring to FIG. 12A, the device isolation layer 105 may be formed on the substrate 101 to define the active regions 102, the word lines 115 may be formed to be buried in the substrate 101, and the first interlayer insulating layer 109 may be formed on the substrate 101. The first interlayer insulating layer 109 may be patterned to form the bit line contact holes 131. As a result of the scaling down of the device or several technical difficulties in a photolithography process, at least one of the bit line contact holes 131 may be misaligned with the corresponding one of the active regions 102. For example, when viewed in the vertical section through the line B1-B2 of FIG. 4A, the central axis 131x of the bit line contact hole 131 may be misaligned with the central axis 102x of the active region 102 by the second distance X2 that is greater than the first distance X1.

Referring to FIG. 12B, the active regions 102 exposed by the bit line contact holes 131 may be etched. As a result of the etching of the active regions 102, the top surface 11s of the first junction region 11 may be recessed below the bottom surface 131s of the bit line contact hole 131, and thus the bit line contact holes 131 may be expanded. Thereafter, the insulating spacers 133 may be formed on the inner sidewalls of the bit line contact holes 131. During the expanding of the bit line contact holes 131, the device isolation layer 105 may be recessed and thus the bit line contact holes 131 may be expanded toward the device isolation layer 105. The second junction regions 12 may be exposed during the process of forming or expanding the bit line contact holes 131. In this case, the insulating spacers 133 may be formed to cover the exposed portions of the second junction regions 12. In some embodiments, however, the formation of the insulating spacers 133 may be omitted.

Figure 11A:
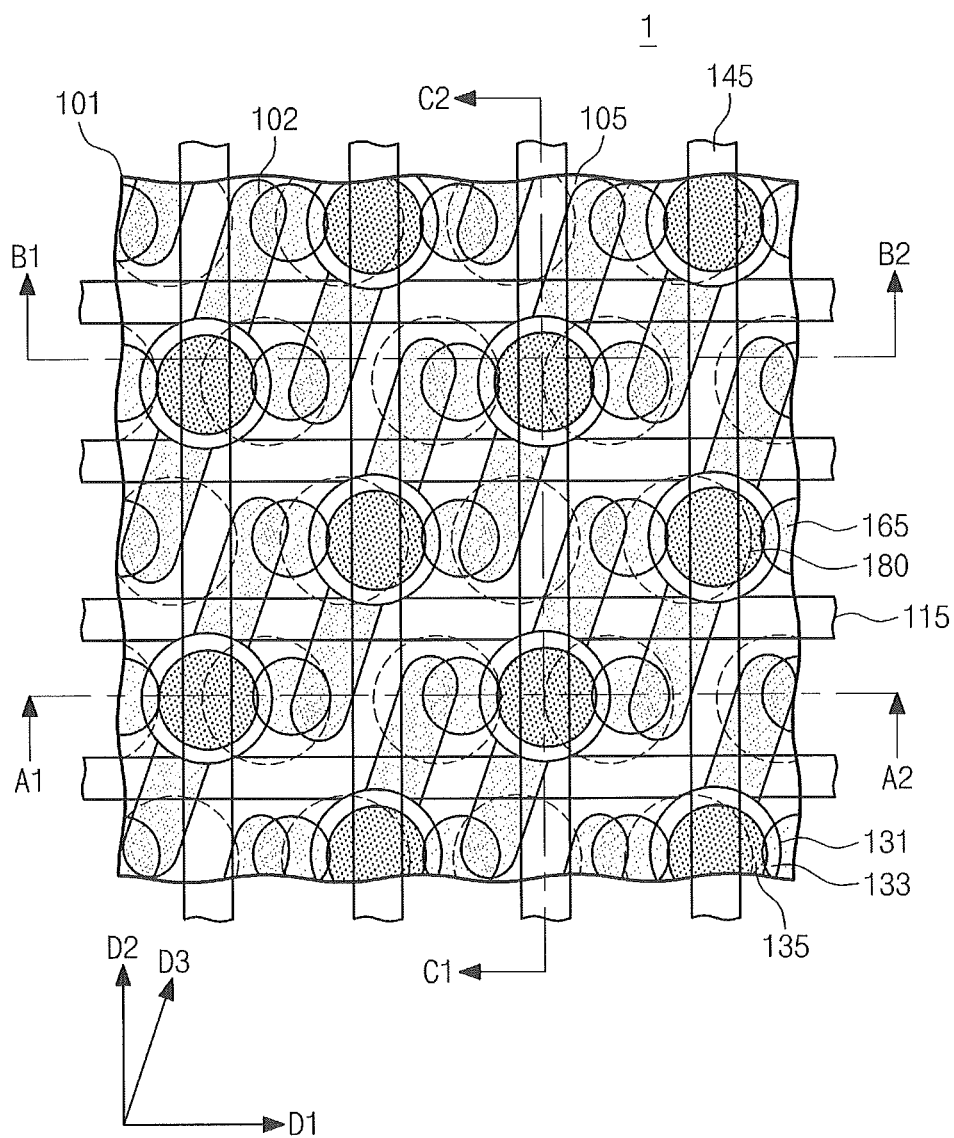
Figure 11B:
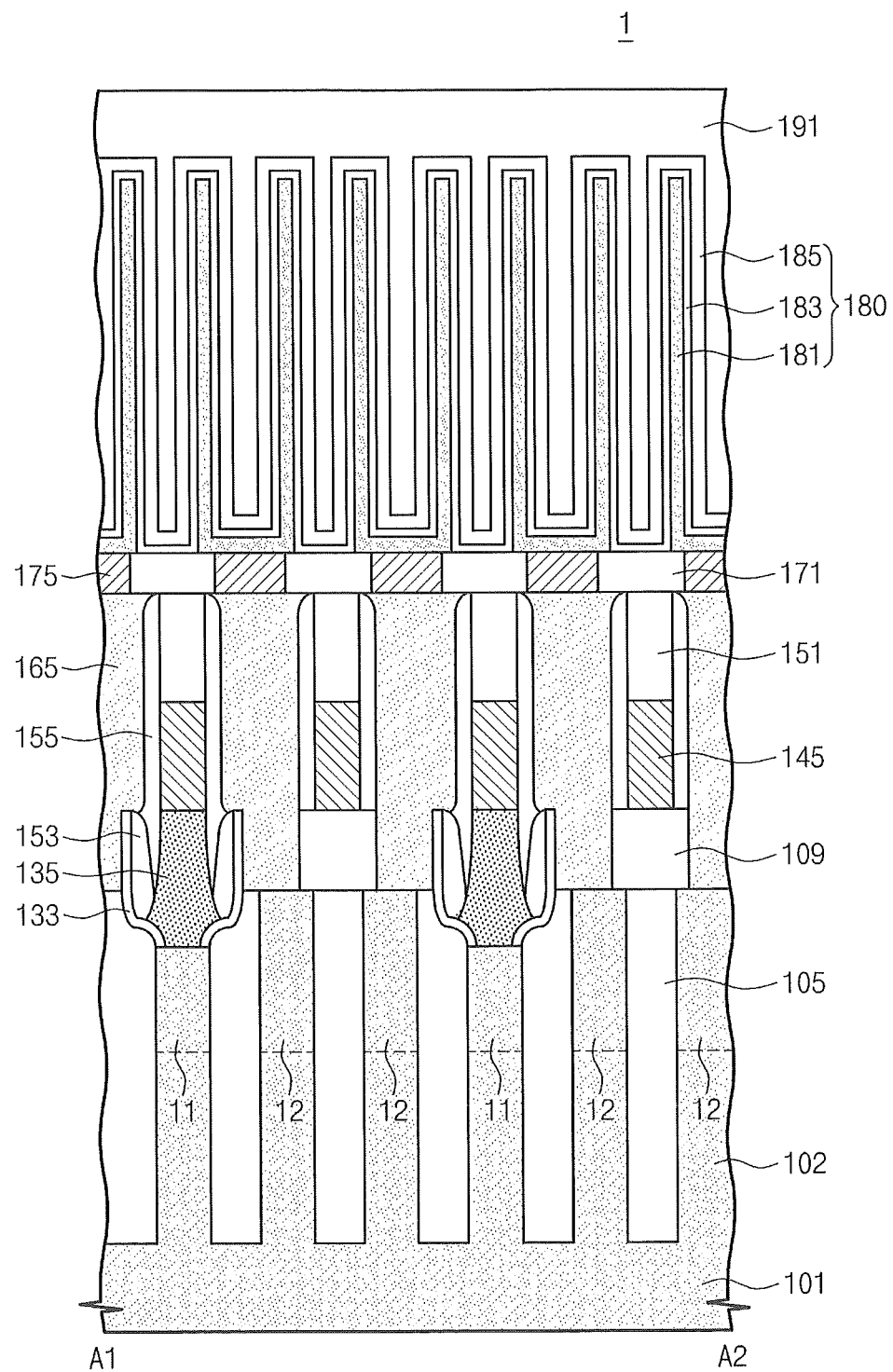
Figure 11C:
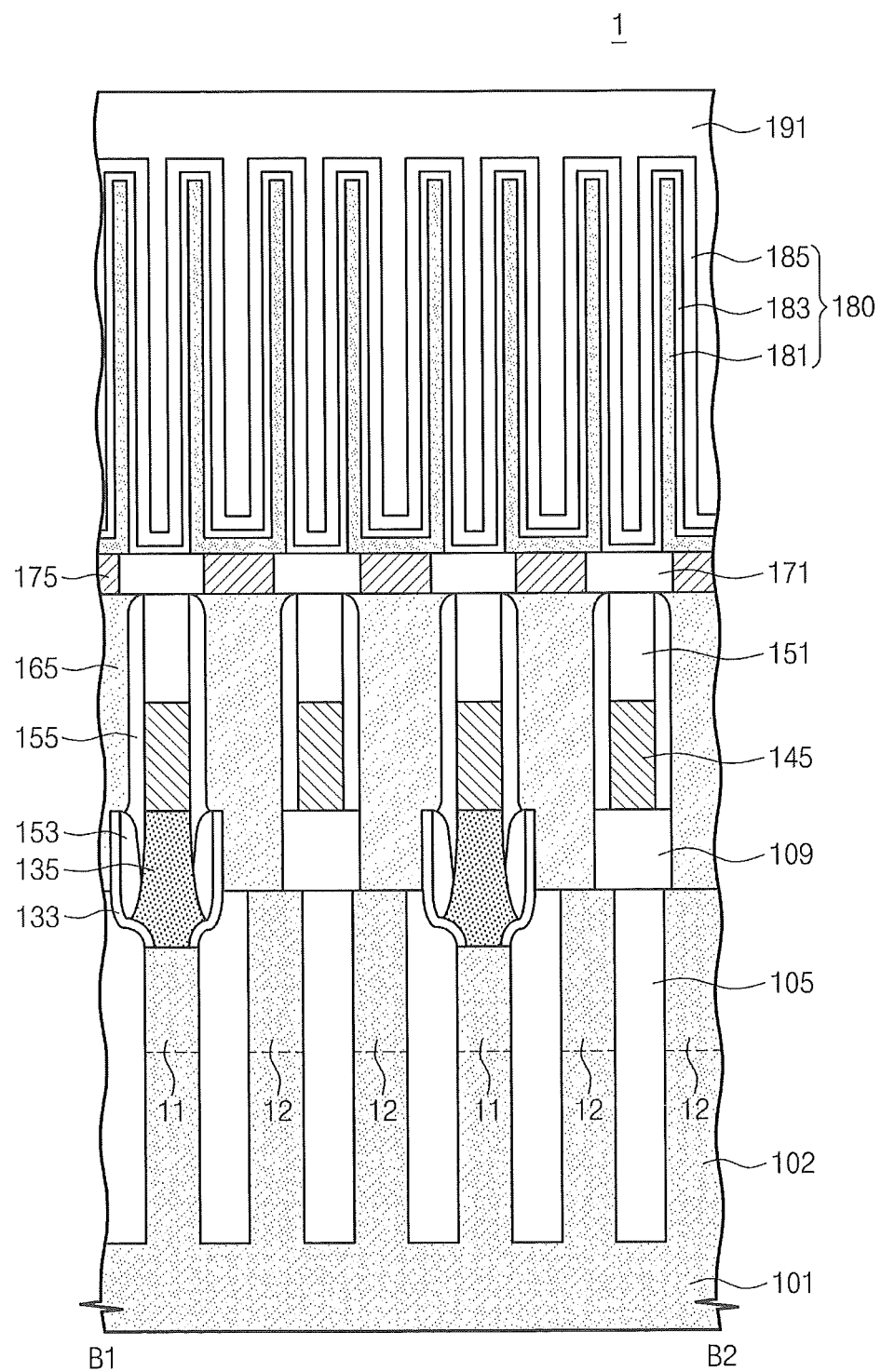
Figure 11D:
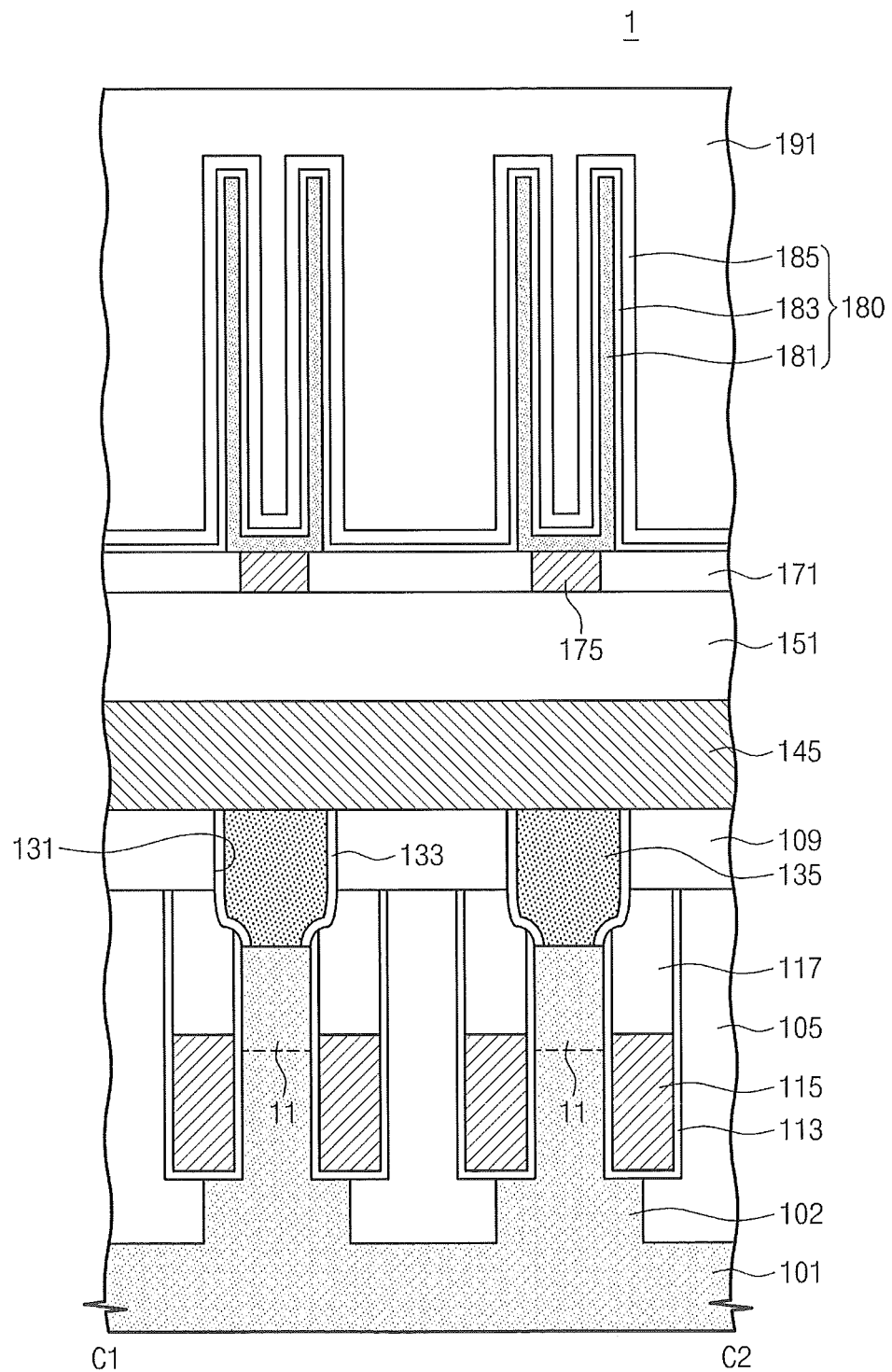

Referring to FIG. 12C, the bit line contacts 135 may be formed to be electrically connected to the first junction regions 11, respectively, and the storage node contacts 165 may be formed to be electrically connected to the second junction regions 12, respectively. In addition, the bit lines 145 may be formed to connect the bit line contacts 135 electrically to each other. As described previously with reference to FIG. 12A, when viewed in the vertical section taken along the line B1-B2, the central axis 131x of the bit line contact hole 131 may not be coincident with the central axis 102x of the active region 102. Accordingly, when viewed in the vertical section taken along the line B1-B2, the first junction region 11 may be formed relatively close to one (e.g., the right-hand storage node contact 165a) of the storage node contacts 165 adjacent thereto. Accordingly, a geodesic (e.g., shortest) distance L3 between the first junction region 11 and the right-hand storage node contact 165a may be smaller than the shortest/rectilinear distance L2 of FIG. 10C. This means that there may be an increasing risk of electrical short circuits between the first junction region 11 and the right-hand storage node contact 165a. By contrast, according to some embodiments described herein, however, the first junction region 11 may be recessed, and thus, the vertical and rectilinear/shortest distances H2 and L3 between the first junction region 11 and the storage node contact 165 can be increased. Accordingly, it may be possible to realize improved electrical isolation characteristics between the first junction region 11 and the storage node contact 165. Due to the presence of the insulating spacers 133, it may be possible to improve electrical isolation characteristics, in the vertical direction, between the first junction region 11 and the storage node contact 165. In addition, the insulating spacers 133 may enable improved electrical isolation characteristics, in the horizontal direction, between the bit line contact 135 and the storage node contact 165. As shown in FIG. 11C, the formation of the semiconductor device 1 may further include forming the capacitors 180 electrically connected to the storage node contacts 165.

Figure 13A:
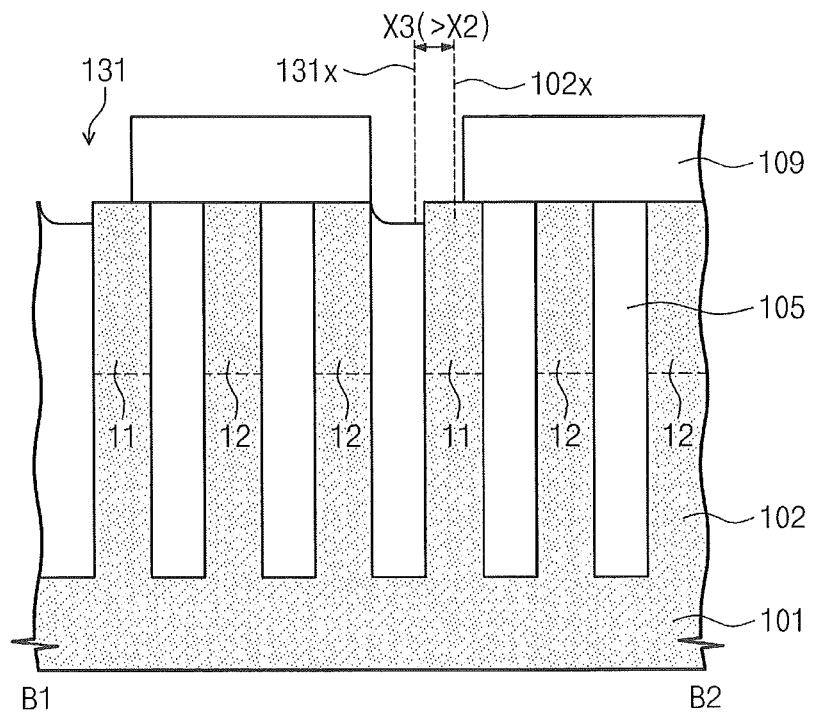
FIGS. 13A, 13B, and 13C are sectional views illustrating a method of fabricating a semiconductor device according to some embodiments.
Figure 13B:
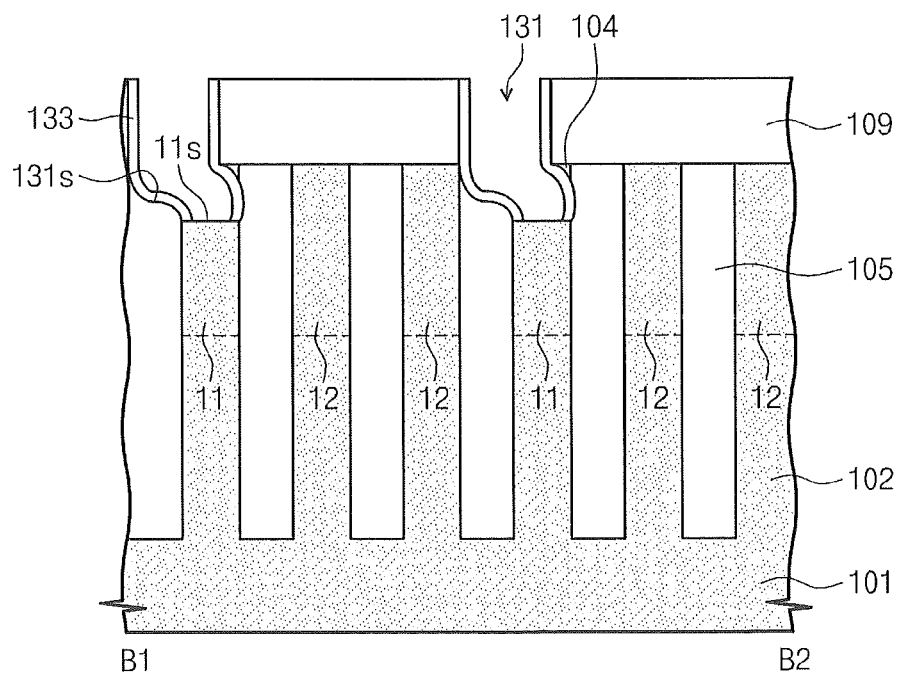
Figure 13C:
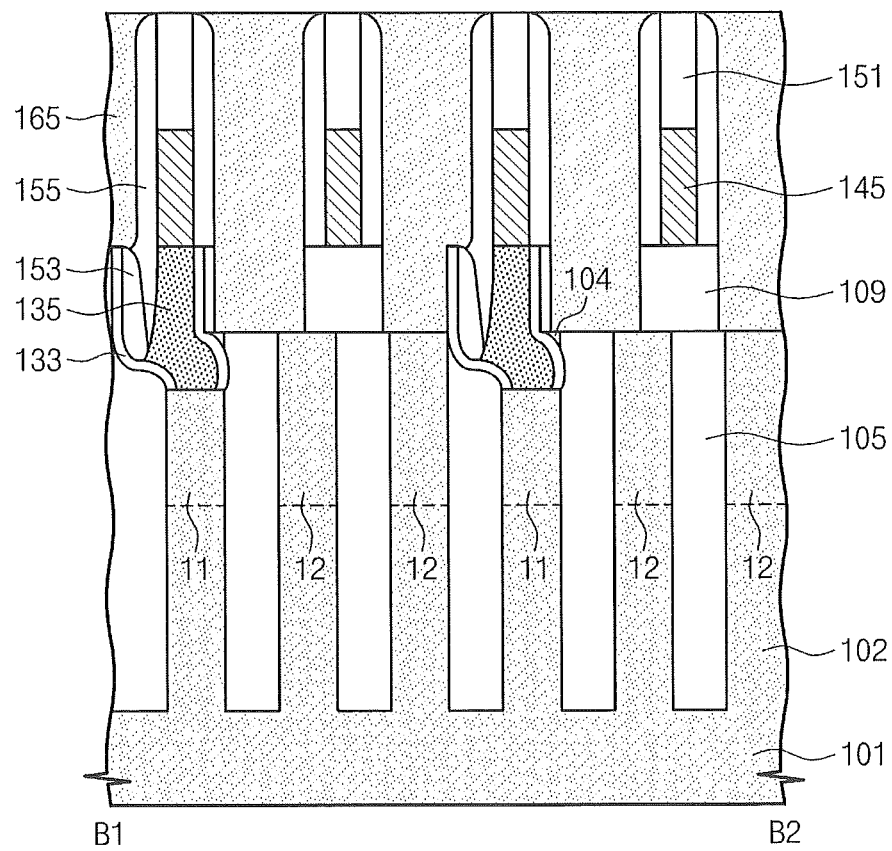
Figure 14A:
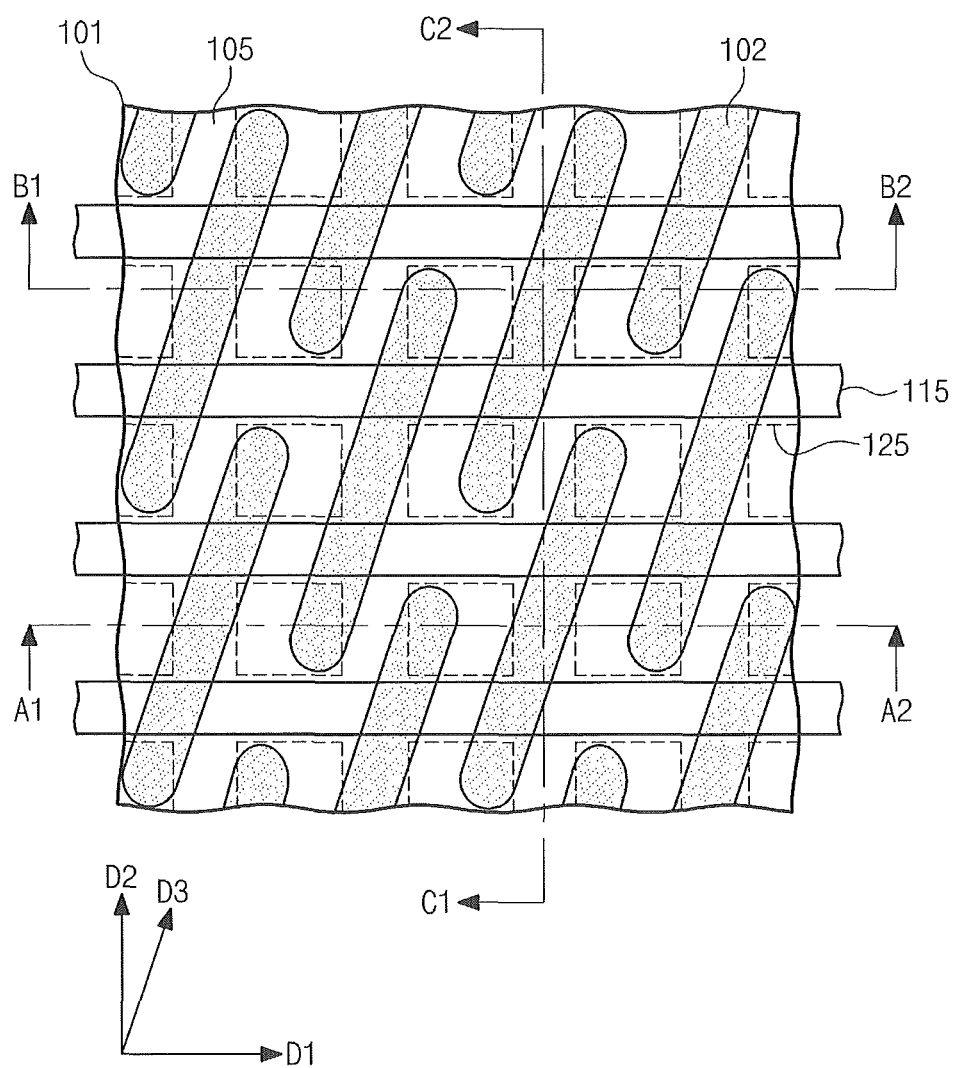
FIGS. 14A, 15A, 16A, 17A, 18A, 19A, and 20A are plan views illustrating methods of fabricating a semiconductor device according to various embodiments of the present inventive concepts.
Figure 14B:
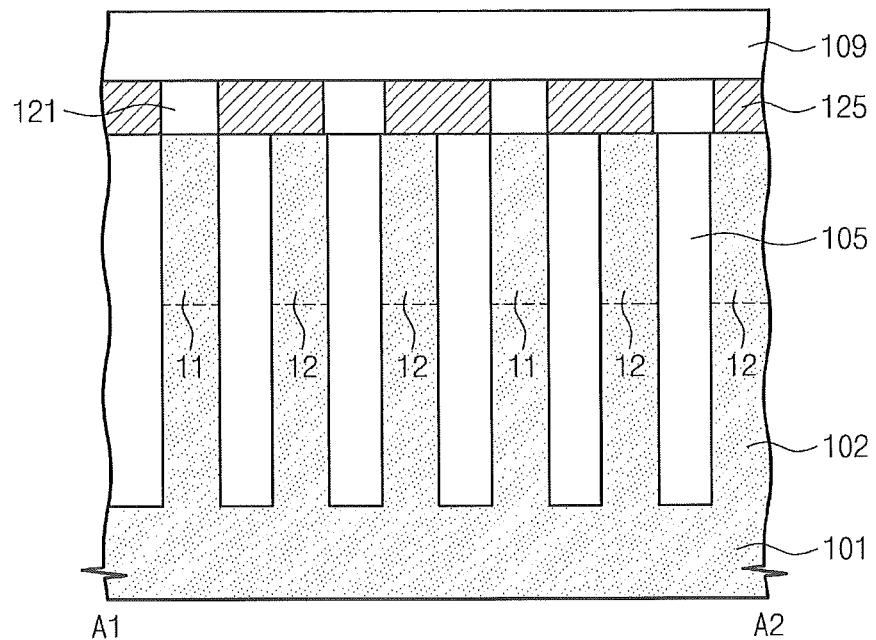
FIGS. 14B, 15B, 16B, 17B, 18B, 19B, and 20B are sectional views taken along line A1-A2 of FIGS. 14A, 15A, 16A, 17A, 18A, 19A, and 20A, respectively.
Figure 14C:
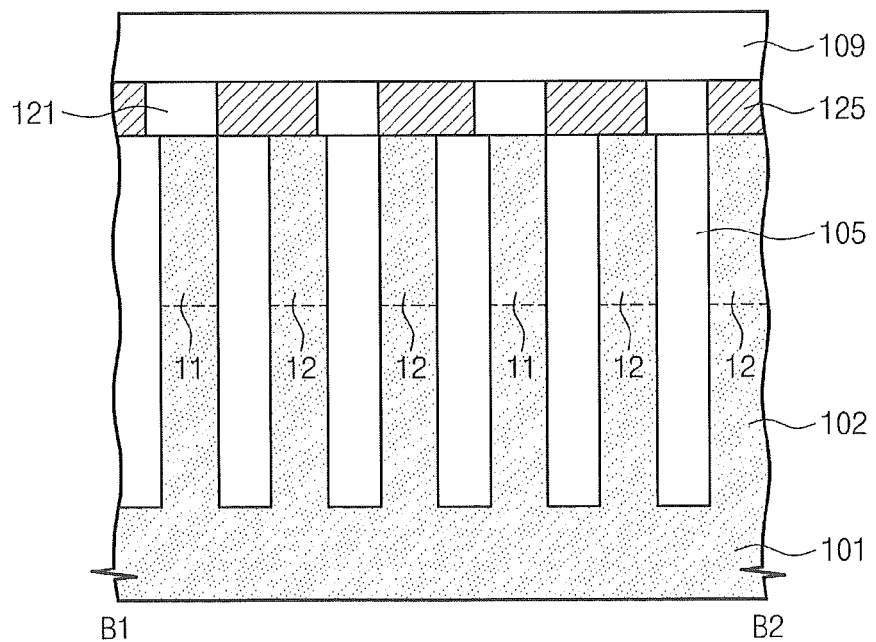
FIGS. 14C, 15C, 16C, 17C, 18C, 19C, and 20C are sectional views taken along line B1-B2 of FIGS. 14A, 15A, 16A, 17A, 18A, 19A, and 20A, respectively.
Figure 14D:
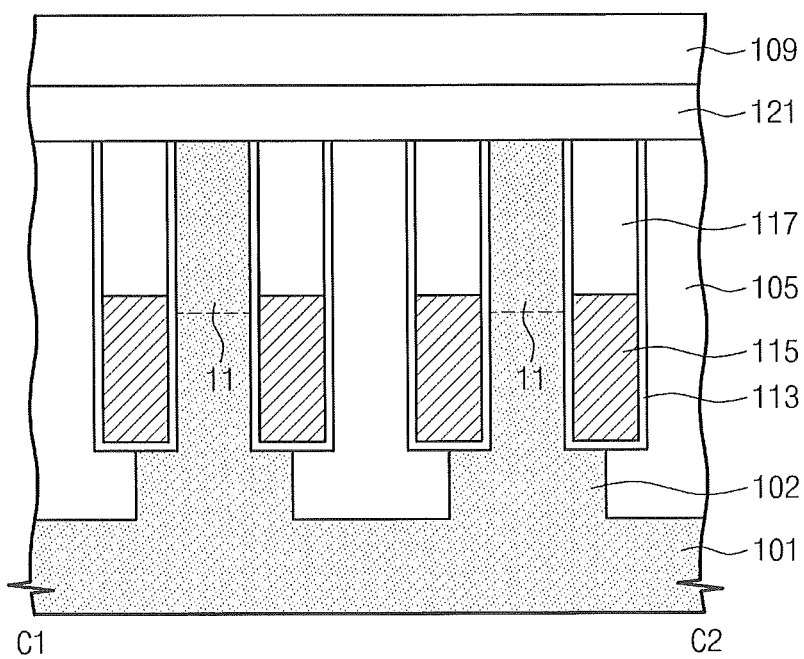
FIGS. 14D, 15D, 16D, 17D, 18D, 19D, and 20D are sectional views taken along line C1-C2 of FIGS. 14A, 15A, 16A, 17A, 18A, 19A, and 20A, respectively.

FIGS. 13A, 13B, and 13C are sectional views illustrating a method of fabricating a semiconductor device according to some embodiments. For concise description, previously described elements may be identified by similar or identical reference numbers without repeating overlapping descriptions thereof.

Referring to FIG. 13A, when viewed in the vertical section through the line B1-B2 of FIG. 4A, the central axis 131x of the bit line contact hole 131 may be misaligned with the central axis 102x of the active region 102 by a third distance X3 that is greater than the second distance X2. In this case, a portion of the first junction region 11 may be exposed by the bit line contact hole 131, and other portion thereof may be covered with the first interlayer insulating layer 109. In other words, when viewed in the vertical section through the line B1-B2, the bit line contact hole 131 may be formed not to expose wholly the first junction region 11 of the active region 102.

Referring to FIG. 13B, the active regions 102 exposed by the bit line contact holes 131 may be selectively etched. As a result of the etching of the active regions 102, the top surface 11s of the first junction region 11 may be recessed below the bottom surface 131s of the bit line contact hole 131, and thus the bit line contact holes 131 may be expanded. Thereafter, the insulating spacers 133 may be formed on the inner sidewalls of the bit line contact holes 131. In some example embodiments, a residue 104 of the active region 102 may remain below the first interlayer insulating layer 109. The residue 104 may be covered with the insulating spacer 133. In some embodiments, the residue 104 may not remain.

Referring to FIG. 13C, the bit line contacts 135 may be formed to be electrically connected to the first junction regions 11, respectively, and the storage node contacts 165 may be formed to be electrically connected to the second junction regions 12, respectively. In addition, the bit lines 145 may be formed to connect the bit line contacts 135 electrically to each other. Because the residue 104 may be covered with the insulating spacer 133, there may be little/no chance that electrical short circuits may occur between the first junction region 11 and the storage node contact 165 and/or between the bit line contact 135 and the storage node contact 165. As shown in FIG. 11C, the formation of the semiconductor device 1 may further include forming the capacitors 180 electrically connected to the storage node contacts 165.

FIGS. 14A, 15A, 16A, 17A, 18A, 19A, and 20A are plan views illustrating a method of fabricating a semiconductor device according to some embodiments. FIGS. 14B, 15B, 16B, 17B, 18B, 19B, and 20B are sectional views taken along line A1-A2 of FIGS. 14A, 15A, 16A, 17A, 18A, 19A, and 20A, respectively. FIGS. 14C, 15C, 16C, 17C, 18C, 19C, and 20C are sectional views taken along line B1-B2 of FIGS. 14A, 15A, 16A, 17A, 18A, 19A, and 20A, respectively. FIGS. 14D, 15D, 16D, 17D, 18D, 19D, and 20D are sectional views taken along line C1-C2 of FIGS. 14A, 15A, 16A, 17A, 18A, 19A, and 20A, respectively.

Referring to FIGS. 14A, 14B, 14C, and 14D, the device isolation layer 105 may be formed on the substrate 101 to define the island-shaped the active regions 102 elongated along the third direction D3, and then impurities may be injected into the active regions 102 to form the first and second junction regions 11 and 12 that have a different conductivity type (e.g., N-type) from that (e.g., P-type) of the substrate 101. The word lines 115 may be formed in the substrate 101 to extend along the first direction D1. The word line capping layer 117 may be formed to cover the word lines 115. The gate insulating layer 113 may be formed to cover bottom and side surfaces of the word lines 115. Contact pads 125 may be formed on the substrate 101 by an epitaxial process or by a process of depositing and patterning a conductive material, and thereafter a contact pad insulating layer 121 may be formed to separate the contact pads 125 electrically from each other. The contact pads 125 may be formed to be in contact with the second junction regions 12, respectively. Alternatively, the contact pads 125 may be formed to be in contact with both of the first and second junction regions 11 and 12. Next, an insulating material may be deposited on the substrate 101 to form the first interlayer insulating layer 109.

Figure 15A:
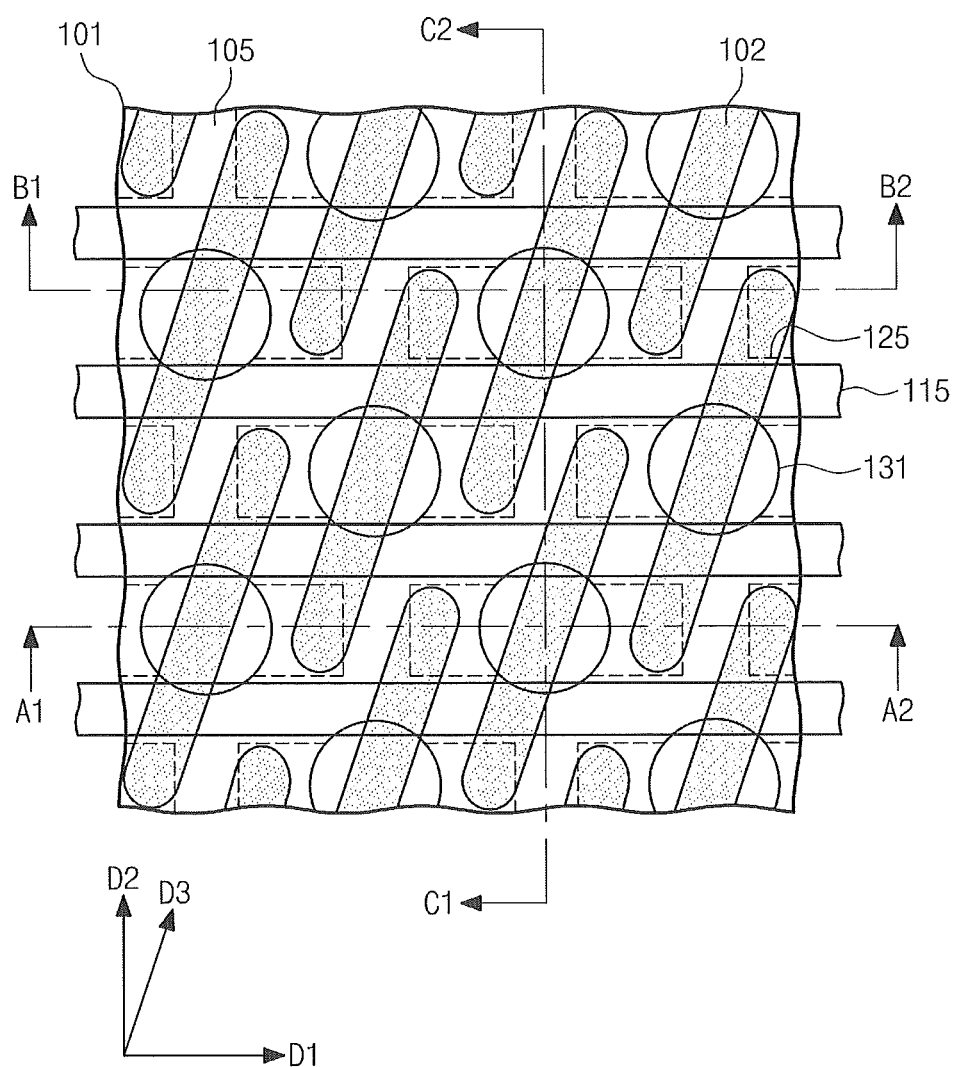
Figure 15B:
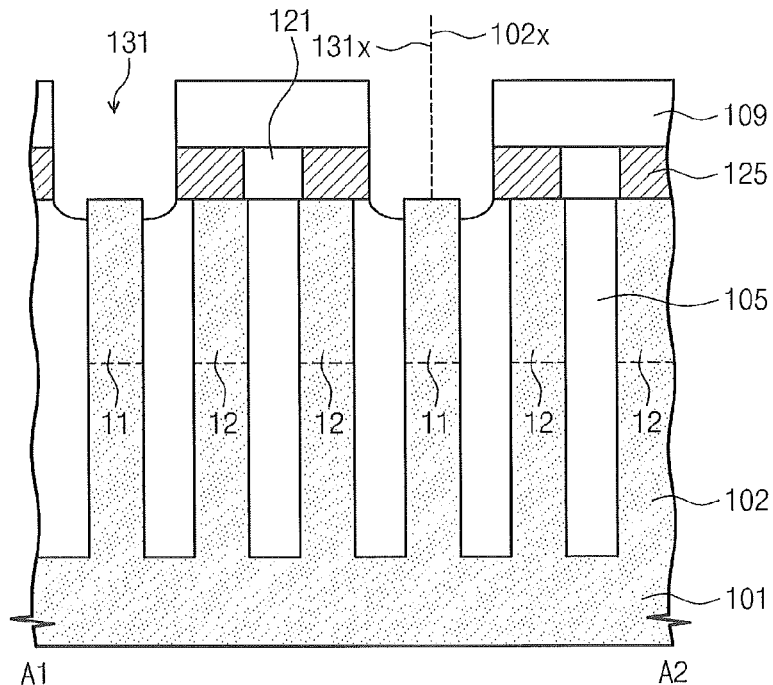
Figure 15C:
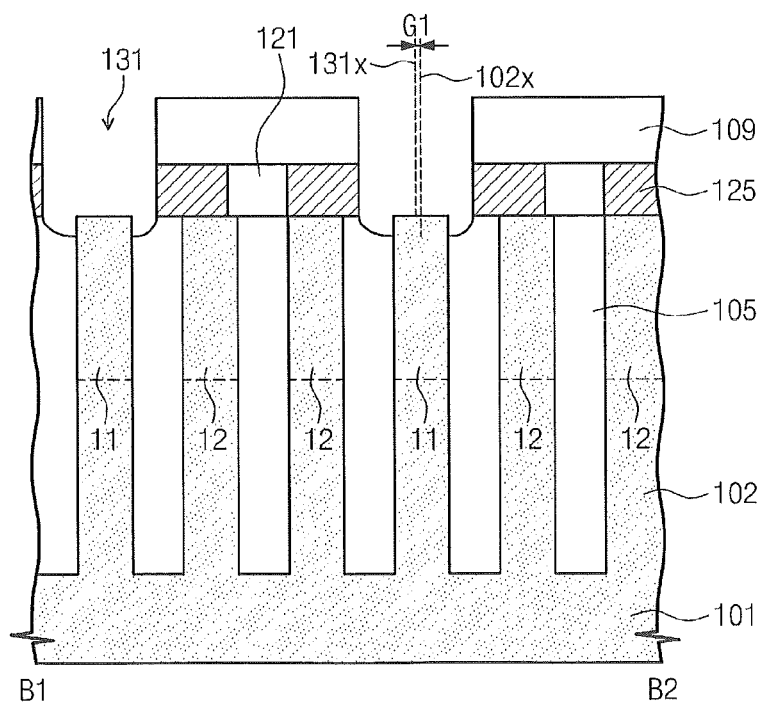
Figure 15D:
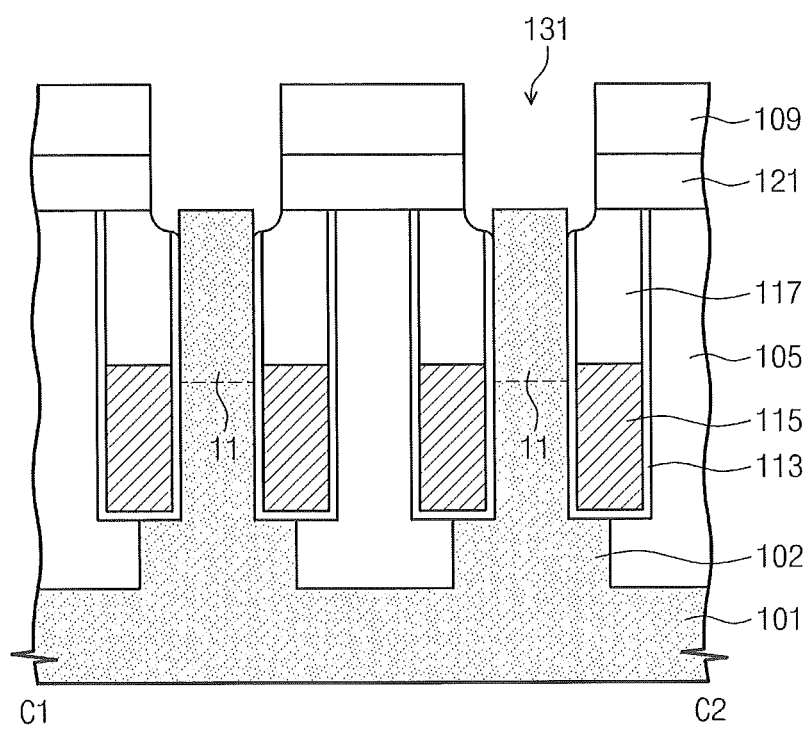
Figure 16A:
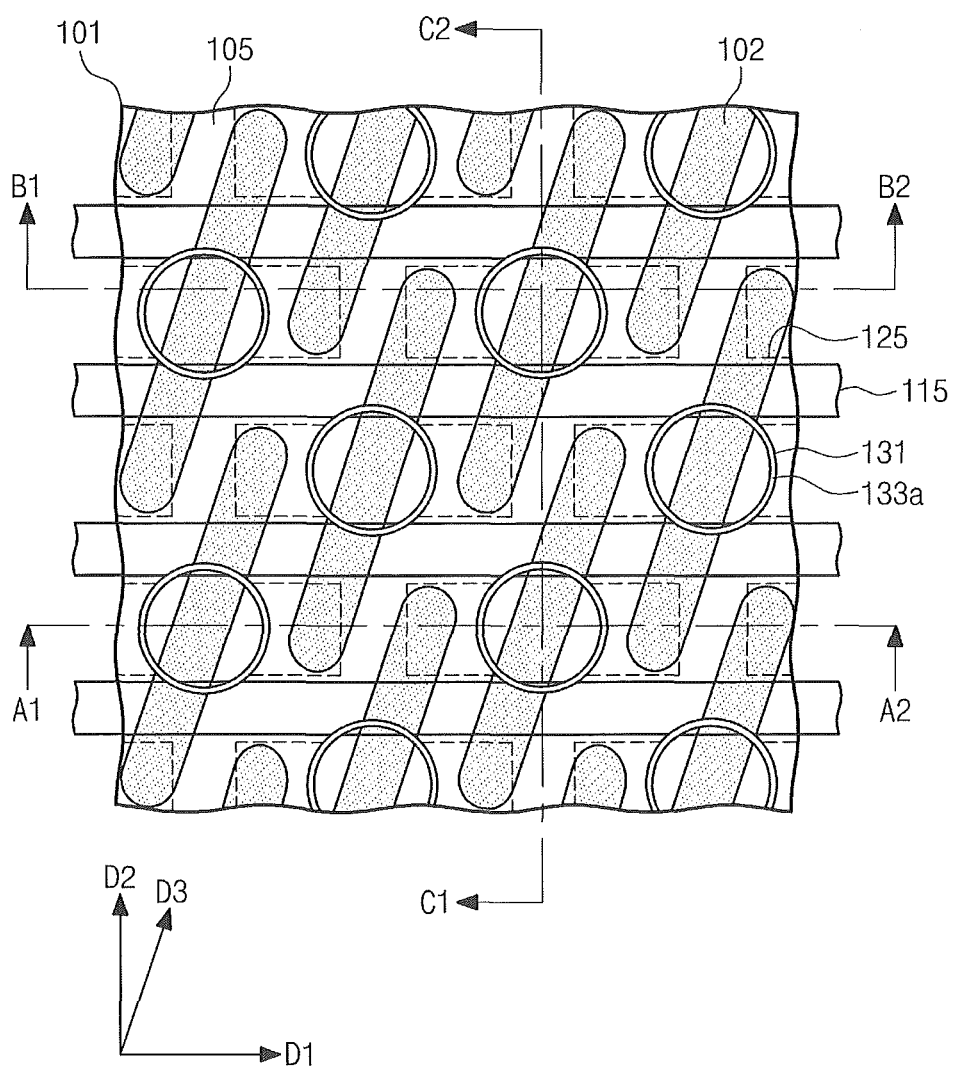
Figure 16B:
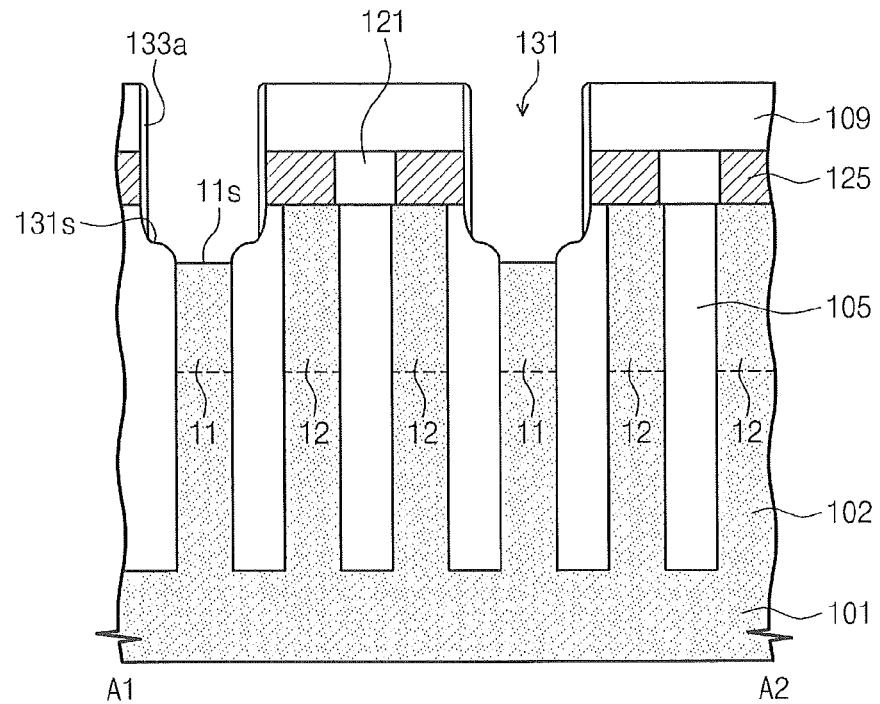
Figure 16C:
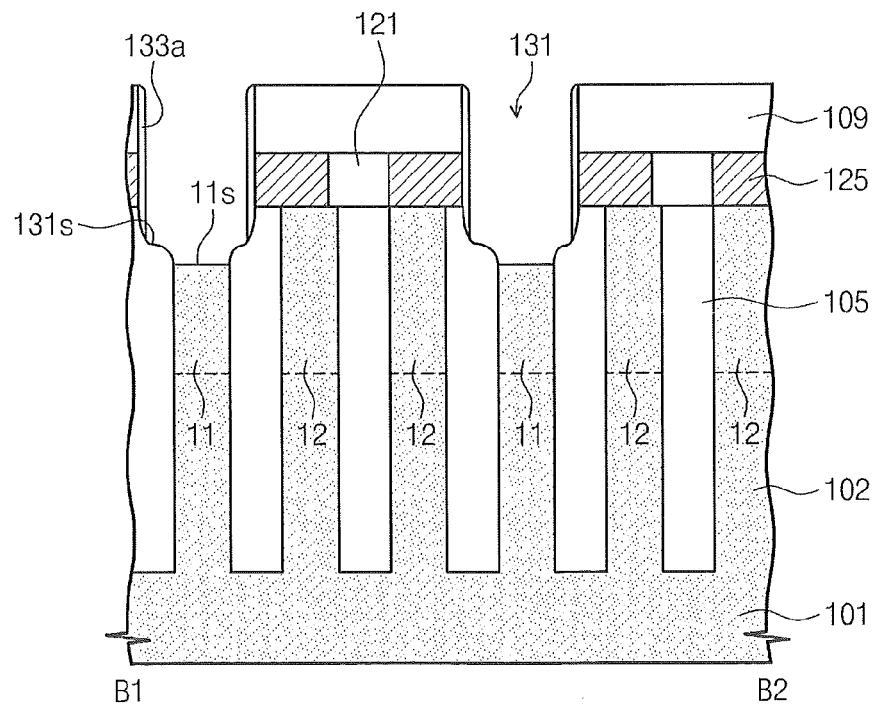
Figure 16D:
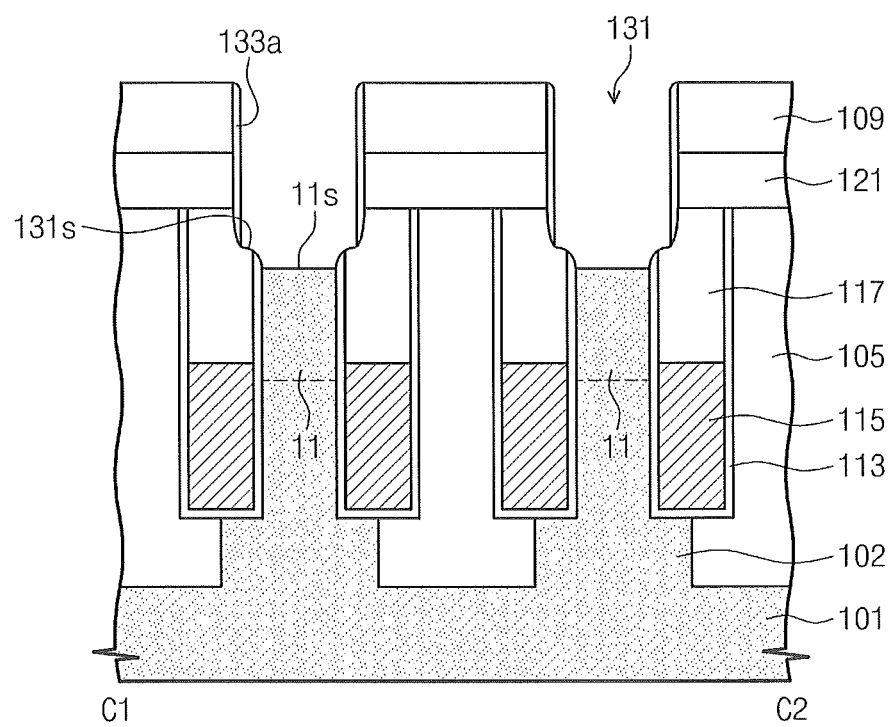
Figure 17A:
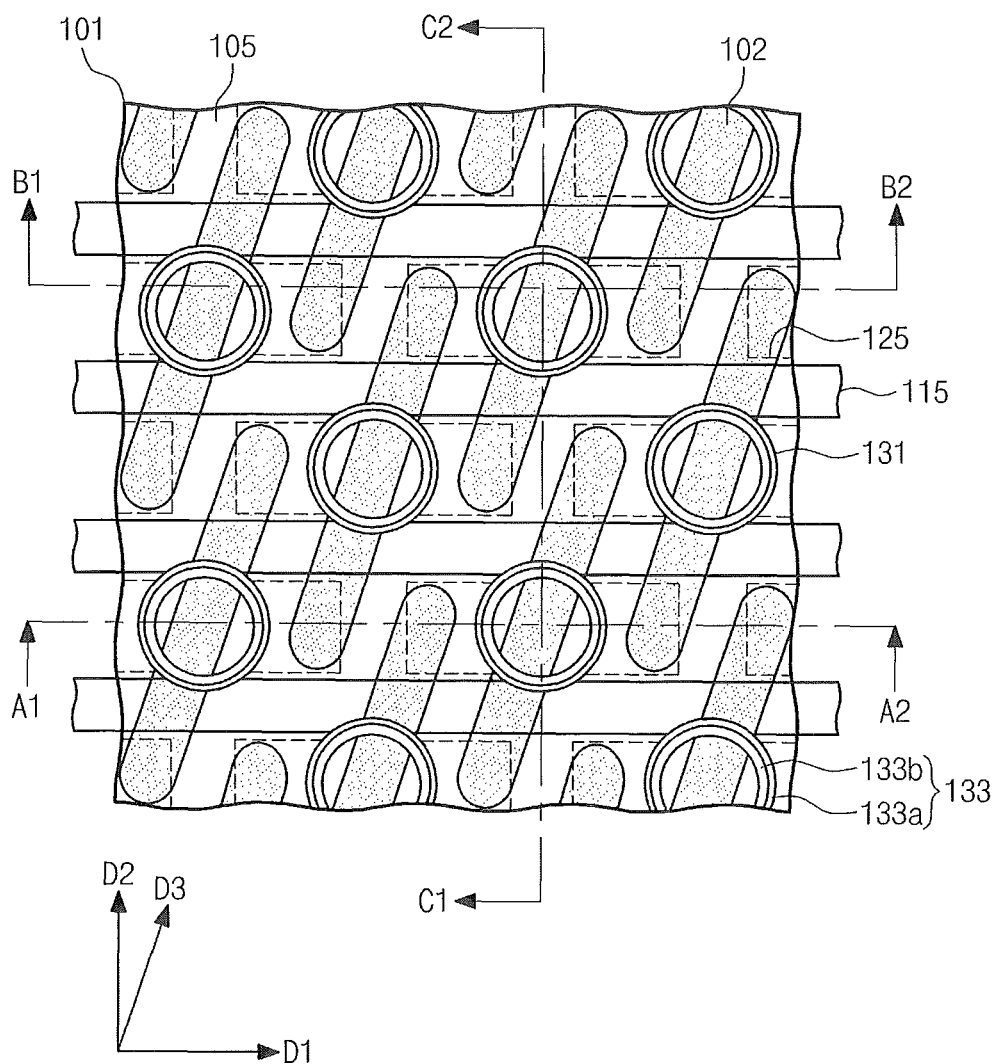
Figure 17B:
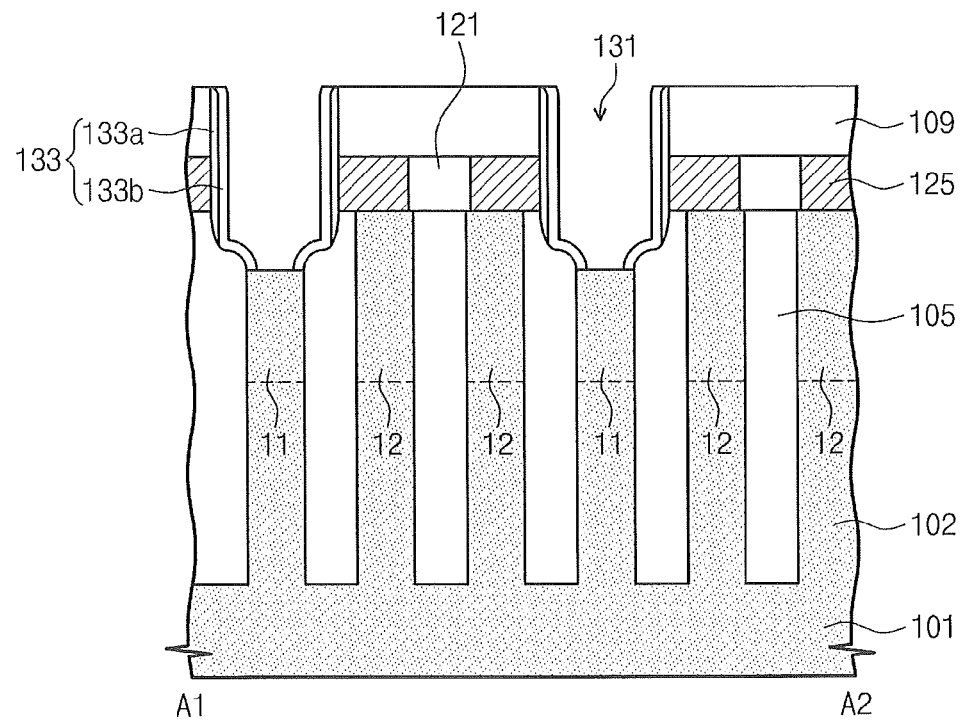
Figure 17C:
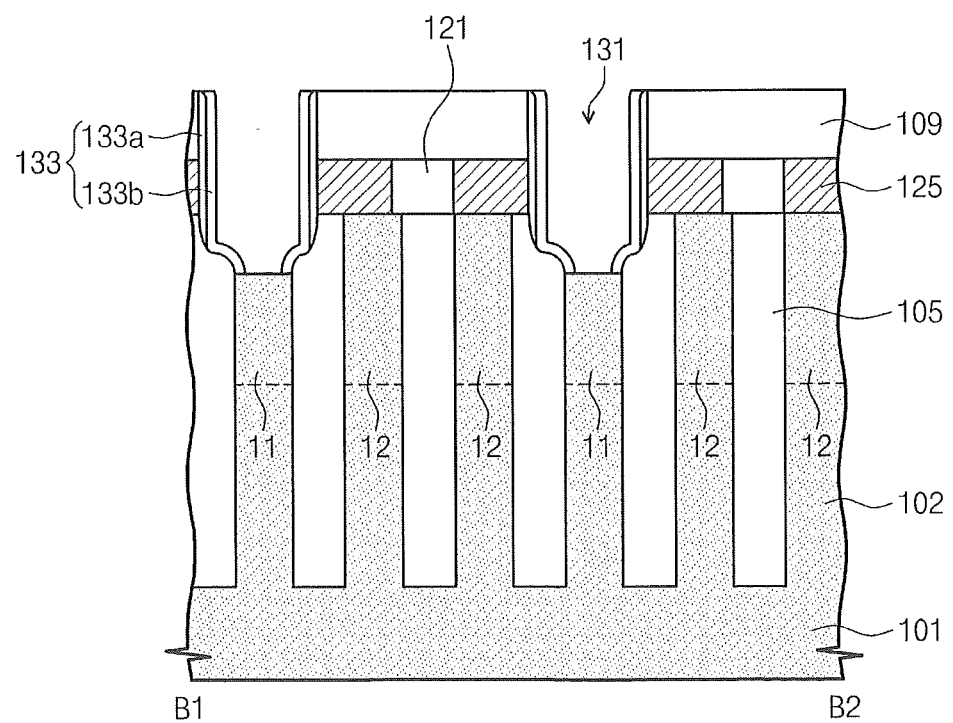
Figure 17D:
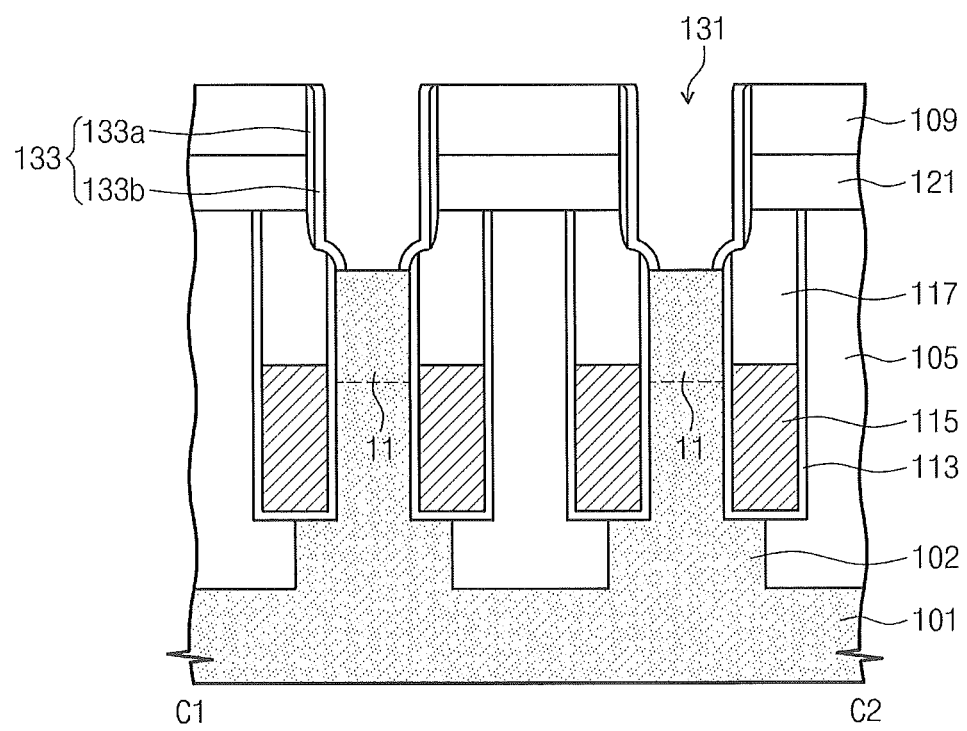
Figure 18A:
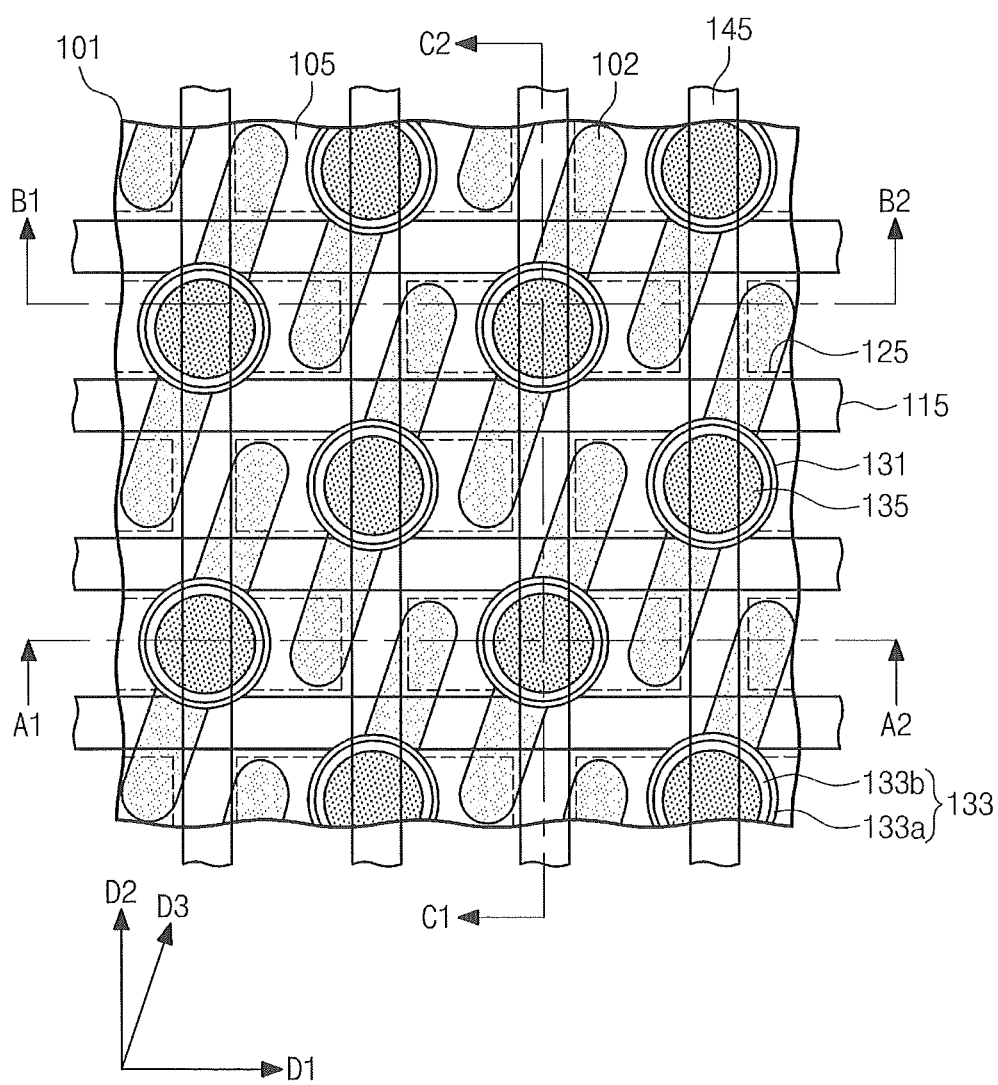
Figure 18B:
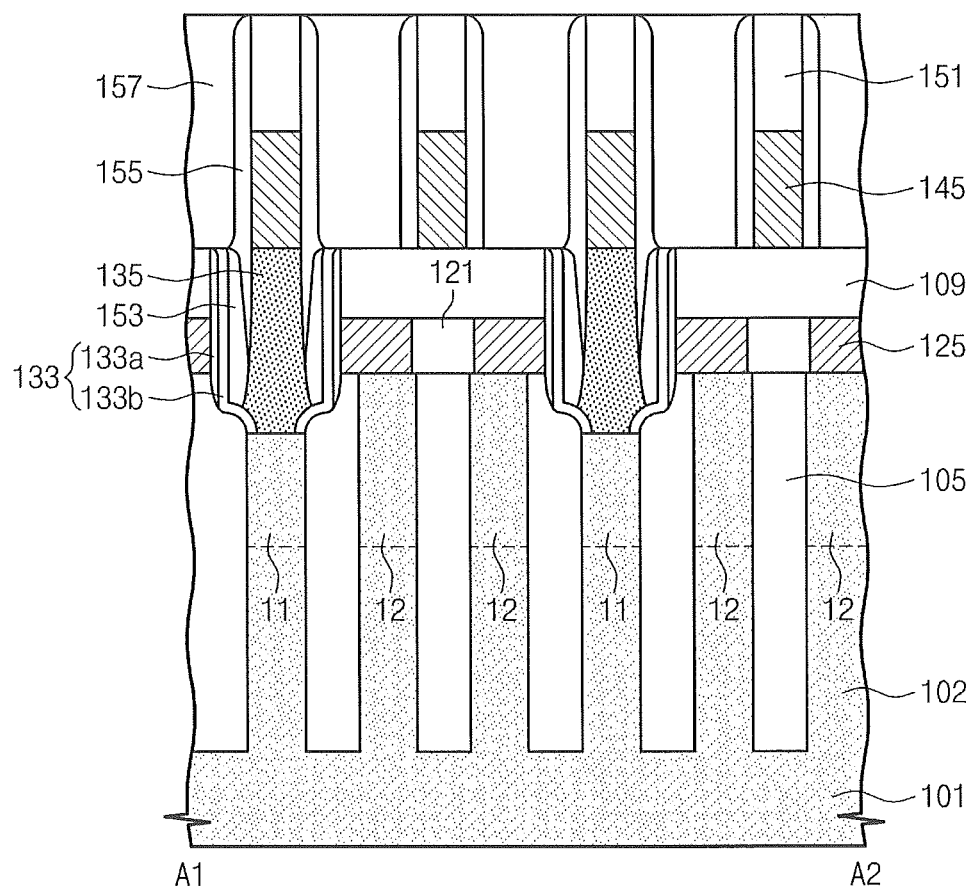
Figure 18C:
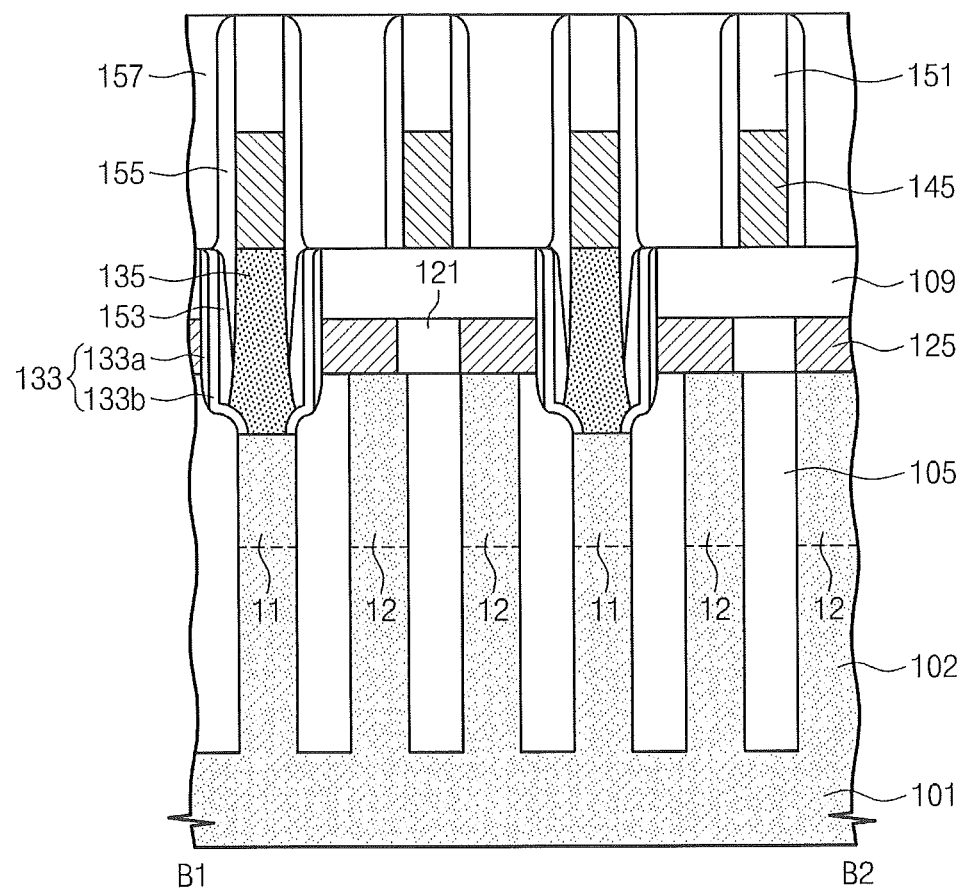
Figure 18D:
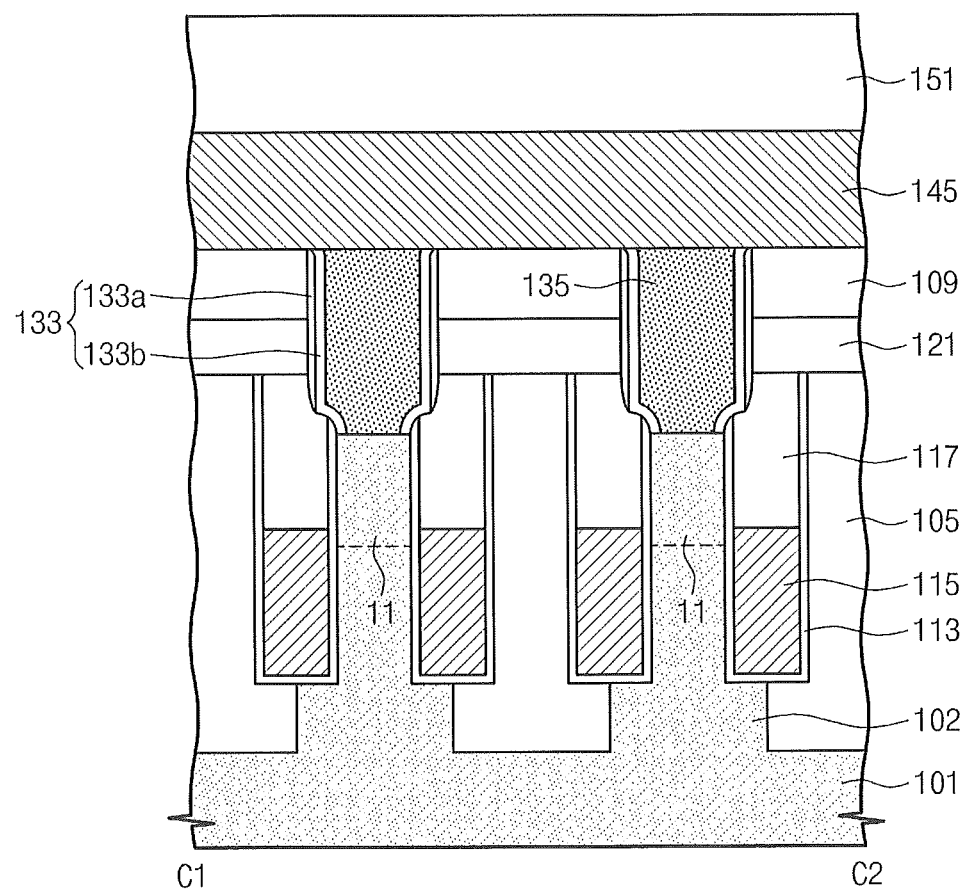

Referring to FIGS. 15A, 15B, 15C, and 15D, the first interlayer insulating layer 109 and the contact pad insulating layer 121 may be patterned to form the bit line contact holes 131 exposing the first junction regions 11, respectively. During the formation of the bit line contact holes 131, the device isolation layer 105, the gate insulating layer 113, and/or the word line capping layer 117 may be recessed. The contact pads 125 may be further patterned in such a way that they are in contact with the second junction regions 12, respectively, and are spaced apart from the first junction regions 11. As a result of the patterning of the contact pads 125, it may be possible to protect/prevent the first junction region 11 from being electrically connected to the second junction region 12. According to some embodiments, as shown in FIG. 15B, when viewed in the section taken along the line A1-A2, the central axis 131x of the bit line contact hole 131 may be substantially coincident with the central axis 102x of the active region 102. In addition, as shown in FIG. 15C, when viewed in the section taken along the line B1-B2, because the active region 102 extends along the third direction D3, the central axis 131x of the bit line contact hole 131 may be misaligned with the central axis 102x of the active region 102 by a first distance G1.

Referring to FIGS. 16A, 16B, 16C, and 16D, first insulating spacers 133a may be formed to cover the inner sidewalls of the bit line contact holes 131. The active regions 102 (e.g., the first junction regions 11) exposed by the bit line contact holes 131 may be selectively etched to expand the bit line contact holes 131. The formation of the first insulating spacers 133a may include depositing a silicon oxide layer or a silicon nitride layer and performing a spacer-forming process including an anisotropic etching step. Due to the presence of the first insulating spacers 133a, it may be possible to protect/prevent the contact pads 125 from being damaged when the first junction regions 11 are etched. As a result of the selective etching of the first junction regions 11, the first junction regions 11 may be recessed to have the top surfaces 11s that are lower than the bottom surface 131s of the bit line contact holes 131.

Referring to FIGS. 17A, 17B, 17C, and 17D, second insulating spacers 133b may be formed in the bit line contact holes 131. The second insulating spacers 133b may be formed by depositing an insulating material and then performing a spacer-forming process including an anisotropic etching step. In some example embodiments, the second insulating spacers 133b may be formed of the same or similar material (e.g., a silicon oxide layer or a silicon nitride layer) as the first insulating spacers 133a. The second insulating spacers 133b may be formed to cover the first insulating spacers 133a as well as portions of the inner sidewalls of the bit line contact holes 131 exposed by the first insulating spacers 133a. According to some embodiments, the first and second insulating spacers 133a and 133b may constitute the insulating spacer 133 having a dual layered structure.

Referring to FIGS. 18A, 18B, 18C, and 18D, the bit line contacts 135 may be formed in the bit line contact holes 131 to be electrically connected to the first junction regions 11, respectively, and the bit lines 145 may be formed to connect the bit line contacts 135 electrically to each other and be covered with the second interlayer insulating layer 151. Next, the third interlayer insulating layer 157 may be formed to separate the bit lines 145 electrically from each other.

Referring to FIGS. 19A, 19B, 19C, and 19D, the storage node contacts 165 may be formed to be electrically connected to the contact pads 125, respectively, through the third and first interlayer insulating layers 157 and 109. Each of the contact pads 125 may be formed to have an increased contact area with the second junction region 12, compared with that of the storage node contact 165. Because the storage node contact 165 may be electrically connected to the second junction region 12 via the contact pad 125, the increased contact area may enable to reduce a contact resistance between the storage node contact 165 and the second junction region 12. In addition, due to the presence of the insulating spacers 133, it may be possible to improve electrical isolation characteristics between the bit line contact 135 and the contact pad 125 in the horizontal direction and between the first junction region 11 and the contact pad 125 in the vertical direction.

Figure 19A:
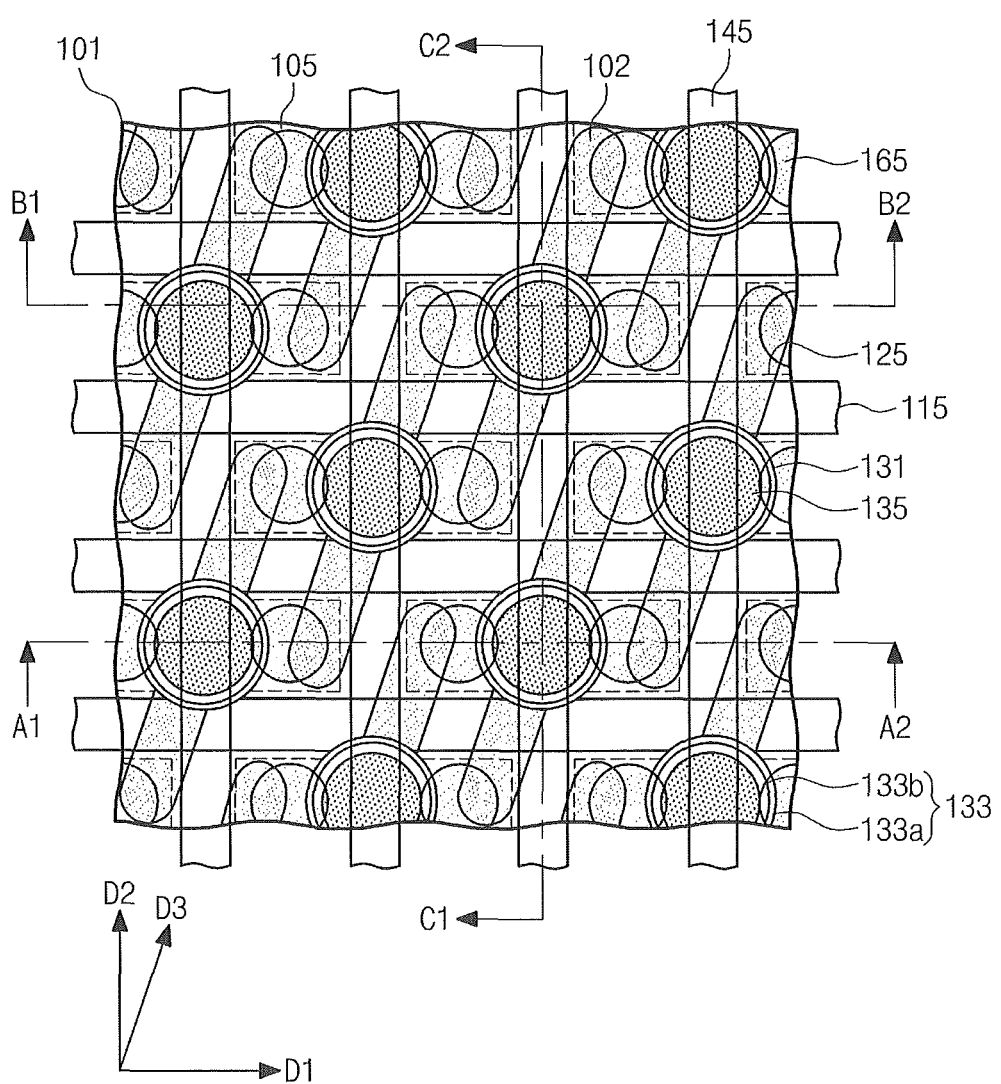
Figure 19B:
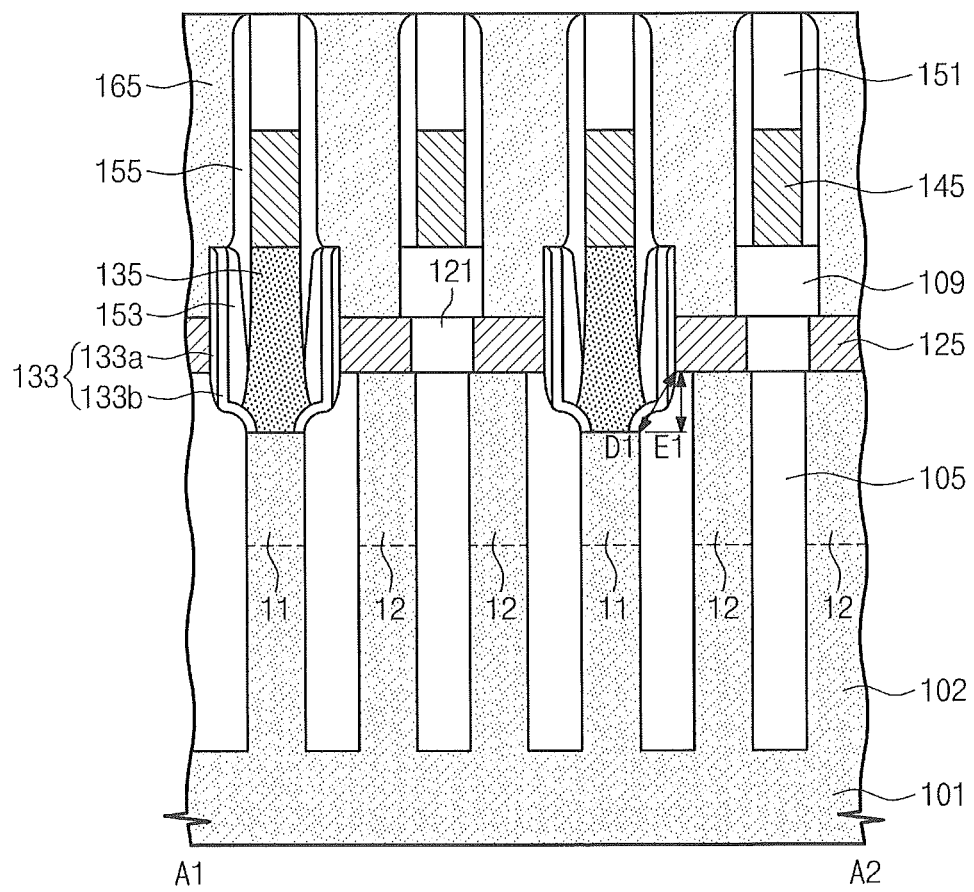

According to some embodiments, because the first junction regions 11 are recessed, a vertical distance E1 between the first junction region 11 and the contact pad 125 may be increased, when viewed in the section taken along the line A1-A2, as shown in FIG. 19B. The increase of the vertical distance E1 may increase the shortest/rectilinear distance D1 between the first junction region 11 and the contact pad 125, and thus it may be possible to realize improved electrical isolation characteristics between the first junction region 11 and the contact pad 125. Similarly, when viewed in the section taken along the line B1-B2 of FIG. 19C, the recess of the first junction region 11 may increase a vertical distance E2 between the first junction region 11 and the contact pad 125, and this increase of the vertical distance E2 may enable an increase in the shortest/rectilinear distance D2 between the first junction region 11 and the contact pad 125. Likewise, the increase of the vertical distances E1 and E2 and the shortest/rectilinear distances D1 and D2 may enable highly-reliable electrical isolation characteristics between the first junction region 11 and the contact pad 125.

Figure 19C:
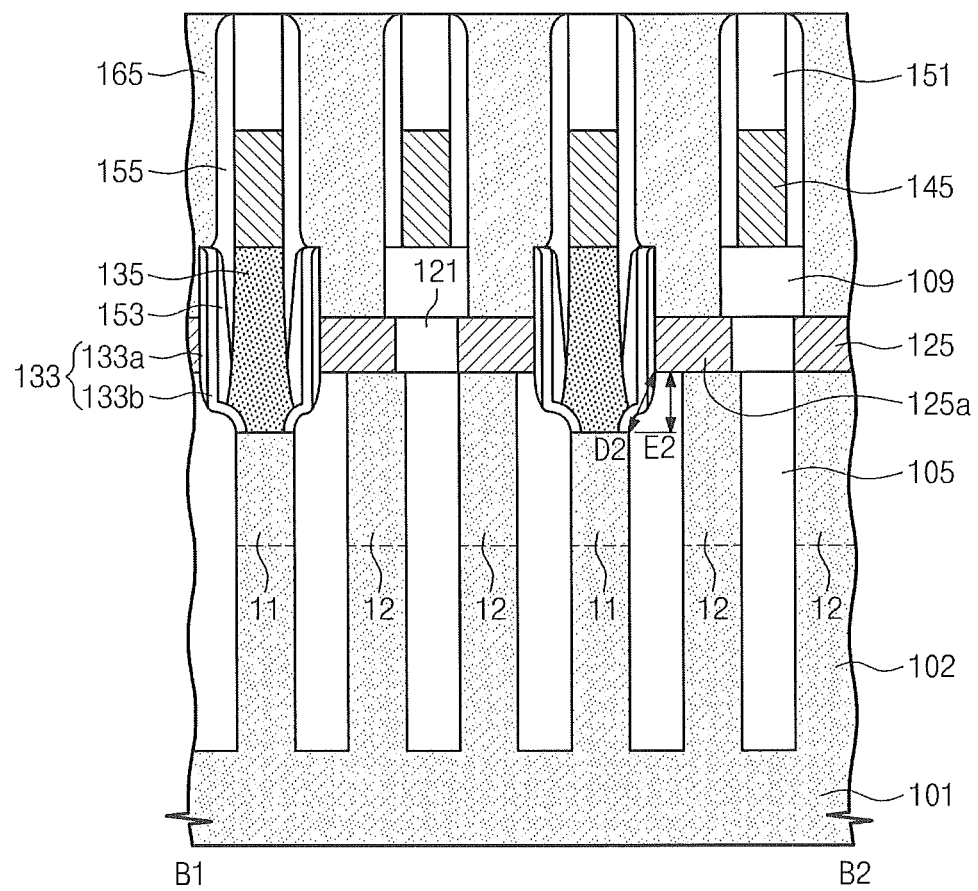
Figure 19D:
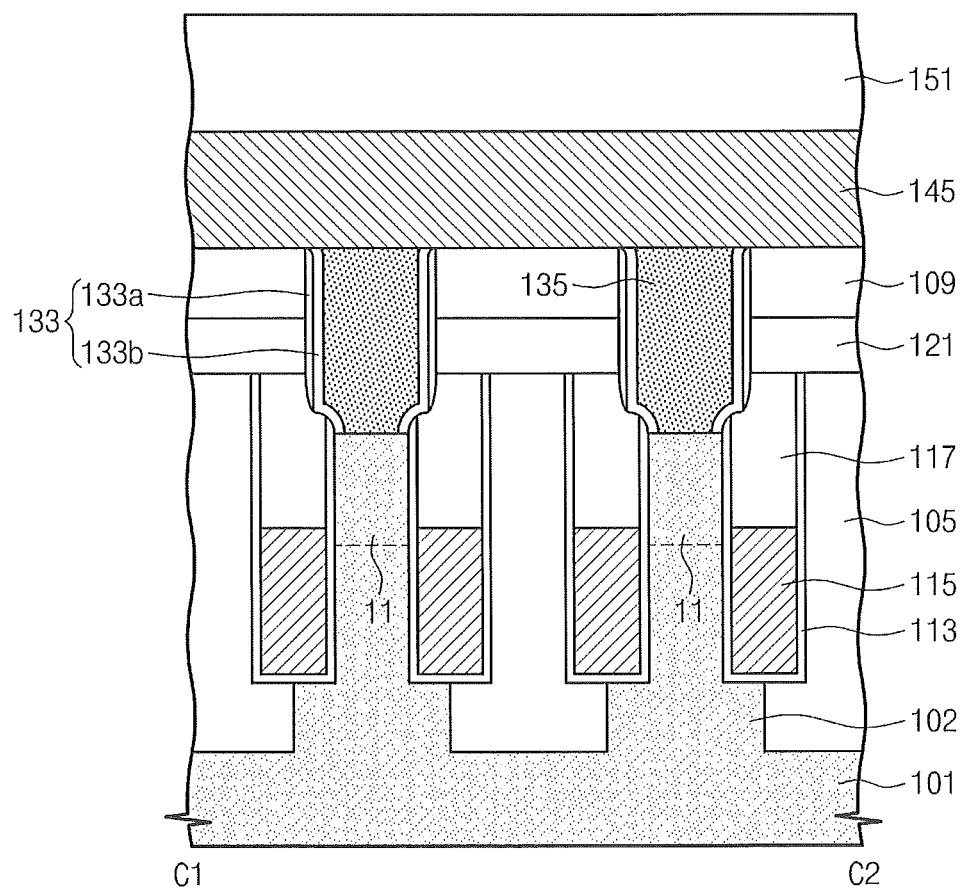

Further, as described previously with reference to FIG. 15C, when viewed in the section taken along the line B1-B2 of FIG. 19C, the central axis 131$x$ of the bit line contact hole 131 may not be coincident with the central axis 102$x$ of the active region 102, and thus the first junction region 11 may be formed relatively close to one (e.g., a right-hand contact pad 125$a$) of the contact pads 125 adjacent thereto. That is, a shortest/rectilinear distance D2 between the first junction region 11 and the right-hand contact pad 125$a$ may be reduced. In addition, as the device is scaled down, the shortest/rectilinear distance D2 may be further decreased. However, according to some embodiments described herein, because the first junction region 11 is recessed, the vertical distance E2 between the first junction region 11 and the contact pad 125 can be increased, and this may enable an increase in the shortest/rectilinear distance D2. Accordingly, it may be possible to reduce/prevent/minimize a risk of electrical short circuits between the first junction region 11 and the contact pad 125.

Referring to FIGS. 20A, 20B, 20C, and 20D, the capacitors 180 may be formed to include the capacitor lower electrodes 181, the capacitor dielectric 183, and the capacitor upper electrode 185. The capacitor lower electrodes 181 may be formed to be electrically connected to the storage node contacts 165, respectively. Thereafter, the fourth interlayer insulating layer 191 may be formed to cover the capacitors 180. As a result, a semiconductor device 2 may be fabricated. Optionally, landing pads 175 may be further formed to connect the capacitor lower electrodes 181 electrically to the storage node contacts 165, respectively, and the landing pad insulating layer 171 may be further formed to electrically separate the landing pads 175 from each other.

Figure 21A:
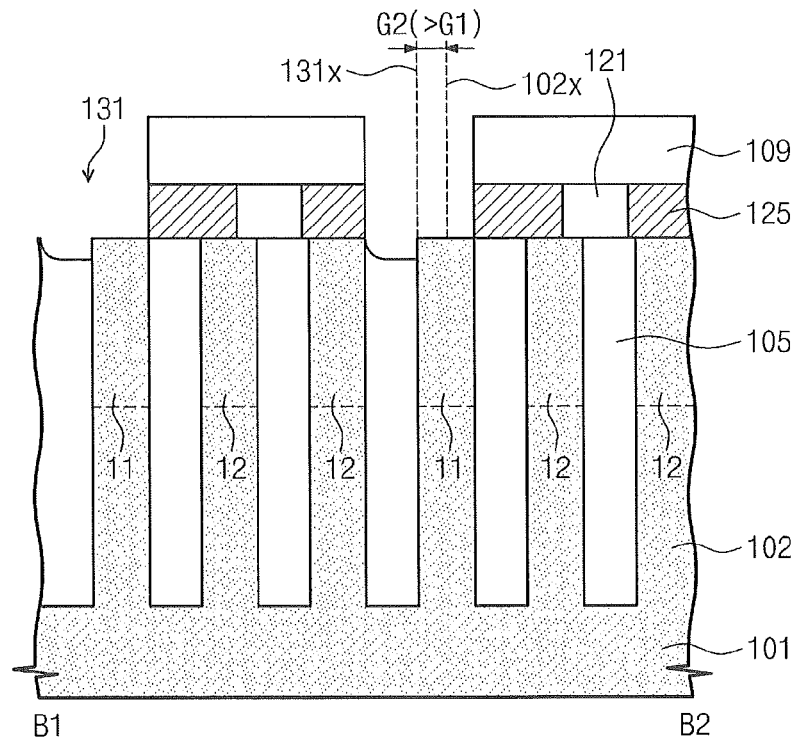
FIGS. 21A, 21B, and 21C are sectional views illustrating a method of fabricating a semiconductor device according to some embodiments.
Figure 21B:
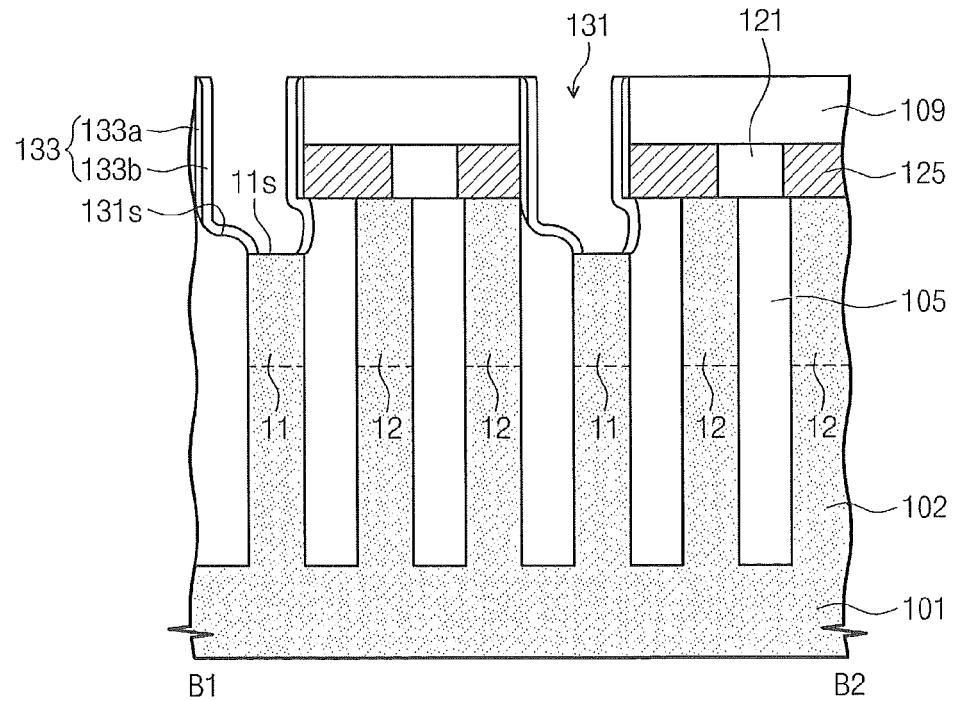
Figure 21C:
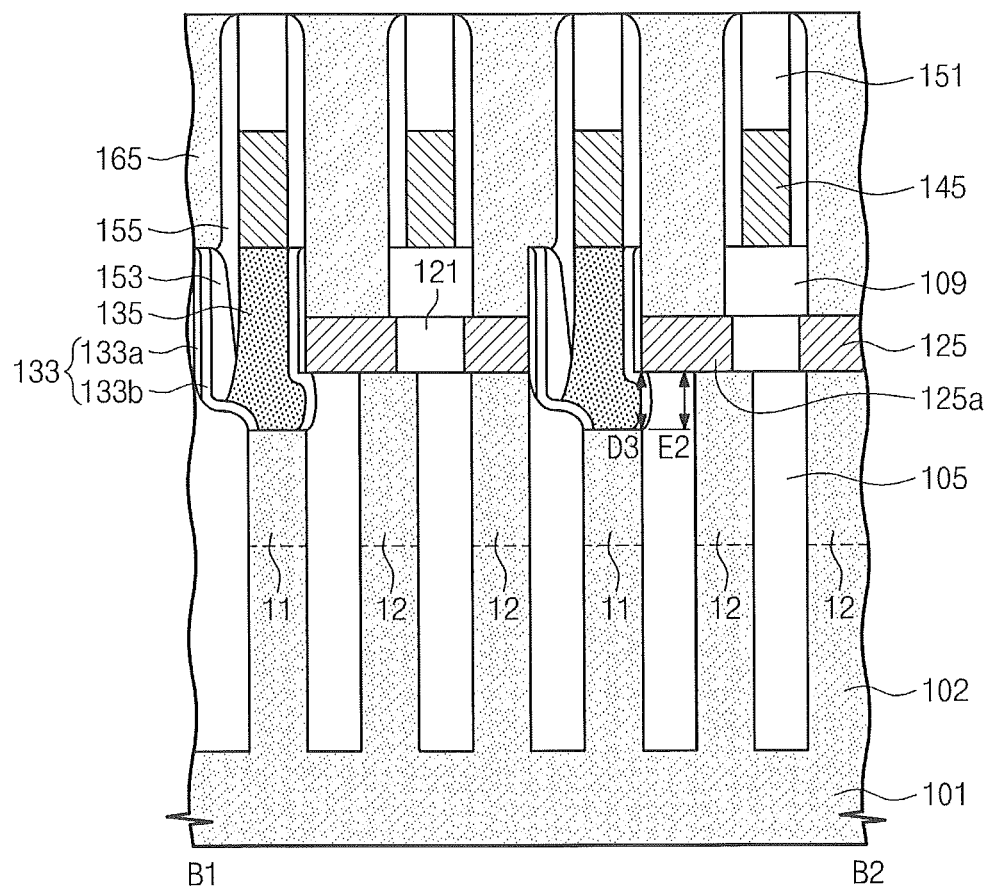

FIGS. 21A, 21B, and 21C are sectional views illustrating a method of fabricating a semiconductor device according to some embodiments. For concise description, previously described elements may be identified by similar or identical reference numbers without repeating overlapping descriptions thereof.

Referring to FIG. 21A, the device isolation layer 105 may be formed on the substrate 101 to define the active regions 102, the word lines 115 may be formed to be buried in the substrate 101, and the contact pads 125 may be formed. Thereafter, the first interlayer insulating layer 109 may be formed on the substrate 101, and then be patterned to form the bit line contact holes 131. At least one of the bit line contact holes 131 may be misaligned with the corresponding one of the active regions 102. For example, when viewed in the vertical section through the line B1-B2 of FIG. 15A, the first junction region 11 may be wholly exposed by the bit line contact hole 131, but the central axis 131$x$ of the bit line contact hole 131 may be misaligned with the central axis 102$x$ of the active region 102 by the second distance G2 that is greater than the first distance G1.

Referring to FIG. 21B, the first insulating spacers 133$a$ may be formed to cover the inner sidewalls of the bit line contact holes 131, and the active regions 102 exposed by the bit line contact holes 131 may be selectively etched to expand the bit line contact holes 131. As a result of the selective etching of the active regions 102, the first junction regions 11 may be recessed to have the top surfaces 11$s$ that is lower than the bottom surfaces 131$s$ of the bit line contact holes 131. In addition, the second insulating spacers 133$b$ may be formed in such a way that each of them covers the first insulating spacer 133$a$ and the inner sidewall of the bit line contact hole 131 exposed by the first insulating spacer 133$a$, thereby forming the insulating spacer 133 with a dual layered structure.

Referring to FIG. 21C, the bit line contacts 135 may be formed to be electrically connected to the first junction regions 11, respectively, and the storage node contacts 165 may be formed to be electrically connected to the contact pads 125, respectively. In addition, the bit lines 145 may be formed to electrically connect the bit line contacts 135 to each other. Each of the contact pads 125 may be formed to have an increased contact area with the second junction region 12, compared with that of the storage node contact 165, and thus this may enable a reduced contact resistance between the storage node contact 165 and the second junction region 12. In addition, due to the presence of the insulating spacers 133, it may be possible to improve electrical isolation characteristics between the first junction region 11 and the contact pad 125 in the vertical direction and between the bit line contact 135 and the contact pad 125 in the horizontal direction.

Figure 20A:
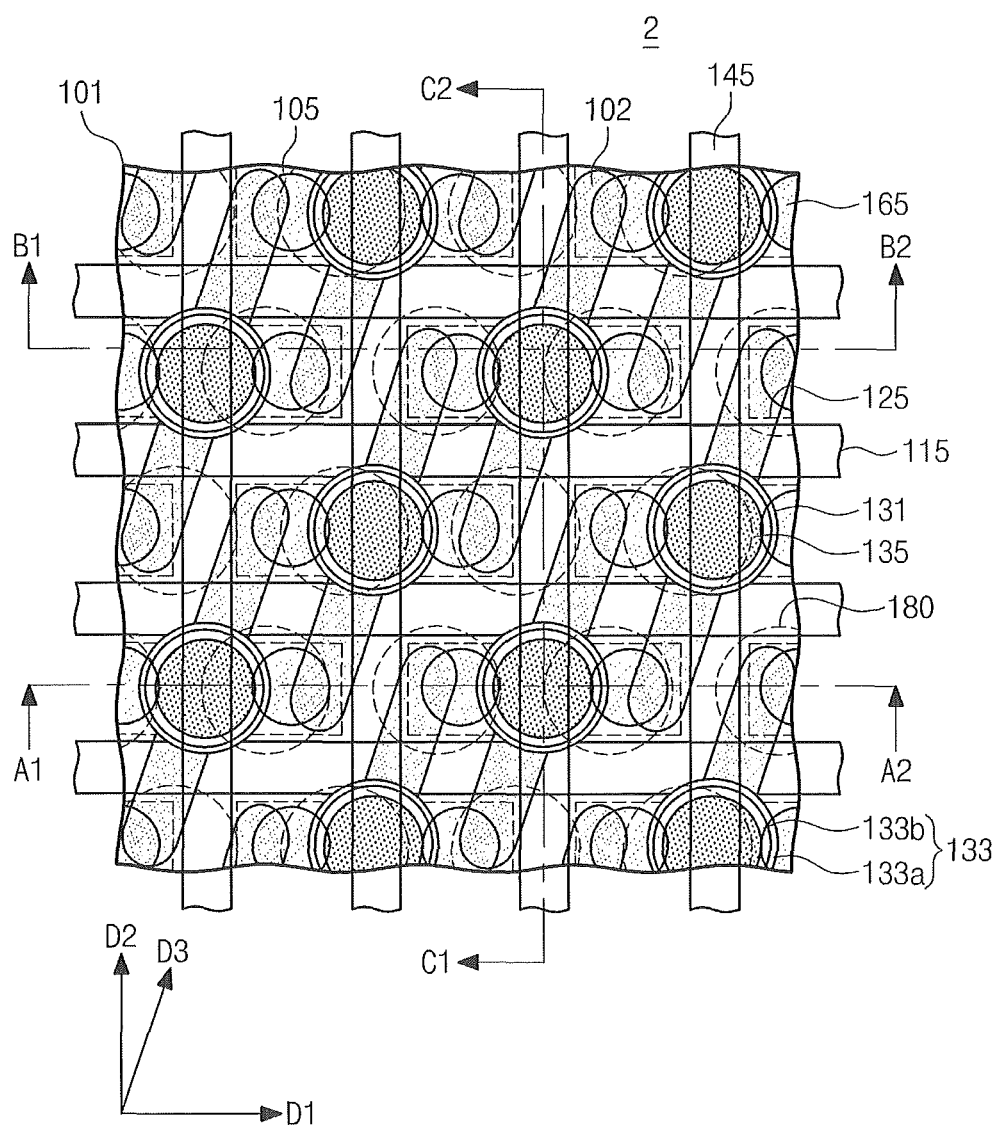
Figure 20B:
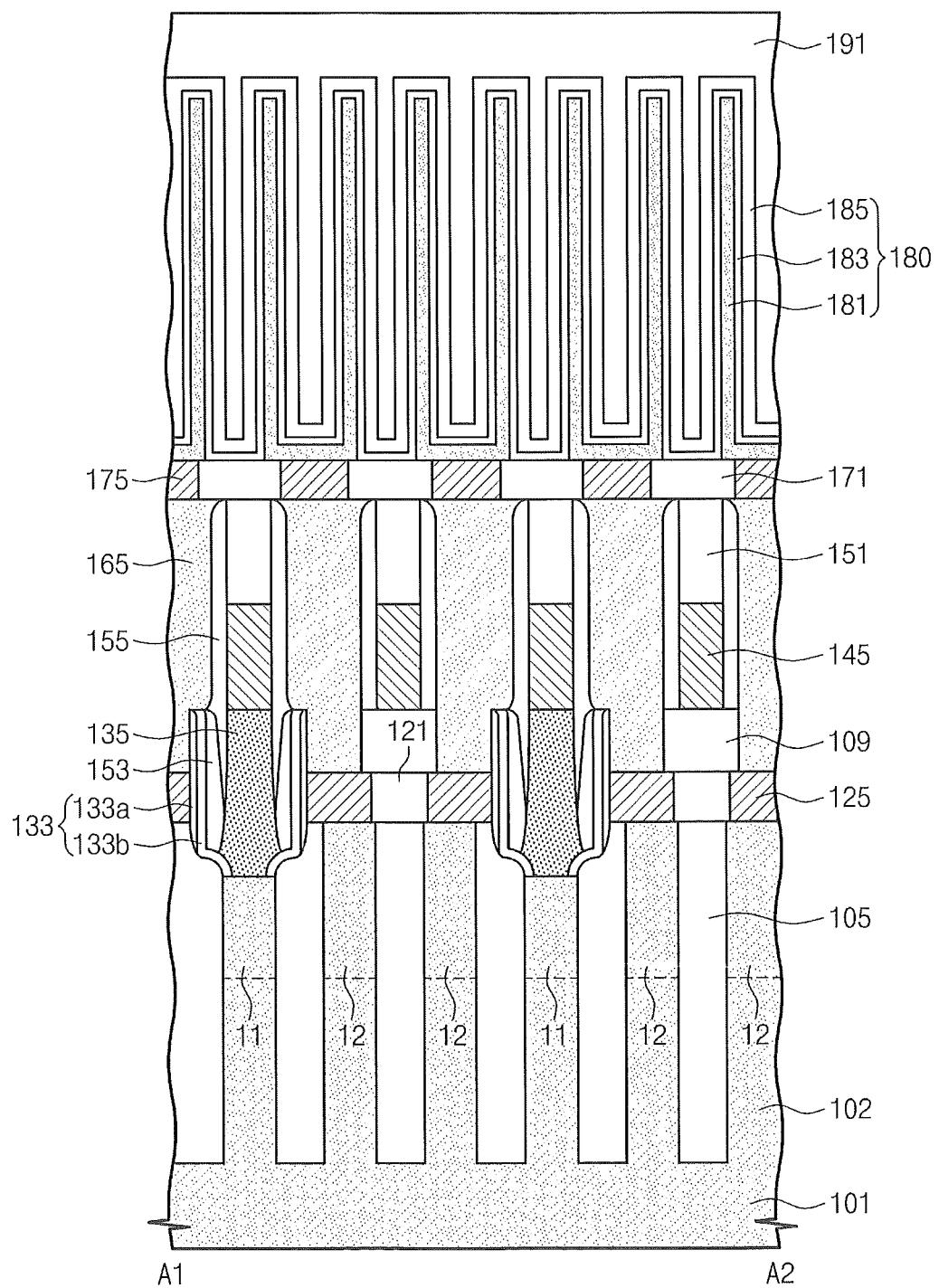
Figure 20C:
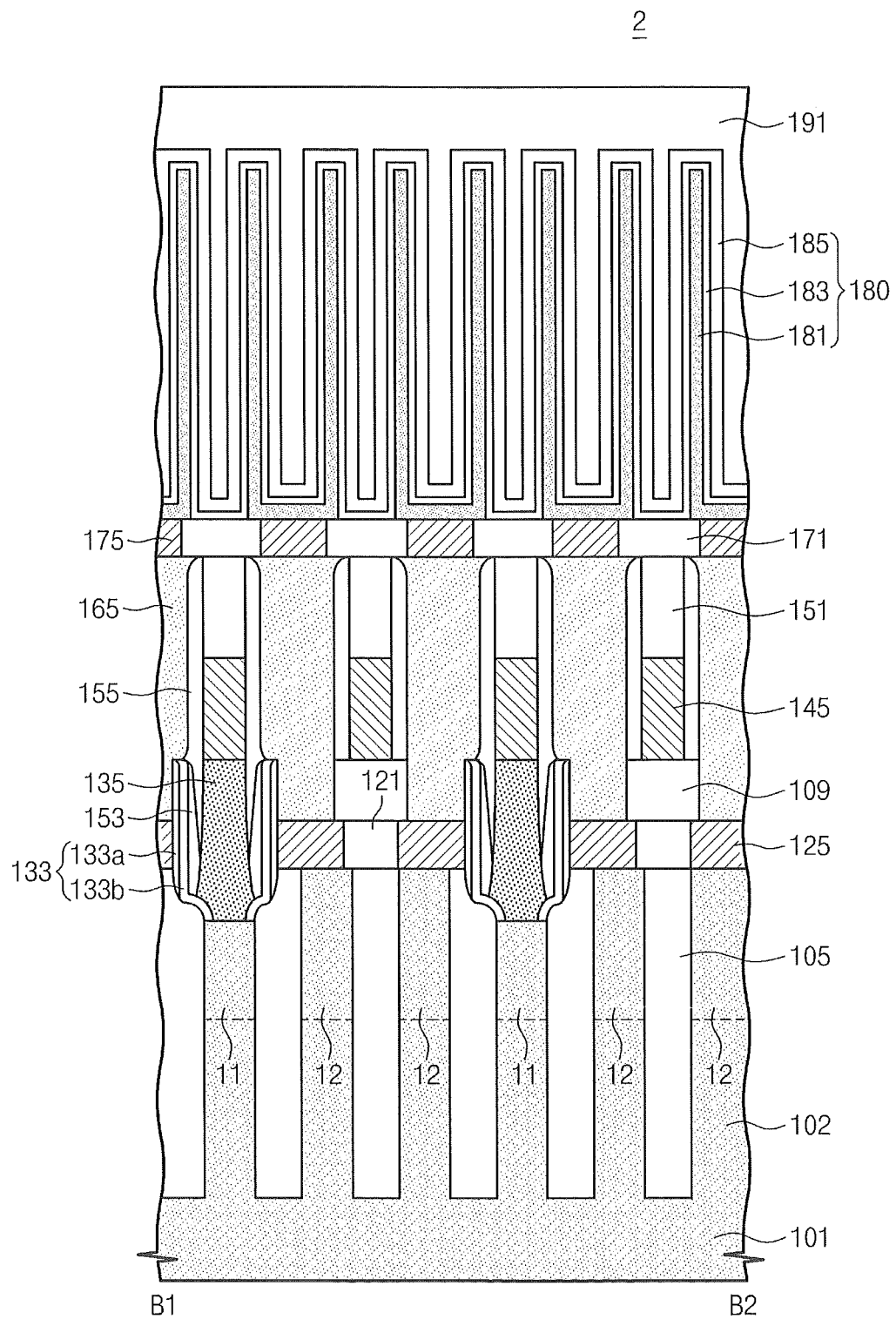
Figure 20D:
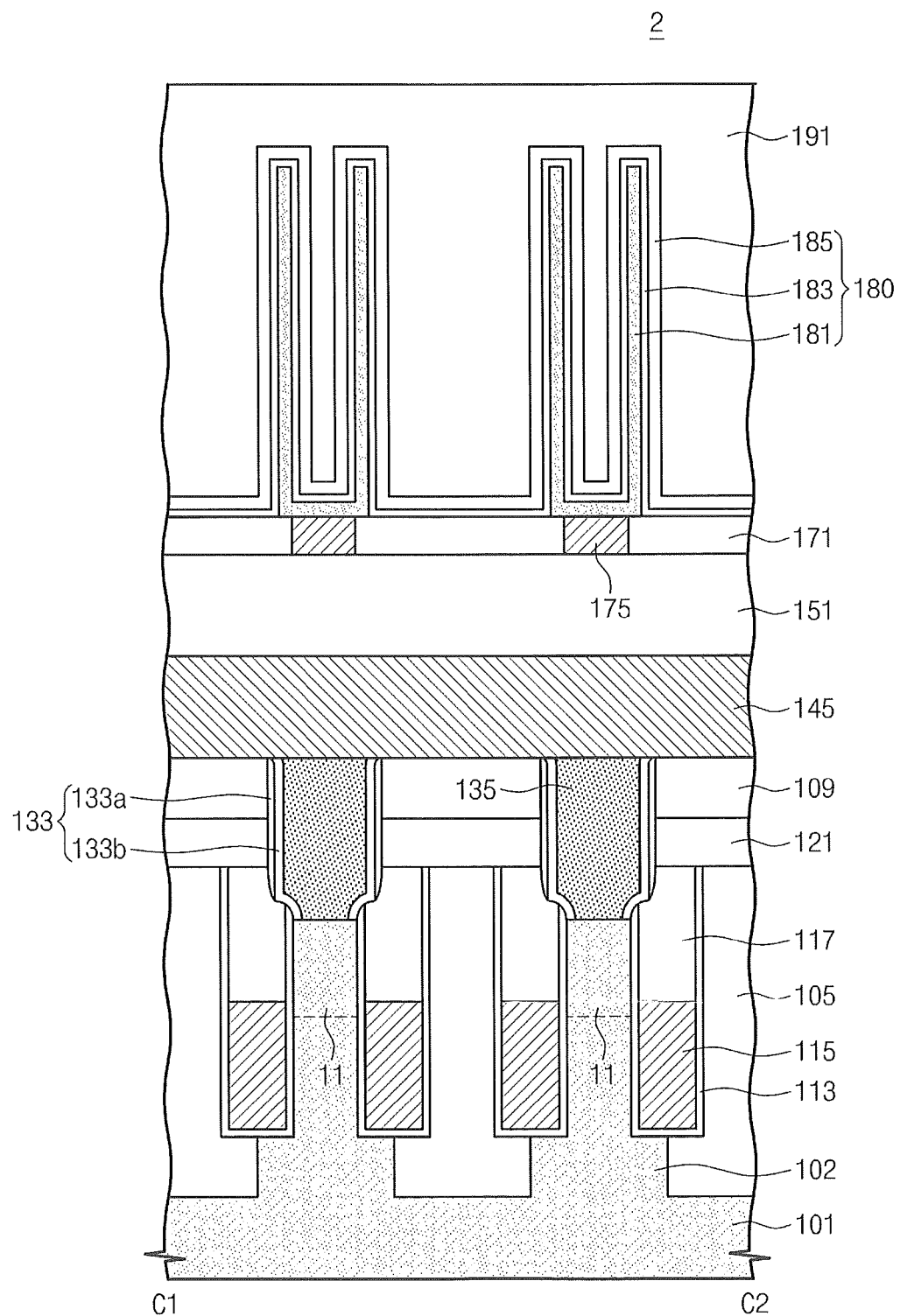

As described previously with reference to FIG. 21A, when viewed in the vertical section taken along the line B1-B2, the central axis 131$x$ of the bit line contact hole 131 may not be coincident with the central axis 102$x$ of the active region 102. Accordingly, the first junction region 11 may be formed relatively close to one (e.g., the right-hand contact pad 125$a$) of the adjacent contact pads 125. Accordingly, a shortest/rectilinear distance D3 between the first junction region 11 and the right-hand contact pad 125$a$ may be smaller than the shortest/rectilinear distance D2 of FIG. 19C. This means that there may be an increased risk of electrical short circuits between the first junction region 11 and the contact pad 125. By contrast, according to some embodiments described herein, because the first junction region 11 is recessed, the vertical and rectilinear distances E2 and D3 between the first junction region 11 and the contact pad 125 can be increased. Accordingly, it may be possible to realize improved electrical isolation characteristics between the first junction region 11 and the contact pad 125. As shown in FIG. 20C, the formation of the semiconductor device 2 may further include forming the capacitors 180 electrically connected to the storage node contacts 165.

Figure 22A:
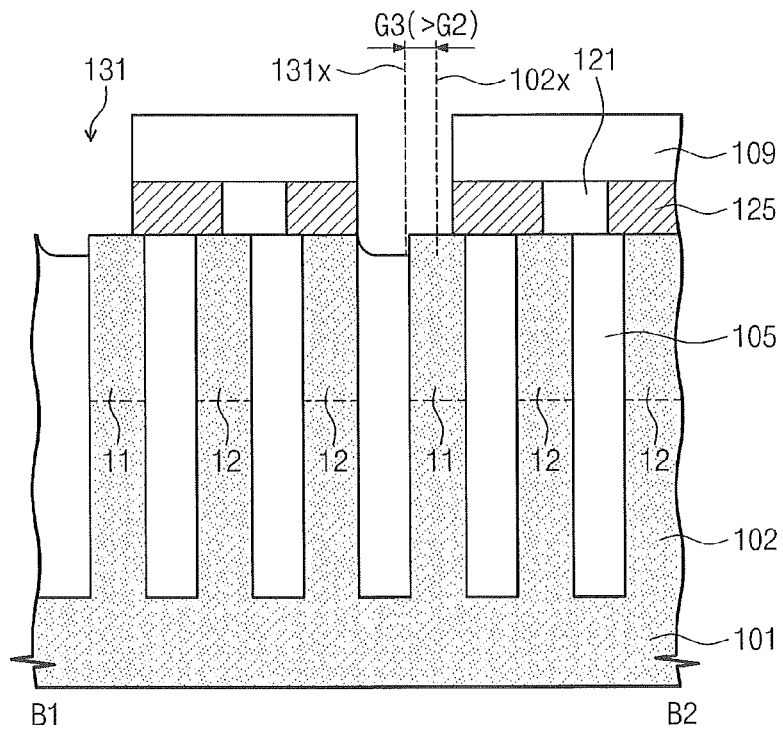
FIGS. 22A, 22B, and 22C are sectional views illustrating a method of fabricating a semiconductor device according to some embodiments.
Figure 22B:
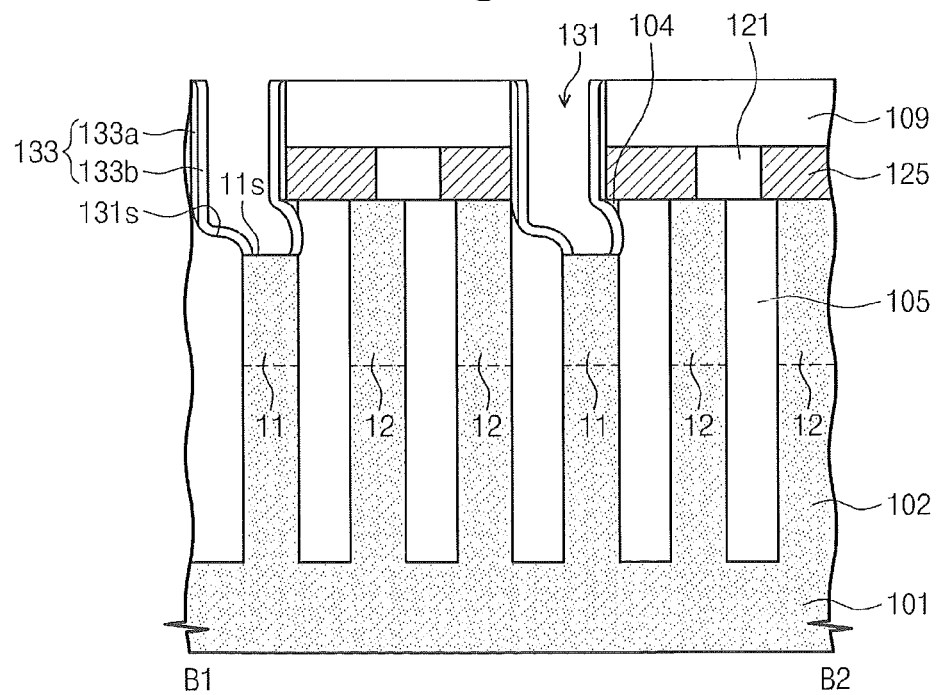
Figure 22C:
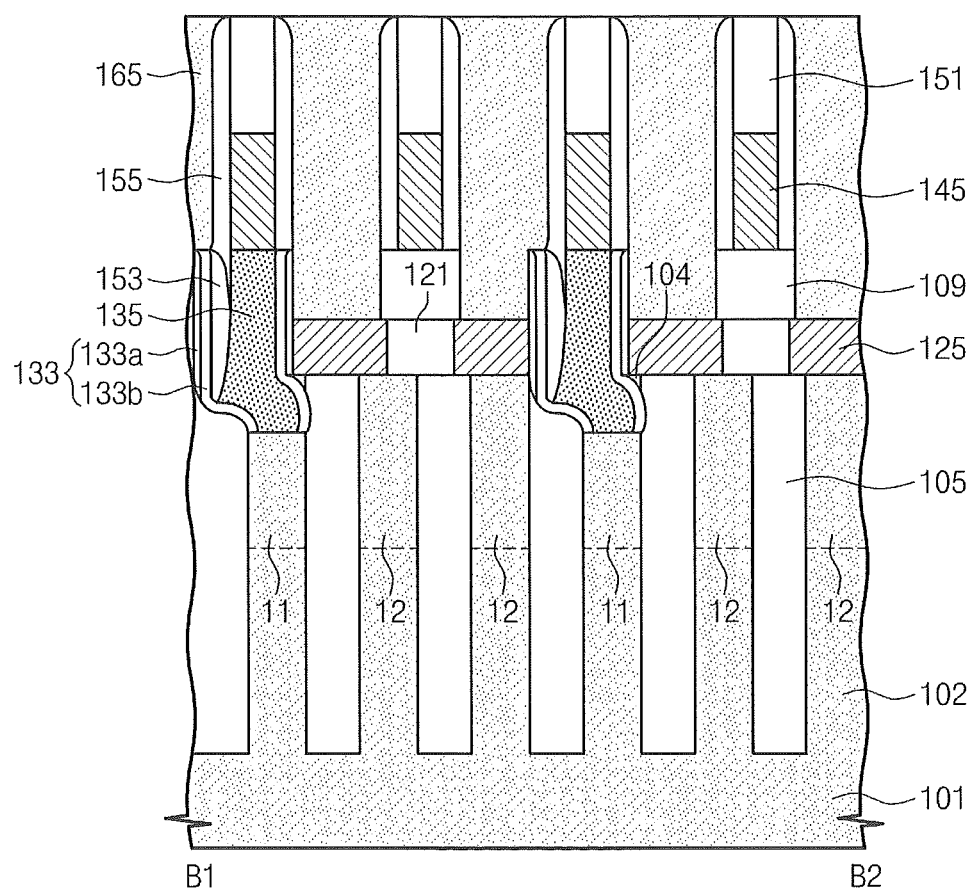

FIGS. 22A, 22B, and 22C are sectional views illustrating a method of fabricating a semiconductor device according to some embodiments. For concise description, previously described elements may be identified by similar or identical reference numbers without repeating overlapping descriptions thereof.

Referring to FIG. 22A, when viewed in the vertical section through the line B1-B2 of FIG. 15A, the bit line contact hole 131 may be misaligned to expose a portion of the first junction region 11 of the active region 102. For example, the central axis 131x of the bit line contact hole 131 may be misaligned with the central axis 102x of the active region 102 by a third distance G3 that is greater than the second distance G2. Accordingly, a portion of the first junction region 11 may be exposed by the bit line contact hole 131, and other portions thereof may be covered with the first interlayer insulating layer 109.

Referring to FIG. 22B, the first insulating spacers 133a may be formed to cover the inner sidewalls of the bit line contact holes 131, and thus the active regions 102 exposed by the bit line contact holes 131 may be selectively etched. As a result of the etching of the active regions 102, the top surface 11s of the first junction region 11 may be recessed below the bottom surface 131s of the bit line contact hole 131, and thus the bit line contact holes 131 may be expanded. Thereafter, the second insulating spacers 133b may be formed in such a way that each of them covers the first insulating spacer 133a and the inner sidewall of the bit line contact hole 131 exposed by the first insulating spacer 133a, thereby forming the insulating spacer 133 with a dual layered structure. In some example embodiments, the residue 104 of the active region 102 may remain below the first interlayer insulating layer 109. The residue 104 may be covered with the insulating spacer 133. In some embodiments, the residue 104 may not remain.

Referring to FIG. 22C, the bit line contacts 135 may be formed to be electrically connected to the first junction regions 11, respectively, and the storage node contacts 165 may be formed to be electrically connected to the contact pads 125, respectively. In addition, the bit lines 145 may be formed to electrically connect the bit line contacts 135 to each other. Because the residue 104 is covered with the insulating spacer 133, there may be little/no chance that electrical short circuits may occur between the first junction region 11 and the contact pad 125 and/or between the bit line contact 135 and the contact pad 125. As shown in FIG. 20C, the formation of the semiconductor device 2 may further include forming the capacitors 180 electrically connected to the storage node contacts 165.

Figure 23A:
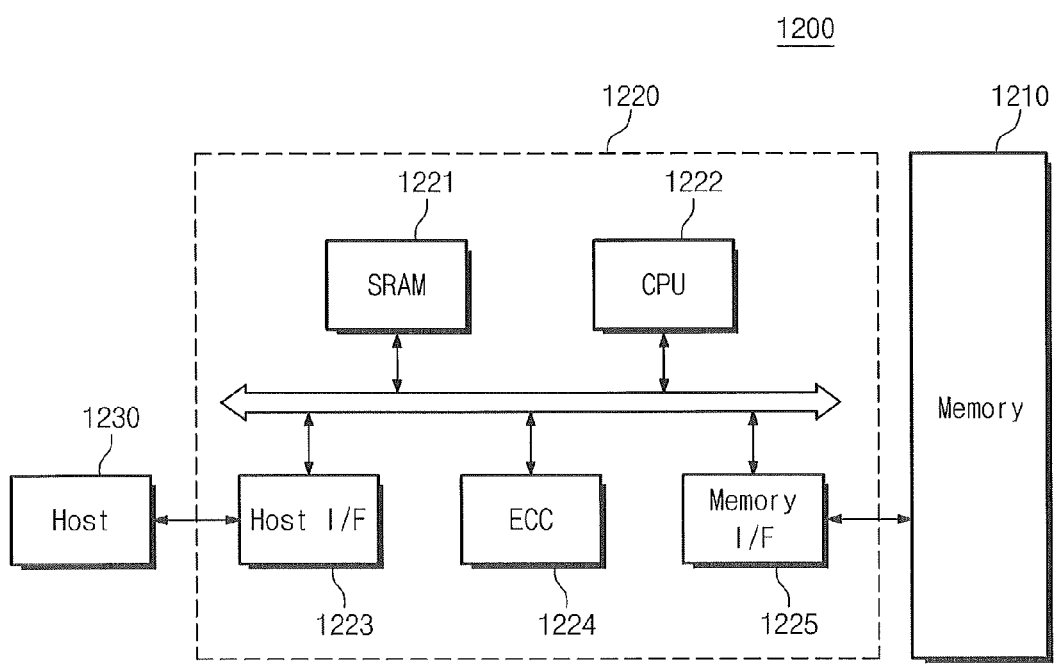
FIG. 23A is a block diagram of a memory card including a semiconductor device according to some example embodiments.
Figure 23B:
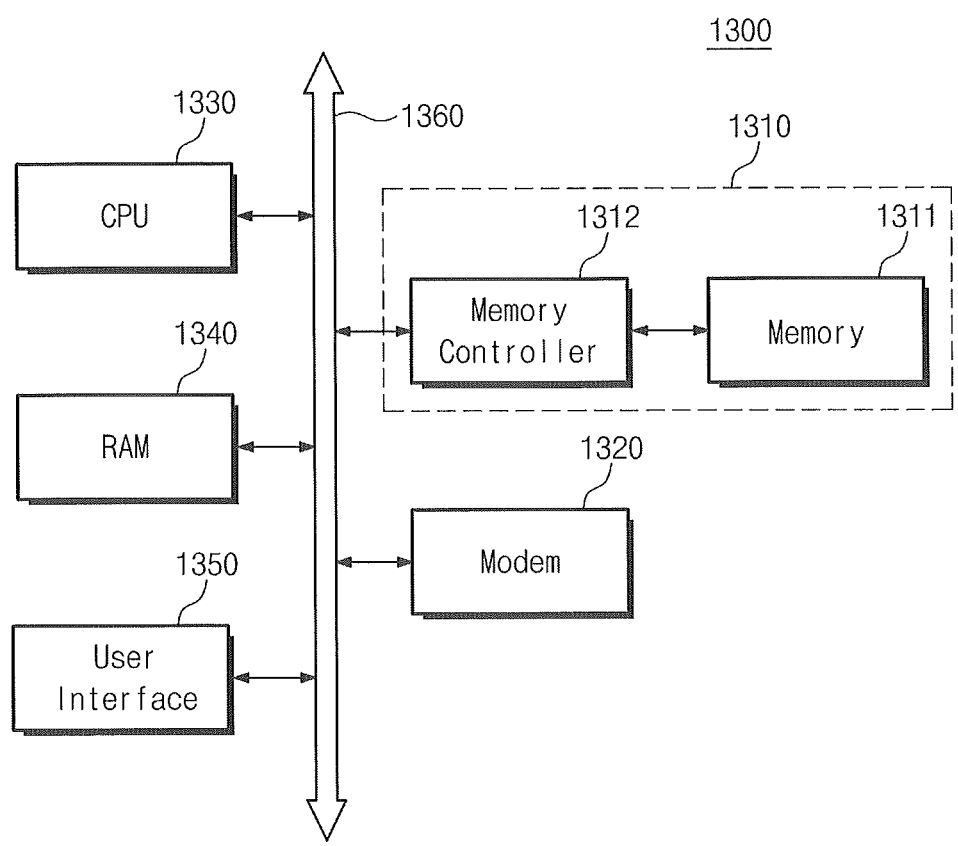
FIG. 23B is a block diagram of an information processing system including a semiconductor device according to some example embodiments.

FIG. 23A is a block diagram of a memory card including a semiconductor device according to some example embodiments. FIG. 23B is a block diagram of an information processing system including a semiconductor device according to some example embodiments.

Referring to FIG. 23A, a memory card 1200 may include a memory controller 1220 controlling general data exchanges between a host and a memory device 1210. A static random access memory (SRAM) 1221 may be used as an operating memory of a processing unit (e.g., a central processing unit (CPU)) 1222. A host interface (I/F) 1223 may include a data exchange protocol of a host connected to the memory card 1200. An error correction (ECC) block 1224 may be configured to detect and correct errors included in data read from a memory device 1210. A memory interface (I/F) 1225 may be configured to interface with the memory device 1210. A processing unit 1222 may perform general control operations for data exchange of the memory controller 1220. The memory device 1210 may include at least one of the semiconductor devices 1 according to some example embodiments described herein.

Referring to FIG. 23B, information processing system 1300 may be realized using a memory system 1310 including at least one of the semiconductor devices 1 according to some example embodiments described herein. For instance, the information processing system 1300 may be a mobile device and/or a computer. In some embodiments, the information processing system 1300 may further include a modem 1320, a central processing unit (CPU) 1330, a random access memory (RAM) 1340, and a user interface 1350, which are electrically connected to a system bus 1360, in addition to the memory system 1310. The memory system 1310 may include a memory device 1311 and a memory controller 1312, and in some embodiments, the memory system 1310 may be configured substantially identically to the memory card 1200 described with respect to FIG. 23A. Data processed by the CPU 1330 and/or input from an external source may be stored in the memory system 1310. In some embodiments, the memory system 1310 may be used as a portion of a solid state drive (SSD), which may enable the information processing system 1300 to stably and reliably store a large amount of data in the memory system 1310. Moreover, it may be apparent to those skilled in the art that, for example, an application chipset, a camera image sensor, a camera image signal processor (ISP), an input/output device, or the like may further be included in the information processing system 1300 according to some embodiments.

According to some example embodiments described herein, an active region may be recessed, which may reduce/prevent the occurrence of electrical short circuits between the active region and a pad or between the active region and a node (e.g., a storage node contact). Accordingly, it may be possible to realize a semiconductor device having excellent electrical characteristics. Even when the device is shrunk or misaligned or there is a process variation, it may be possible to realize a semiconductor device capable of reducing/preventing electrical short circuits and having an excellent electrical insulating property.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device, comprising:
    a substrate comprising first and second regions of an active region;
    a device isolation layer between the first and second regions of the active region;
    a word line in the substrate;
    a bit line over the word line;
    a first electrical contact between the substrate and the bit line, the first electrical contact configured to be electrically connected to the first region of the active region;
    a second electrical contact adjacent a side surface of the bit line, the second electrical contact configured to be electrically connected to the second region of the active region; and
    an insulating spacer on both the first electrical contact and the second electrical contact,
    wherein a first portion of the insulating spacer underlaps a portion of the first electrical contact that is between adjacent portions of the device isolation layer,
    wherein a second portion of the insulating spacer that is on a side surface of the second electrical contact underlaps a portion of the second electrical contact,
    wherein the device isolation layer and the first region of the active region comprise respective recessed portions defining a contact hole comprising the first electrical contact therein, and wherein the first region of the active region comprises a topmost surface that is lower than a bottommost recessed portion of the device isolation layer defining the contact hole.

2. The device of claim 1, wherein the second region of the active region comprises a topmost surface that is higher than the bottommost recessed portion of the device isolation layer defining the contact hole.

3. The device of claim 1, wherein the insulating spacer is on an inner side surface of the contact hole.

4. The device of claim 3, further comprising a capacitor configured to be electrically connected to the second region of the active region by the second electrical contact.

5. The device of claim 4, wherein:
the first electrical contact comprises a bit line contact that contacts the bit line and the first region of the active region; and
the second electrical contact comprises a storage node contact that contacts the capacitor and the second region of the active region.

6. The device of claim 5, wherein the insulating spacer separates the bit line contact from the storage node contact such that the bit line contact is electrically isolated from the storage node contact.

7. The device of claim 4, wherein:
the device further comprises a contact pad between the second electrical contact and the second region of the active region;
the first electrical contact comprises a bit line contact that contacts the bit line and the first region of the active region;
the second electrical contact comprises a storage node contact that contacts the capacitor and the contact pad; and
the contact pad contacts the second region of the active region.

8. The device of claim 7, wherein the insulating spacer separates the bit line contact from the contact pad such that the bit line contact is electrically isolated from the contact pad.

9. The device of claim 1, wherein a bottommost surface of the first electrical contact extends lower than a bottommost surface of the second electrical contact.

10. The device of claim 1,
wherein the first portion of the insulating spacer that underlaps the portion of the first electrical contact comprises a curved portion of the insulating spacer,
wherein the second portion of the insulating spacer that underlaps the portion of the second electrical contact comprises a topmost surface of the insulating spacer,
wherein the first electrical contact comprises first and second widths thereof between the adjacent portions of the device isolation layer,
wherein the first width of the first electrical contact is narrower than the topmost surface of the first region of the active region, and
wherein the second width of the first electrical contact is wider than the topmost surface of the first region of the active region.

11. The device of claim 10,
wherein the first width of the first electrical contact is adjacent the topmost surface of the first region of the active region, and
wherein the second width of the first electrical contact is at a level between the first width and a topmost surface of the second region of the active region.

12. A semiconductor device comprising:
a substrate comprising an active region comprising first and second regions;
a device isolation layer between the first and second regions of the active region;
a contact hole defined by recessed portions of the device isolation layer and the first region of the active region, respectively, wherein a topmost surface of the first region of the active region defines a bottommost portion of the contact hole;
a bit line contact in the contact hole;
a bit line on the bit line contact, wherein the bit line contact comprises a first electrical contact;
a second electrical contact on the second region of the active region; and
an insulating spacer on both the first electrical contact and the second electrical contact,
wherein a first portion of the insulating spacer underlaps a portion of the first electrical contact that is between adjacent portions of the device isolation layer, and
wherein a second portion of the insulating spacer that is on a side surface of the second electrical contact underlaps a portion of the second electrical contact.

13. The device of claim 12, wherein the topmost surface of the first region of the active region is lower than a topmost surface of the second region of the active region, and is lower than a bottommost surface of the recessed portion of the device isolation layer defining the contact hole.

14. The device of claim 12, wherein the insulating spacer is on the recessed portions of the device isolation layer and the first region of the active region.

15. The device of claim 14, wherein the insulating spacer is between the second electrical contact and the first electrical contact.

16. The device of claim 15, further comprising a contact pad between the second electrical contact and the second region of the active region, wherein the insulating spacer is between the contact pad and the first electrical contact.

17. The device of claim 12,
wherein the first portion of the insulating spacer that underlaps the portion of the first electrical contact comprises a curved portion of the insulating spacer,
wherein the second portion of the insulating spacer that underlaps the portion of the second electrical contact comprises a topmost surface of the insulating spacer,
wherein the first electrical contact comprises first and second widths thereof between the adjacent portions of the device isolation layer,
wherein the first width of the first electrical contact is narrower than the topmost surface of the first region of the active region, and
wherein the second width of the first electrical contact is wider than the topmost surface of the first region of the active region.

18. The device of claim 17,
wherein the first width of the first electrical contact is adjacent the topmost surface of the first region of the active region, and
wherein the second width of the first electrical contact is at a level between the first width and a topmost surface of the second region of the active region.

19. The device of claim 17,
wherein the portion of the first electrical contact that the curved portion of the insulating spacer underlaps comprises a curved portion of the first electrical contact,
wherein the curved portion of the insulating spacer is on a curved portion of the device isolation layer, and wherein the second electrical contact protrudes laterally beyond an interface of the side surface of the second electrical contact with the second portion of the insulating spacer to extend over the topmost surface of the insulating spacer.

20. A semiconductor device comprising:
a substrate comprising an active region comprising first and second regions;
a device isolation layer between the first and second regions of the active region;
a contact hole defined by recessed portions of the device isolation layer and the first region of the active region, respectively, wherein a topmost surface of the first region of the active region defines a bottommost portion of the contact hole;
a bit line contact, comprising a first electrical contact, in the contact hole;
a bit line on the bit line contact;
a second electrical contact on the second region of the active region; and
an insulating spacer on both the first electrical contact and the second electrical contact,
wherein a curved portion of the insulating spacer is on a curved portion of the first electrical contact.

* * * * *